United States Patent
Naka

(10) Patent No.: US 10,257,936 B2
(45) Date of Patent: Apr. 9, 2019

(54) CHIP RESISTOR, METHOD OF PRODUCING CHIP RESISITOR AND CHIP RESISTOR PACKAGING STRUCTURE

(71) Applicant: ROHM CO., LTD., Kyoto-shi, Kyoto (JP)

(72) Inventor: Kentaro Naka, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 15/276,490

(22) Filed: Sep. 26, 2016

(65) Prior Publication Data

US 2017/0013719 A1 Jan. 12, 2017

Related U.S. Application Data

(62) Division of application No. 14/114,842, filed as application No. PCT/JP2012/061354 on Apr. 27, 2012, now Pat. No. 9,496,077.

(30) Foreign Application Priority Data

May 17, 2011 (JP) ................................. 2011-110236

(51) Int. Cl.
*H01C 1/01* (2006.01)
*H05K 1/18* (2006.01)
(Continued)

(52) U.S. Cl.
CPC .............. *H05K 1/181* (2013.01); *H01C 1/01* (2013.01); *H01C 1/14* (2013.01); *H01C 17/006* (2013.01);
(Continued)

(58) Field of Classification Search
CPC .......... H01C 1/14; H01C 17/006; H01C 1/01; H01C 17/281
(Continued)

(56) References Cited

U.S. PATENT DOCUMENTS 3,761,860 A 9/1973 Ogasawara
5,111,179 A 5/1992 Flassalyer
(Continued)

FOREIGN PATENT DOCUMENTS

JP 2000-114009 4/2000
JP 3321724 9/2002
(Continued)

*Primary Examiner* — Kyung S Lee
(74) *Attorney, Agent, or Firm* — Hamre, Schumann, Mueller & Larson, P.C.

(57) ABSTRACT

[Object] A method for efficiently manufacturing chip resistors is provided.
[Means]
The method includes the steps of preparing at least three conductive elongated boards 711 made of an electrically conductive material and a resistive member 702 made of a resistive material, arranging the at least three conductive elongated boards 711 apart from each other along a width direction crossing a longitudinal direction in which one of the at least three conductive elongated boards 711 is elongated, forming a resistor aggregate 703 by bonding the resistive member 702 to the at least three conductive elongated boards 711, and collectively dividing the resistor aggregate 703 into a plurality of chip resistors by punching so that each of the chip resistors includes two electrodes and a resistor portion bonded to the two electrodes.

20 Claims, 49 Drawing Sheets

(51) Int. Cl.
*H01C 17/00* (2006.01)
*H01C 17/28* (2006.01)
*H01C 1/14* (2006.01)

(52) U.S. Cl.
CPC ........... *H01C 17/28* (2013.01); *H01C 17/281* (2013.01); *H05K 2201/10022* (2013.01); *Y10T 29/49082* (2015.01)

(58) Field of Classification Search
USPC .................................................. 338/314, 330
See application file for complete search history.

(56) References Cited

U.S. PATENT DOCUMENTS

| | | | |
|---|---|---|---|
| 5,604,477 | A | 2/1997 | Rainer et al. |
| 6,166,620 | A | 12/2000 | Inuzuka |
| 6,201,682 | B1 | 3/2001 | Mooji |
| 6,229,098 | B1 | 5/2001 | Dunn |
| 8,310,334 | B2 | 11/2012 | Chen |

FOREIGN PATENT DOCUMENTS

| | | |
|---|---|---|
| JP | 2002-289412 | 10/2002 |
| JP | 2007-049207 | 2/2007 |
| JP | 2008-016870 | 1/2008 |
| JP | 2009-071123 | 4/2009 |

FIG.9
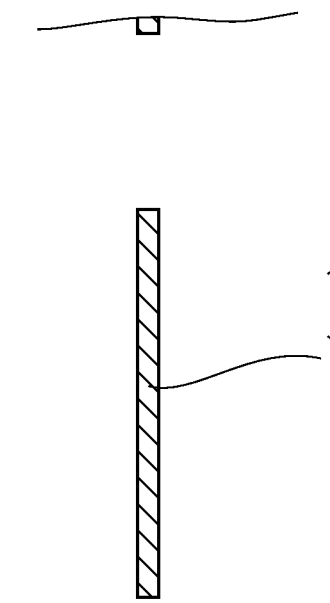
711(701)
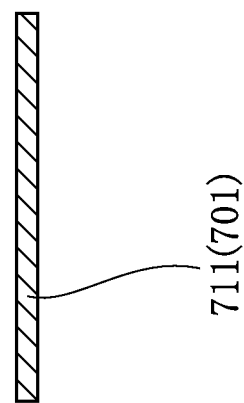
711(701)
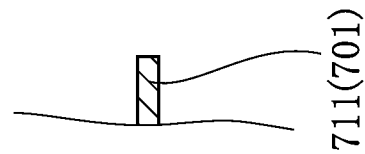
711(701)

CHIP RESISTOR, METHOD OF PRODUCING CHIP RESISITOR AND CHIP RESISTOR PACKAGING STRUCTURE

TECHNICAL FIELD

The present invention relates to a chip resistor, a method for manufacturing a chip resistor, and a mount structure of a chip resistor.

BACKGROUND ART

A conventionally known chip resistor (surface mount resistor) includes two leads and a central resistor portion. The central resistor portion is sandwiched between the two leads and bonded to the leads. This type of chip resistor is manufactured by using a plurality of reels. Specifically, a strip of a resistive material is wound around one of the reels, whereas a strip of an electrically conductive material is wound around each of other two reels. The strips are paid out from the reels while rotating the reels, and bonded together in such a manner that the strip of the resistive material is sandwiched between the two strips of an electrically conductive material. The strips bonded together are cut successively.

TECHNICAL REFERENCE

Patent Document

Patent Document 1: Japanese Patent No. 3321724

SUMMARY OF THE INVENTION

Problems to be Solved by the Invention

The present invention has been conceived under the above-described circumstances. It is therefore an object of the present invention to provide a method for efficiently manufacturing a chip resistor.

Means for Solving the Problems

According to a first aspect of the present invention, there is provided a chip resistor manufacturing method comprising the steps of: preparing at least three conductive elongated boards made of an electrically conductive material and a resistive member made of a resistive material; arranging the at least three conductive elongated boards apart from each other along a width direction crossing a longitudinal direction in which one of the at least three conductive elongated boards is elongated; forming a resistor aggregate by bonding the resistive member to the at least three conductive elongated boards; and collectively dividing the resistor aggregate into a plurality of chip resistors by punching so that each of the chip resistors includes two electrodes and a resistor portion bonded to the two electrodes.

Preferably, the step of forming a resistor aggregate uses welding.

Preferably, the step of forming a resistor aggregate uses high energy beam welding.

Preferably, the step of forming a resistor aggregate uses electron beam welding or laser beam welding as the high energy beam welding.

Preferably, the method further comprises the step of bending one of the at least three conductive elongated boards.

Preferably, the bending step is performed at the same time as the collectively dividing step.

Preferably, one of the at least three conductive elongated boards has a thickness smaller than the thickness of the resistive member.

Preferably, the resistive member includes a plurality of resistive elongated boards, and the step of forming a resistor aggregate comprises bonding each of the resistive elongated boards to two of the at least three conductive elongated boards.

Preferably, the step of forming a resistor aggregate comprises arranging each of the resistive elongated boards between adjacent two of the at least three conductive elongated boards.

Preferably, the step of forming a resistor aggregate comprises arranging each of the resistive elongated boards at a position overlapping adjacent two of the at least three conductive elongated boards as viewed in the thickness direction perpendicular to both of the longitudinal direction and the width direction.

According to a second aspect of the present invention, there is provided a chip resistor comprising: a first electrode; a second electrode spaced apart from the first electrode in a first direction; and a resistor portion bonded to the first electrode and the second electrode. The resistor portion extends along a plane spreading in the first direction and a second direction crossing the first direction. The first electrode includes a first side surface facing in the first direction, a second side surface facing in the second direction, and a curved surface connected to both the first side surface and the second side surface.

Preferably, the chip resistor further comprises a first intermediate layer connected to the first electrode and the resistor portion, and a second intermediate layer connected to the second electrode and the resistor portion. The first intermediate layer and the second intermediate layer are made of a same material.

Preferably, the resistor portion is sandwiched between the first electrode and the second electrode.

Preferably, the first intermediate layer includes a wide portion and a narrow portion. The wide portion is exposed to a third direction crossing both of the first direction and the second direction. The dimension of the narrow portion in the first direction is smaller than the dimension of the wide portion in the first direction.

Preferably, the first electrode and the second electrode are on a same side of the resistor portion.

Preferably, the first side surface includes a linear trace formed surface formed with a linear trace, and a breakage trace formed surface connected to the linear trace formed surface and formed with a breakage trace.

Preferably, the first electrode includes a plate-like portion extending along the first direction and the second direction and an inclined portion inclined with respect to the plate-like portion and closer to the resistor portion than the plate-like portion is.

Preferably, the resistor portion has a thickness smaller than the thickness of the first electrode.

According to a third aspect of the present invention, there is provided a chip resistor manufacturing method comprising the steps of: preparing two conductive elongated boards made of an electrically conductive material and a resistive elongated board made of a resistive material; arranging the resistive elongated board between the two conductive elongated boards; bonding each of the two conductive elongated boards to the resistive elongated board; and cutting, by shearing, the two conductive elongated boards and the resistive elongated board along a width direction crossing a longitudinal direction in which one of the two conductive elongated boards is elongated.

Preferably, the method further comprises the step of bending each of the conductive elongated boards.

Preferably, the bending step is performed at the same time as the cutting step.

Preferably, the bonding step uses welding.

Preferably, the bonding step uses high energy beam welding.

Preferably, the bonding step uses electron beam welding or laser beam welding as the high energy beam welding.

Preferably, the method further comprises the step of fixing each of the two conductive elongated boards to the resistive elongated board before the bonding step. The bonding step comprises performing welding, with each of the two conductive elongated boards fixed to the resistive elongated board.

Preferably, the fixing step comprises sandwiching the two conductive elongated boards and the resistive elongated board by a first clamping tool and a second clamping tool. The sandwiching step comprises pressing one of the two conductive elongated boards against the resistive elongated board by the first clamping tool and pressing the other one of the two conductive elongated boards against the resistive elongated board by the second clamping tool.

Preferably, the arranging step comprises placing the two conductive elongated boards and the resistive elongated board on a base. The fixing step comprises pressing the two conductive elongated boards and the resistive elongated board placed on the base against the base by a pressing tool. The pressing tool is formed with two elongated holes extending in one direction. The step of pressing against the base comprises arranging one of the two elongated holes to overlap a portion where one of the two conductive elongated boards and the resistive elongated board are in contact with each other and arranging the other one of the two elongated holes to overlap a portion where the other one of the two conductive elongated boards and the resistive elongated board are in contact with each other. The bonding step comprises directing high energy beam so as to pass through each of elongated holes.

According to a fourth aspect of the present invention, there is provided a chip resistor comprising: a first electrode; a second electrode spaced apart from the first electrode in a first direction; and a resistor portion bonded to the first electrode and the second electrode. The first electrode includes a front surface and a reverse surface which face away from each other. The resistor portion extends along a plane spreading in the first direction and a second direction crossing the first direction. The first electrode includes a first electrode side surface facing to a first side in the second direction and a second electrode side surface facing to a second side in the second direction. The first electrode side surface includes a first electrode linear trace formed surface formed with a linear trace, and a first electrode breakage trace formed surface connected to the first electrode linear trace formed surface and formed with a breakage trace. The first electrode linear trace formed surface is closer to the front surface than the first electrode breakage trace formed surface is.

Preferably, the second electrode side surface includes a second electrode linear trace formed surface formed with a second linear trace, and a second electrode breakage trace formed surface connected to the second electrode linear trace formed surface and formed with a breakage trace. The second electrode linear trace formed surface is closer to the reverse surface than the second electrode breakage trace formed surface is.

Preferably, the resistor portion includes a resistor portion front surface and a resistor portion reverse surface which face away from each other, a first resistor portion side surface facing to a first side in the second direction, and a second resistor portion side surface facing to a second side in the second direction. The resistor portion front surface faces to the same direction as the front surface. The first resistor portion linear trace formed surface is closer to the resistor portion front surface than the first resistor portion breakage trace formed surface is.

Preferably, the second resistor portion side surface includes a second resistor portion linear trace formed surface formed with a linear trace, and a second resistor portion breakage trace formed surface connected to the second resistor portion linear trace formed surface and formed with a breakage trace. The second resistor portion linear trace formed surface is closer to the resistor portion reverse surface than the second resistor portion breakage trace formed surface is.

Preferably, the first resistor portion breakage trace formed surface has a width larger than the width of the first electrode breakage trace formed surface.

Preferably, the first electrode linear trace formed surface has a width that increases as proceeding further away from the resistor portion.

Preferably, the chip resistor further comprises a first intermediate layer connected to the first electrode and the resistor portion, and a second intermediate layer connected to the second electrode and the resistor portion. The first intermediate layer and the second intermediate layer are made of a same material.

Preferably, the resistor portion is sandwiched between the first electrode and the second electrode.

Preferably, the first intermediate layer includes a wide portion and a narrow portion. The wide portion is exposed to a third direction crossing both of the first direction and the second direction. The dimension of the narrow portion in the first direction is smaller than the dimension of the wide portion in the first direction.

Preferably, the first electrode includes a plate-like portion extending along the first direction and the second direction and an inclined portion inclined with respect to the plate-like portion and closer to the resistor portion than the plate-like portion is.

According to a fifth aspect of the present invention, there is provided a chip resistor mount structure comprising a chip resistor provided according to the second or the fourth aspect of the present invention, a mount board, and a solder layer between the mount board and the chip resistor.

BRIEF DESCRIPTION OF THE DRAWINGS

FIG. 9 is a partial sectional view taken along lines IX-IX in FIG. 8;

MODE FOR CARRYING OUT THE INVENTION

A first embodiment of the present invention is described below with reference to FIGS. 1-18.

Figure 1:
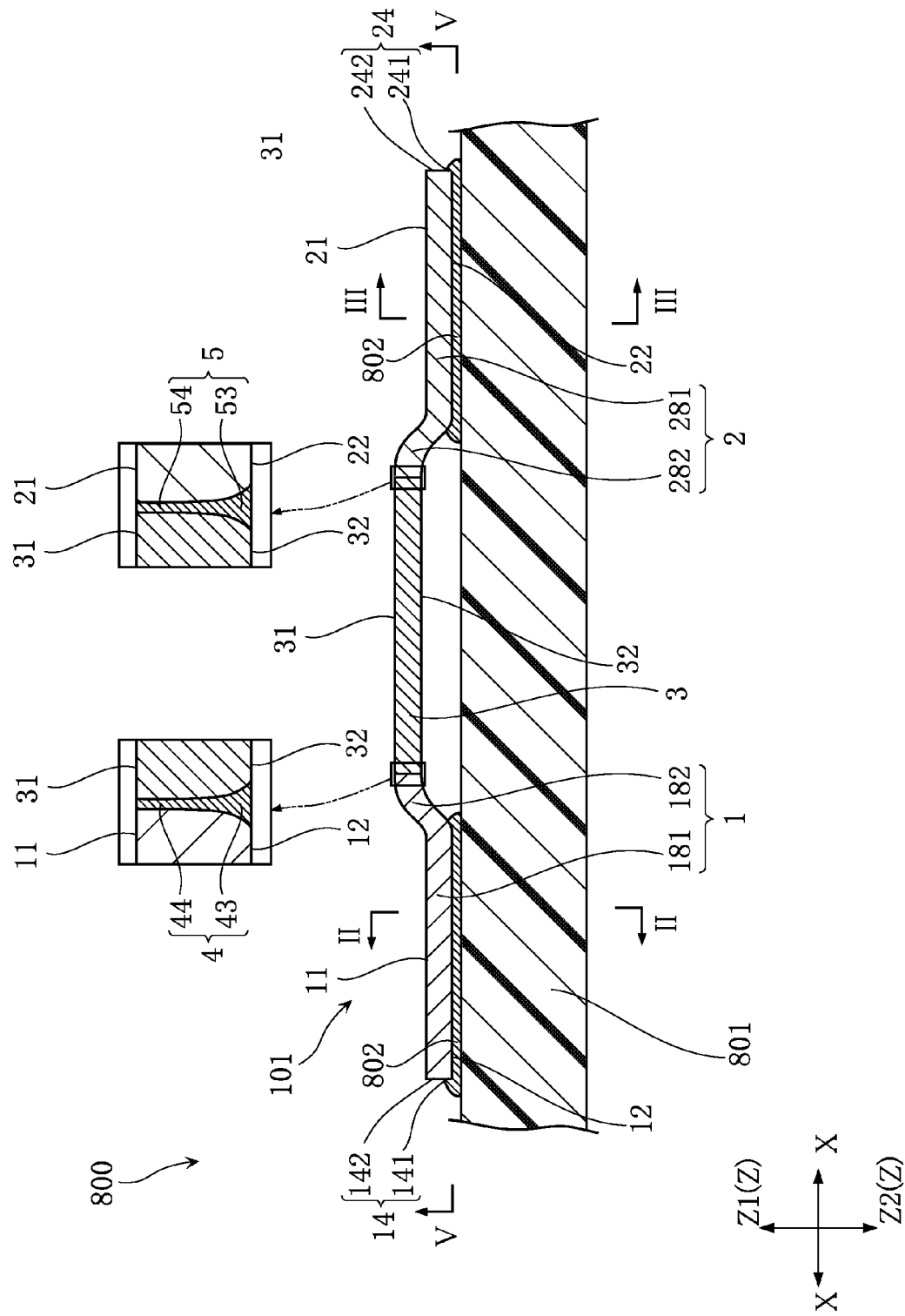
FIG. 1 is a sectional view of a mount structure of a chip resistor according to a first embodiment of the present invention.
Figure 2:
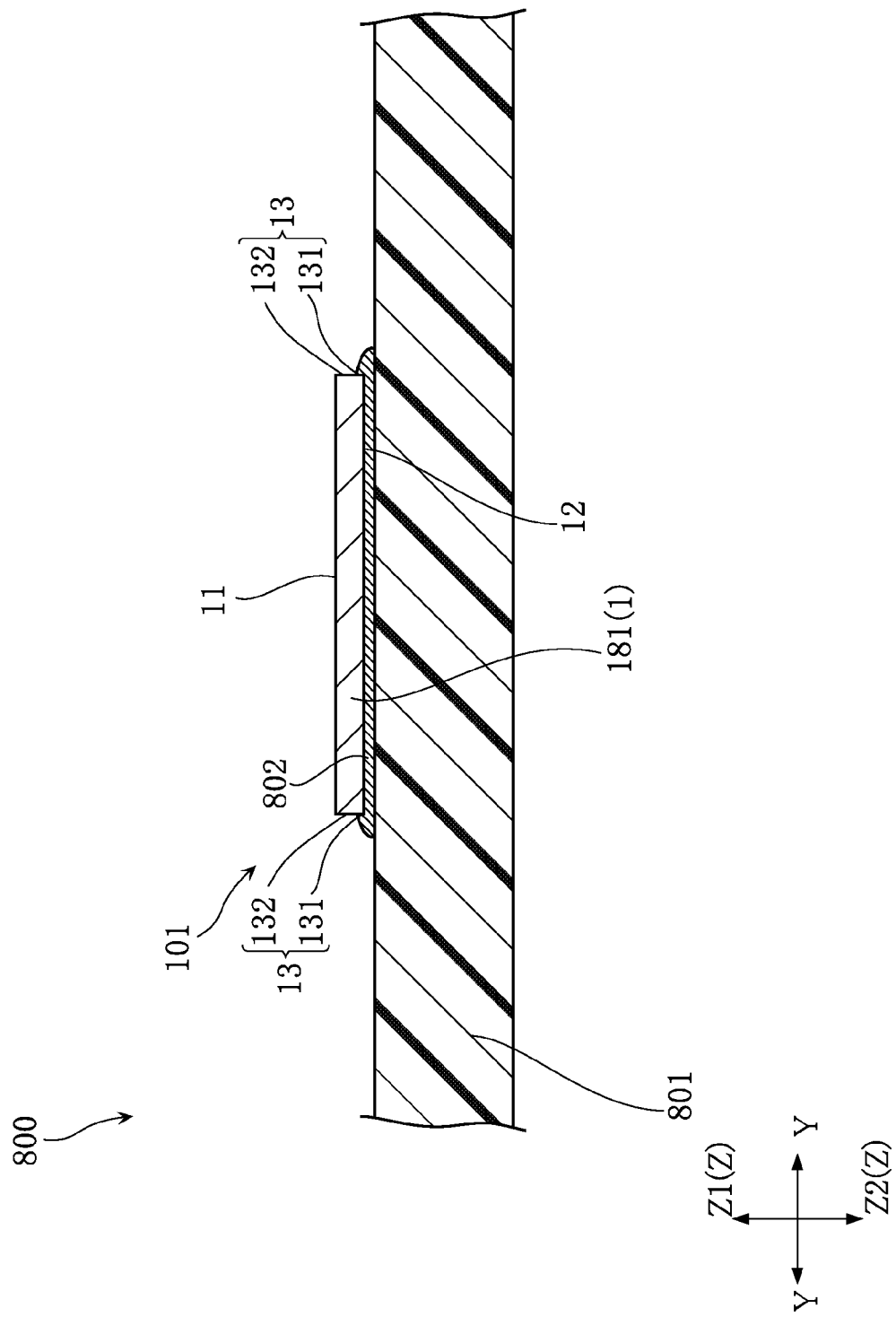
FIG. 2 is a sectional view taken along lines II-II in FIG. 1.
Figure 3:
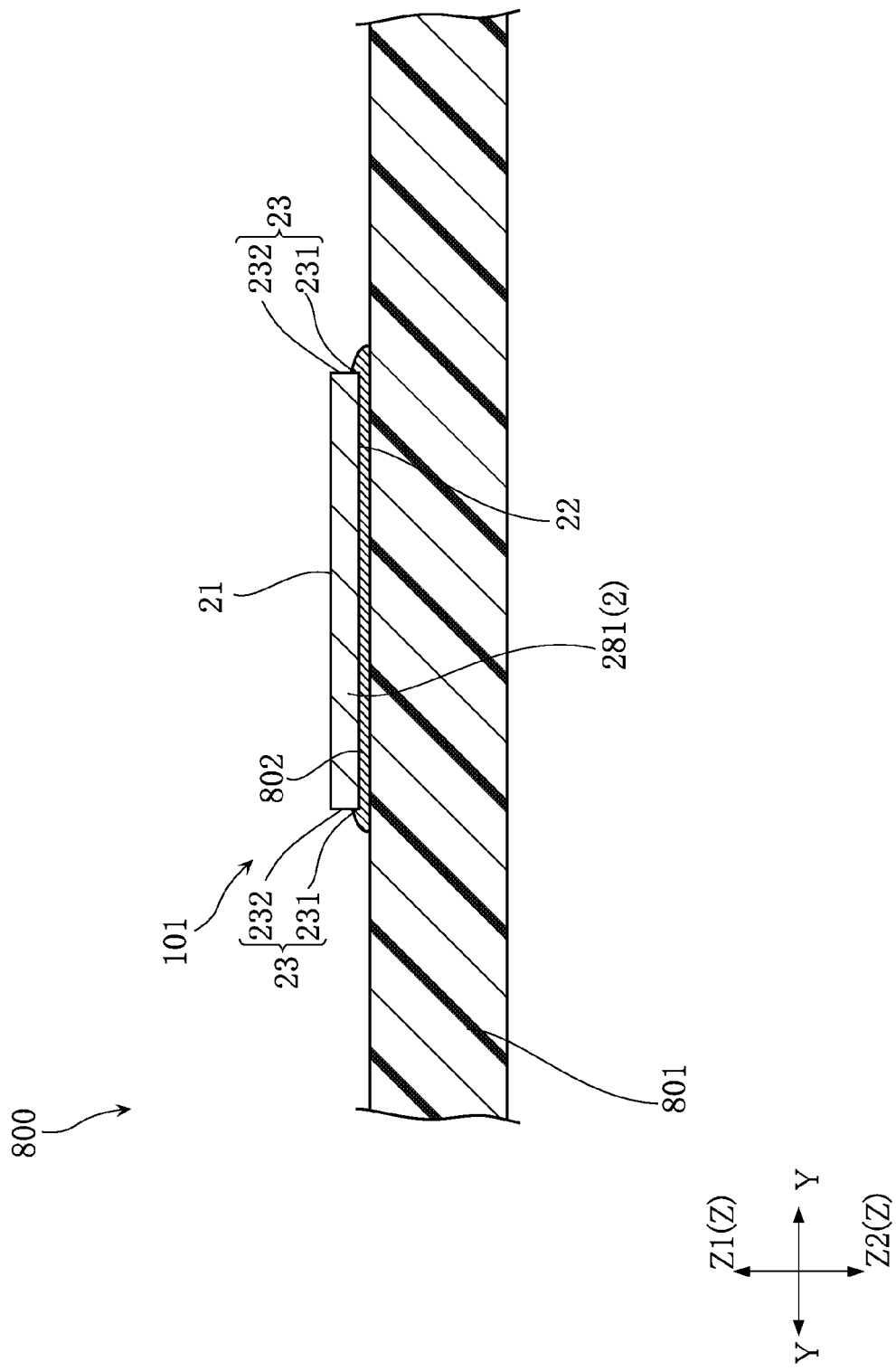
FIG. 3 is a sectional view taken along lines in FIG. 1.
Figure 4:
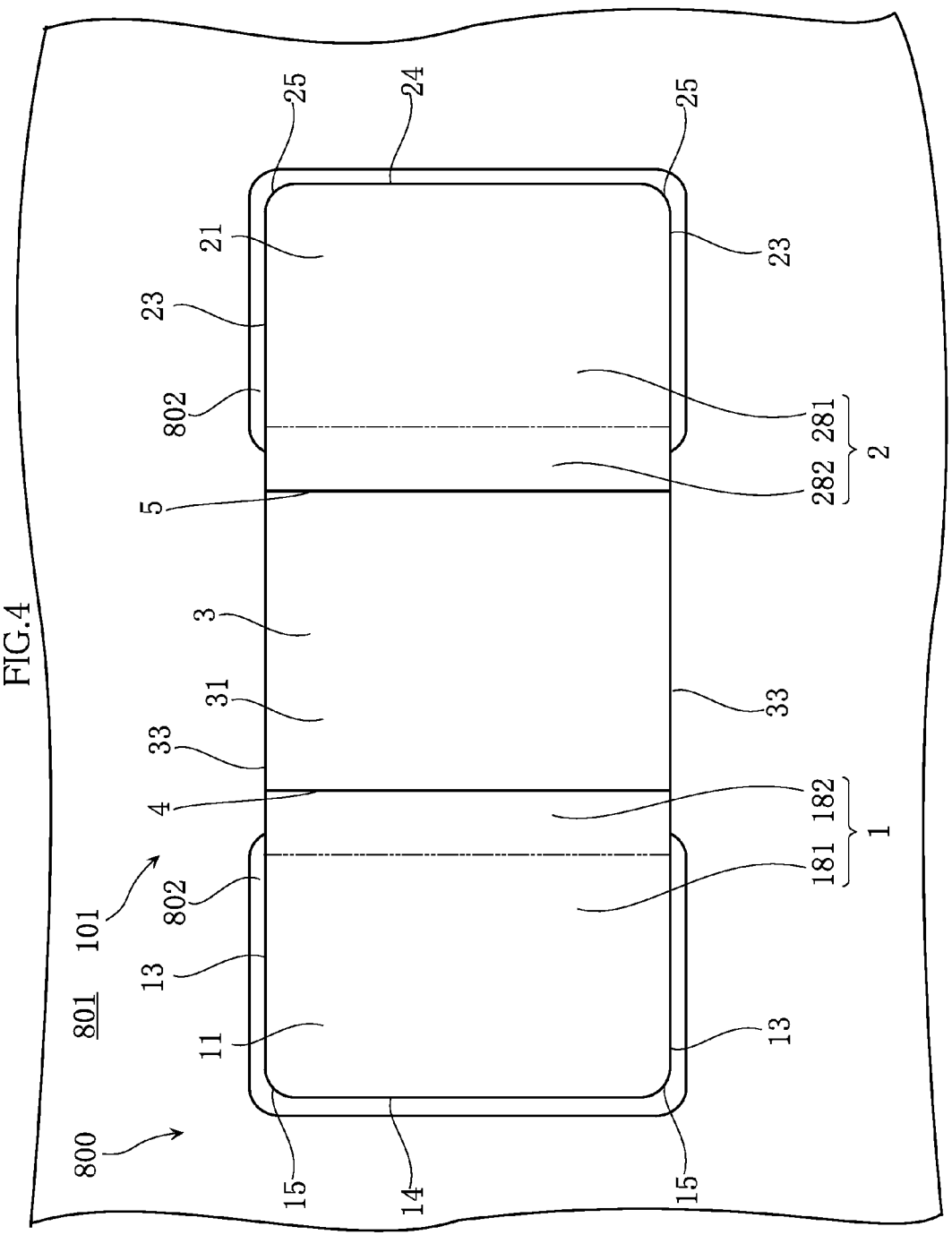
FIG. 4 is a plan view of amount structure of the chip resistor shown in FIG. 1.
Figure 5:
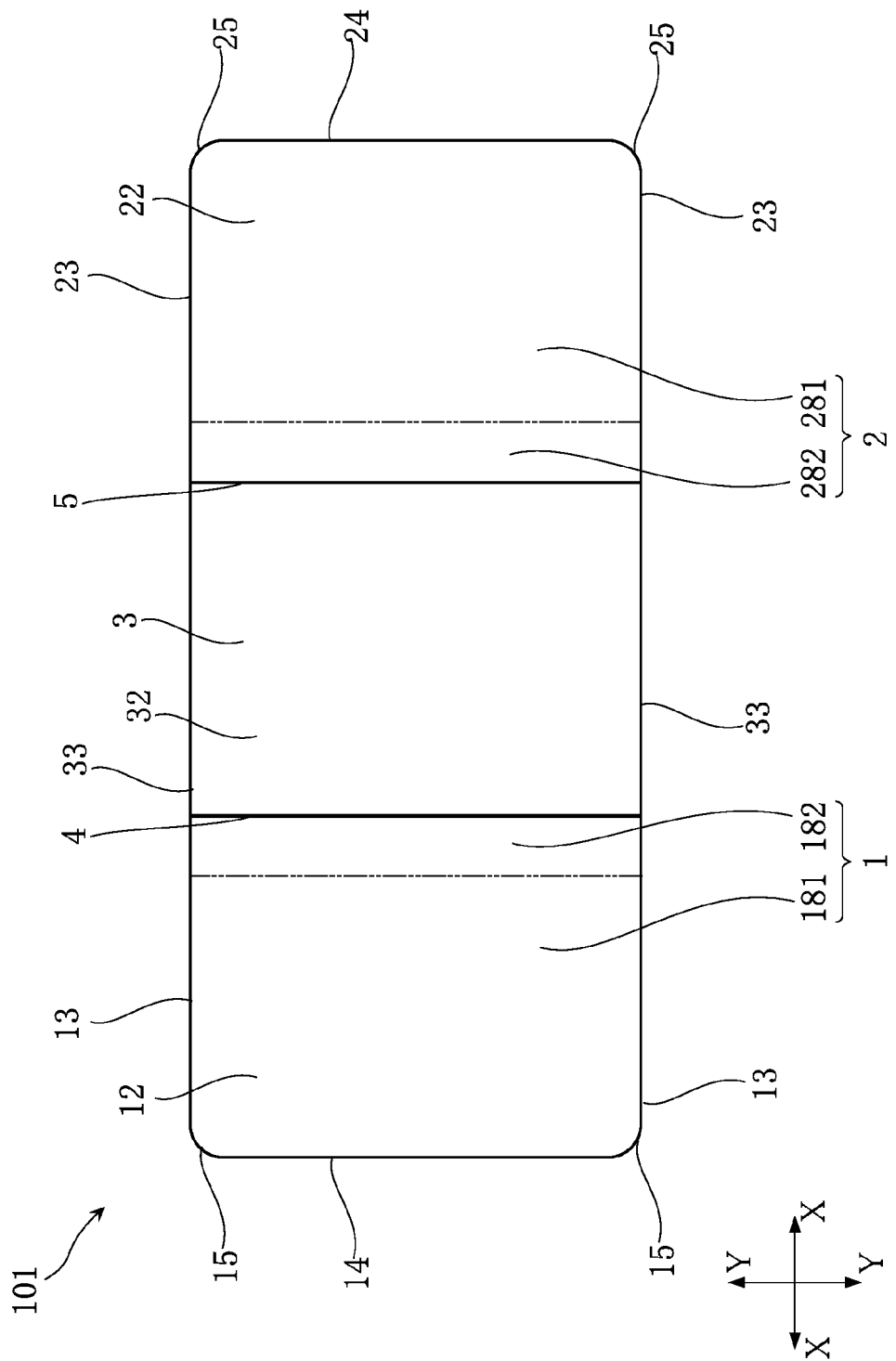
FIG. 5 is a view (partially omitted) along lines V-V in FIG. 1.

FIG. 1 is a sectional view of a mount structure of a chip resistor according to this embodiment. FIG. 2 is a sectional view taken along lines II-II in FIG. 1. FIG. 3 is a sectional view taken along lines III-III in FIG. 1. FIG. 4 is a plan view of a mount structure of the chip resistor shown in FIG. 1. FIG. 5 is a view (partially omitted) along lines V-V in FIG. 1.

The chip resistor mount structure 800 shown in these figures includes a chip resistor 101, a mount board 801 and a solder layer 802.

For instance, the mount board 801 is a printed circuit board. For instance, the mount board 801 includes an insulating substrate and a pattern electrode (not shown) formed on the insulating substrate. The chip resistor 101 is mounted on the mount board 801. The solder layer 802 is between the chip resistor 101 and the mount board 801. The solder layer 802 bonds the chip resistor 101 and the mount board 801 to each other.

Figure 6:
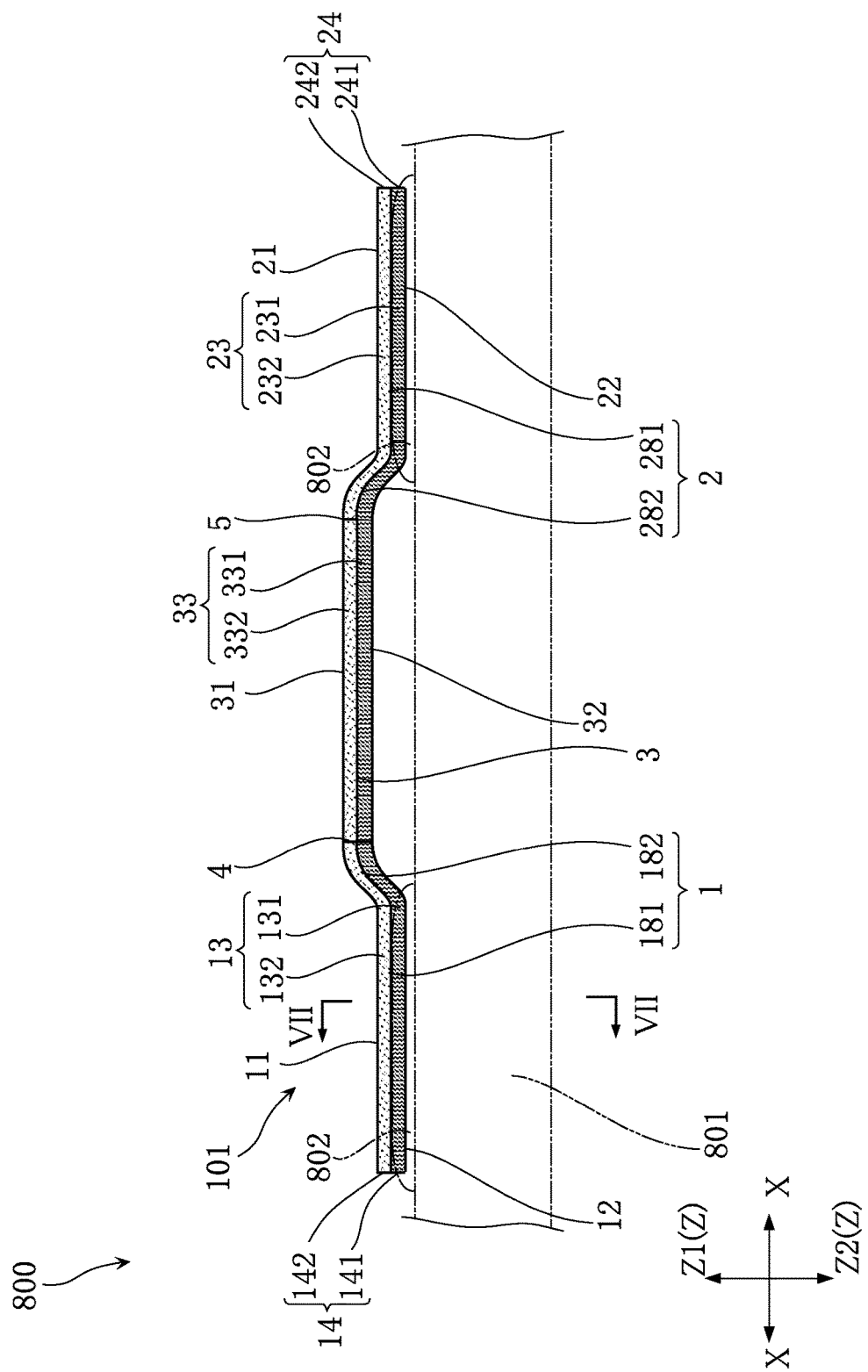
FIG. 6 is a front view of the chip resistor shown in FIG. 1.

FIG. 6 is a front view of the chip resistor shown in FIG. 1.

The chip resistor 101 includes a first electrode 1, a second electrode 2, a resistor portion 3, a first intermediate layer 4 and a second intermediate layer 5.

The first electrode 1 is made of an electrically conductive material. Examples of the electrically conductive material include Cu, Ni and Fe. When the chip resistor 101 is mounted on the mount board 801, the first electrode 1 is bonded to the solder layer 802. The first electrode 1 is electrically connected to the pattern electrode (not shown) of the mount board 801 via the solder layer 802. In this embodiment, the first electrode 1 includes a plate-like portion 181 and an inclined portion 182.

The plate-like portion 181 extends along the X-Y plane. The plate-like portion 181 constitutes the most part of the first electrode 1. The inclined portion 182 is inclined with respect to the X-Y plane. Specifically, the inclined portion 182 is inclined to be deviated toward the direction Z1 as proceeding further away from the plate-like portion 181. The inclined portion 182 is in the form of a strip extending along the direction Y. The inclined portion 182 is connected to the plate-like portion 181.

The first electrode 1 includes a front surface 11, a reverse surface 12, two side surfaces 13 (first side surfaces), a side surface 14 (second side surface), and two curved surfaces 15.

The front surface 11 faces to the direction Z1, whereas the reverse surface 12 faces to the direction Z2. Each of the side surfaces 13, 14 and the curved surfaces 15 face to a direction perpendicular to the direction Z. Specifically, the side surfaces 13 face to the direction Y and the side surface 14 faces to the direction X. The curved surfaces 15 are connected to the side surfaces 13 and the side surface 14.

Figure 7:
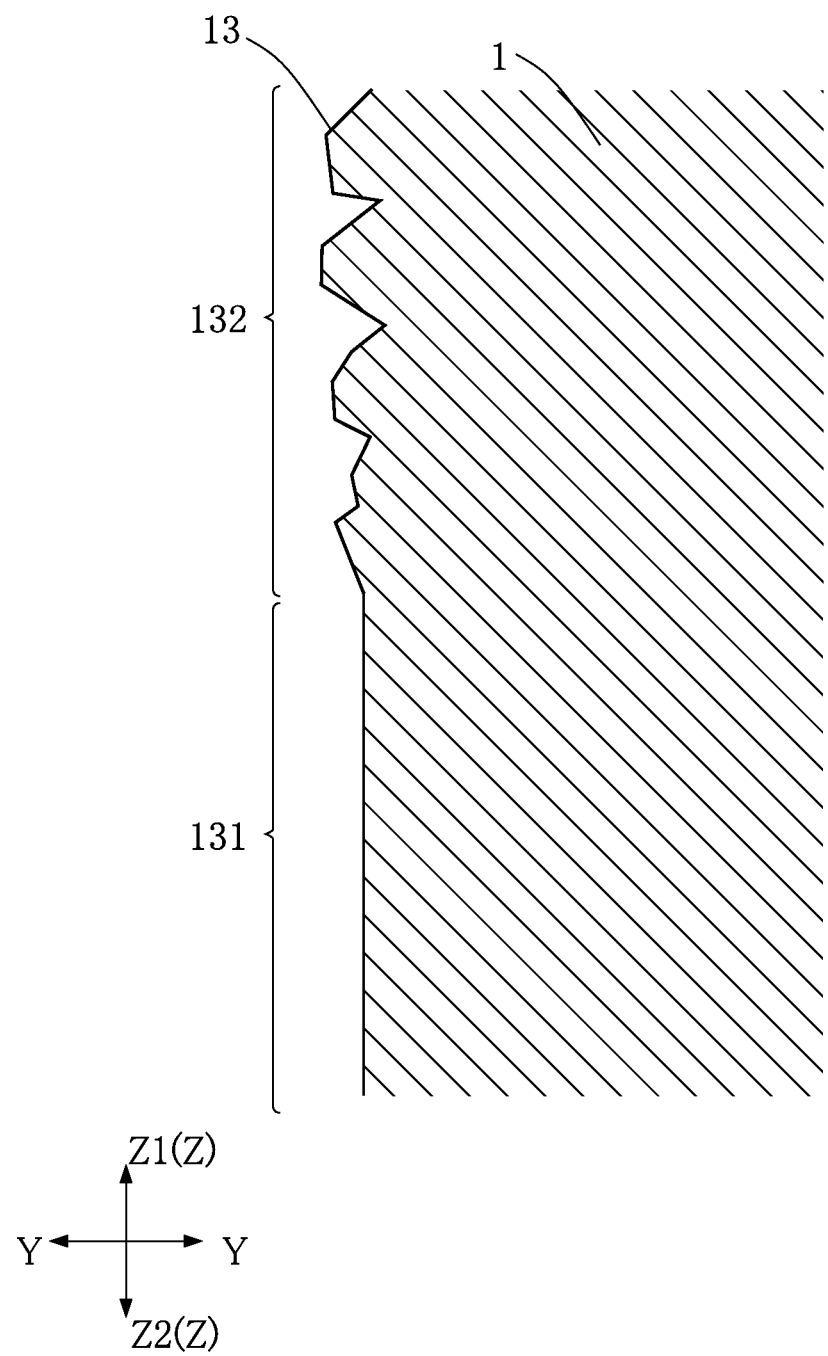
FIG. 7 is a partially enlarged sectional view taken along lines VII-VII in FIG. 6.

FIG. 7 is a partially enlarged sectional view taken along lines VII-VII in FIG. 6.

The side surface 13 includes a linear trace formed surface 131 and a breakage trace formed surface 132. The linear trace formed surface 131 is formed with a linear trace. The linear trace comprises a plurality of thin linear grooves extending in the direction Z. The breakage trace formed surface 132 is connected to the linear trace formed surface 131. The breakage trace formed surface 132 is formed with a breakage trace. The breakage trace is an irregular trace formed when a metal is torn off. As shown in FIG. 6, in this embodiment, the linear trace formed surface 131 is closer to the reverse surface 12 than the breakage trace formed surface 132 is. When the chip resistor 101 is mounted on a mount board 801, the linear trace formed surface 131 is covered by the solder layer 802. According to this arrangement, solder moves along the thin grooves of the linear trace formed surface 131, whereby a relatively large area of the side surface 13 is covered by the solder layer 802. Unlike this embodiment, the breakage trace formed surface 132 may be closer to the reverse surface 12 than the linear trace formed surface 131 is.

As shown in FIG. 6, similarly to the side surfaces 13, the side surface 14 has a linear trace formed surface 141 and a breakage trace formed surface 142. Since the linear trace formed surface 141 and the breakage trace formed surface 142 of the side surface 14 are similar to the linear trace formed surface 131 and the breakage trace formed surface 132 of the side surfaces 13, the explanation is omitted.

The structure of the second electrode 2 is similar to that of the first electrode 1, which is as follows.

The second electrode 2 is made of an electrically conductive material. Examples of the electrically conductive material include Cu, Ni and Fe. When the chip resistor 101 is mounted on the mount board 801, the second electrode 2 is bonded to the solder layer 802. The second electrode 2 is electrically connected to the pattern electrode (not shown) of the mount board 801 via the solder layer 802. In this embodiment, the second electrode 2 includes a plate-like portion 281 and an inclined portion 282.

The plate-like portion 281 extends along the X-Y plane. The plate-like portion 281 constitutes the most part of the second electrode 2. The inclined portion 282 is inclined with respect to the X-Y plane. Specifically, the inclined portion 282 is inclined to be deviated toward the direction Z1 as proceeding further away from the plate-like portion 281. The inclined portion 282 is in the form of a strip extending along the direction Y. The inclined portion 282 is connected to the plate-like portion 281.

The second electrode 2 includes a front surface 21, a reverse surface 22, two side surfaces 23, a side surface 24 and two curved surfaces 25.

The front surface 21 faces to the direction Z1, whereas the reverse surface 22 faces to the direction Z2. Each of the side surfaces 23, 24 and the curved surfaces 25 face to a direction perpendicular to the direction Z. Specifically, the side surfaces 23 face to the direction Y and the side surface 24 faces to the direction X. The curved surfaces 25 are connected to the side surfaces 23 and the side surface 24.

As shown in FIG. 6, the side surface 23 includes a linear trace formed surface 231 and a breakage trace formed surface 232. Since the linear trace formed surface 231 and the breakage trace formed surface 232 of the side surface 23 are similar to the linear trace formed surface 131 and the breakage trace formed surface 132 of the side surface 13, the explanation is omitted.

As shown in FIG. 6, similarly to the side surfaces 23, the side surface 24 has a linear trace formed surface 241 and a breakage trace formed surface 242. Since the linear trace formed surface 241 and the breakage trace formed surface 242 of the side surface 24 are similar to the linear trace formed surface 231 and the breakage trace formed surface 232 of the side surfaces 23, the explanation is omitted.

The resistor portion 3 is made of a resistive material. Examples of the resistive material include an alloy of Cu and Mn, an alloy of Ni and Cr, an alloy of Ni and Cu, and an alloy of Fe and Cr. An alloy of Cu and Mn is relatively soft, whereas an alloy of Ni and Cr, an alloy of Ni and Cu, and an alloy of Fe and Cr are relatively hard. The resistance of the resistive material forming the resistor portion 3 is higher than the resistance of the electrically conductive material forming the first electrode 1 or the second electrode 2. The resistor portion 3 is connected to first electrode 1 and the second electrode 2. In this embodiment, the resistor portion 3 is sandwiched between the first electrode 1 and the second electrode 2.

In this embodiment, the inclined portion 182 is closer to the resistor portion 3 than the plate-like portion 181 is. Similarly, the inclined portion 282 is closer to the resistor portion 3 than the plate-like portion 281 is.

The resistor portion 3 includes a resistor portion front surface 31, a resistor portion reverse surface 32 and two resistor portion side surfaces 33.

The resistor portion front surface 31 faces to the same direction as the front surface 11 or the front surface 21 (i.e., the direction Z1). The resistor portion reverse surface 32 faces to the opposite direction from the resistor portion front surface 31. The resistor portion reverse surface 32 faces to the same direction as the reverse surface 12 or the reverse surface 22 (i.e., the direction Z2). At least part of the reverse surface 12 and at least part of the reverse surface 22 are deviated from the resistor portion reverse surface 32 toward the side to which the resistor portion reverse surface 32 faces (i.e., the direction Z2).

Each of the resistor portion side surfaces 33, which are shown in e.g. FIGS. 4 and 6, faces to the direction (direction Y) that crosses the direction in which the first electrode 1 and the second electrode 2 are spaced apart from each other. As shown in FIG. 6, each resistor portion side surface 33 includes a linear trace formed surface 331 and a breakage trace formed surface 332. Since the linear trace formed surface 331 and the breakage trace formed surface 332 are similar to the linear trace formed surface 131 and the breakage trace formed surface 132, respectively, the explanation is omitted.

As shown in FIG. 1, the first intermediate layer 4 is between the first electrode 1 and the resistor portion 3. The first intermediate layer 4 is connected to the first electrode 1 and the resistor portion 3. In this embodiment, the first intermediate layer 4 is formed when a high energy beam is directed to the first electrode 1 or the resistor portion 3 to bond the first electrode 1 and the resistor portion 3. Thus, the first intermediate layer 4 is made of a mixture of the material forming the first electrode 1 and the material forming the resistor portion 3.

The first intermediate layer 4 includes a wide portion 43 and a narrow portion 44. The wide portion 43 is exposed to the direction Z2. The narrow portion 44 is on the direction Z1 side of the wide portion 43. The dimension of the narrow portion 44 in the direction X is smaller than the dimension of the wide portion 43 in the direction X. For instance, the dimension of the wide portion 43 in the direction X is 1-1.5 mm, whereas the dimension of the narrow portion 44 in the direction X is 0.5-1 mm. The wide portion 43 may have burr (not shown) on the surface.

Similarly to the first intermediate layer 4, the second intermediate layer 5 is between the second electrode 2 and the resistor portion 3. The second intermediate layer 5 is connected to the second electrode 2 and the resistor portion 3. In this embodiment, the second intermediate layer 5 is formed when a high energy beam is directed to the second electrode 2 or the resistor portion 3 to bond the second electrode 2 and the resistor portion 3. Thus, the second intermediate layer 5 is made of a mixture of the material forming the second electrode 2 and the material forming the resistor portion 3. Thus, the second intermediate layer 5 and the first intermediate layer 4 are made of the same material.

The second intermediate layer 5 includes a wide portion 53 and a narrow portion 54. The wide portion 53 is exposed to the direction Z2. The narrow portion 54 is on the direction Z1 side of the wide portion 53. The dimension of the narrow portion 54 in the direction X is smaller than the dimension of the wide portion 53 in the direction X. For instance, the dimension of the wide portion 53 in the direction X is 1-1.5 mm, whereas the dimension of the narrow portion 54 in the direction X is 0.5-1 mm. The wide portion 53 may have burr (not shown) on the surface.

A method for manufacturing the chip resistor 101 is described below.

Figure 8:
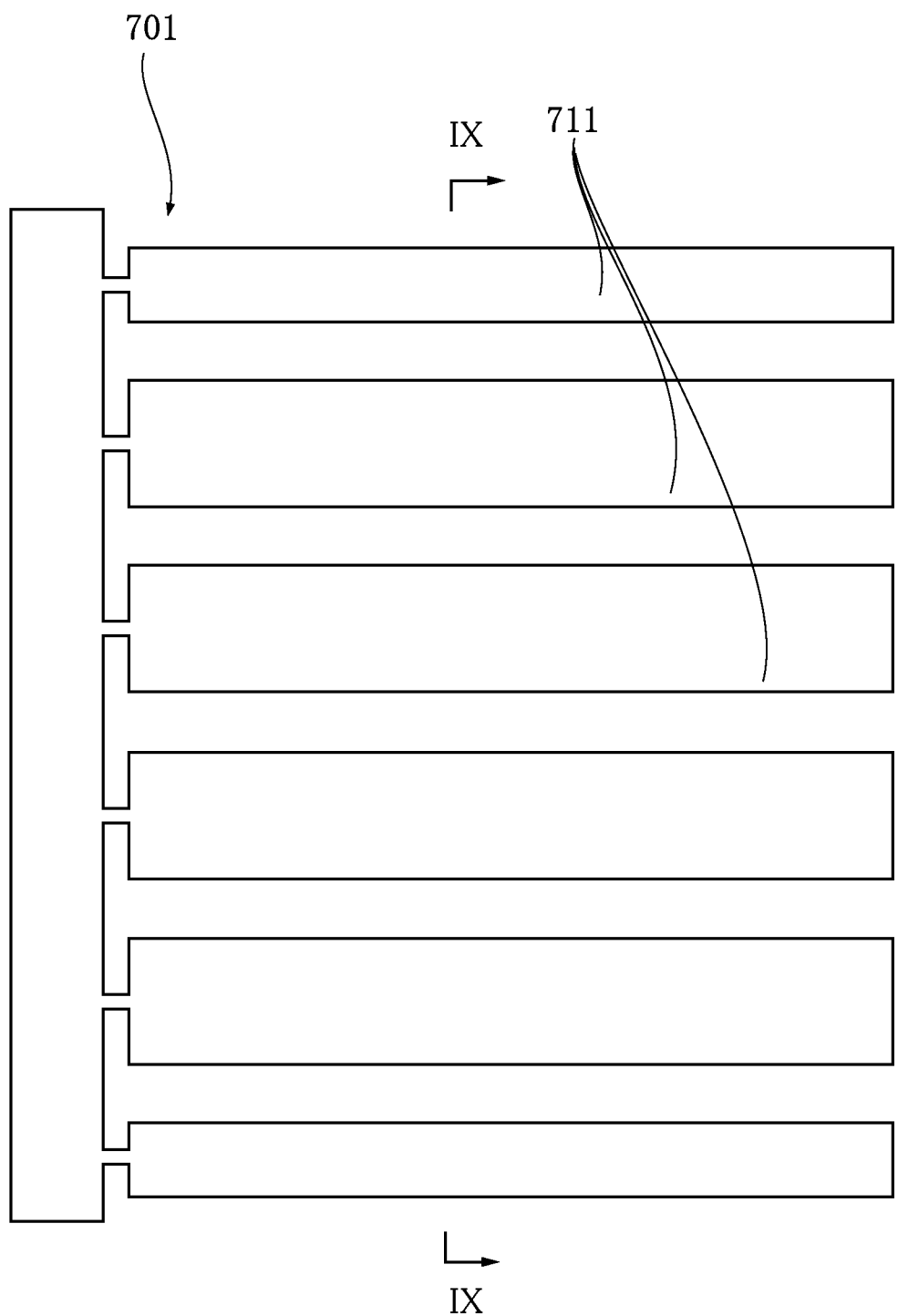
FIG. 8 is a plan view showing a step of a method for manufacturing the chip resistor according to the first embodiment of the present invention.

First, as shown in FIGS. 8 and 9, an electrically conductive member 701 is prepared. The electrically conductive member 701 is a lead frame in this embodiment and includes at least three conductive elongated boards 711. In the illustrated example, the electrically conductive member 701 includes six conductive elongated boards 711. The conductive elongated boards 711 are elongated in one direction. In the electrically conductive member 701, the conductive elongated boards 711 are spaced apart from each other in the width direction crossing the longitudinal direction of one of the conductive elongated boards 711. As shown in FIG. 9, each conductive elongated board 711 is in the form of an elongated rectangle in cross section. In this embodiment, at least three conductive elongated boards 711 spaced apart from each other are provided by forming the electrically conductive member 701.

Figure 10:
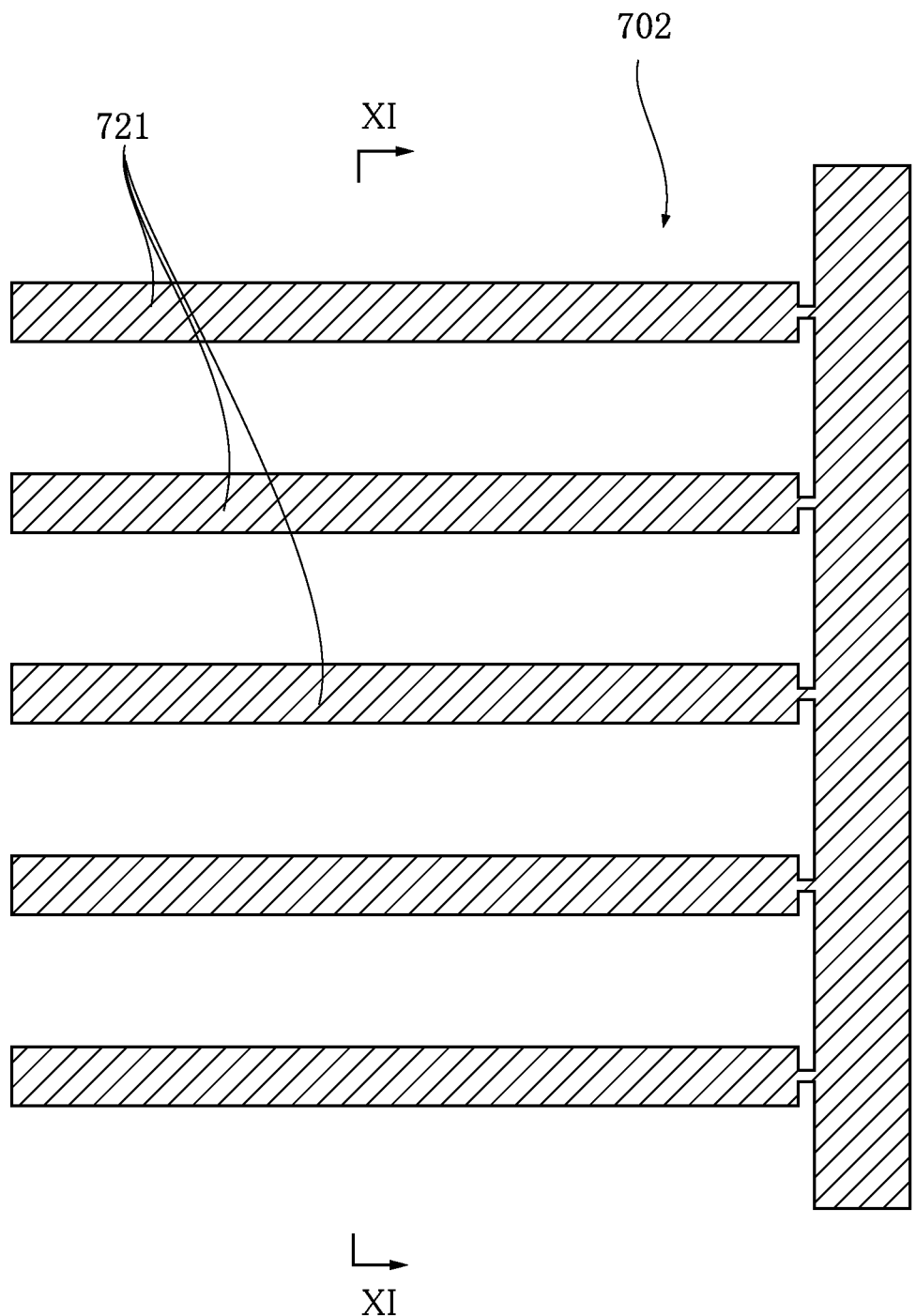
FIG. 10 is a plan view showing a step of a method for manufacturing the chip resistor according to the first embodiment of the present invention.
Figure 11:
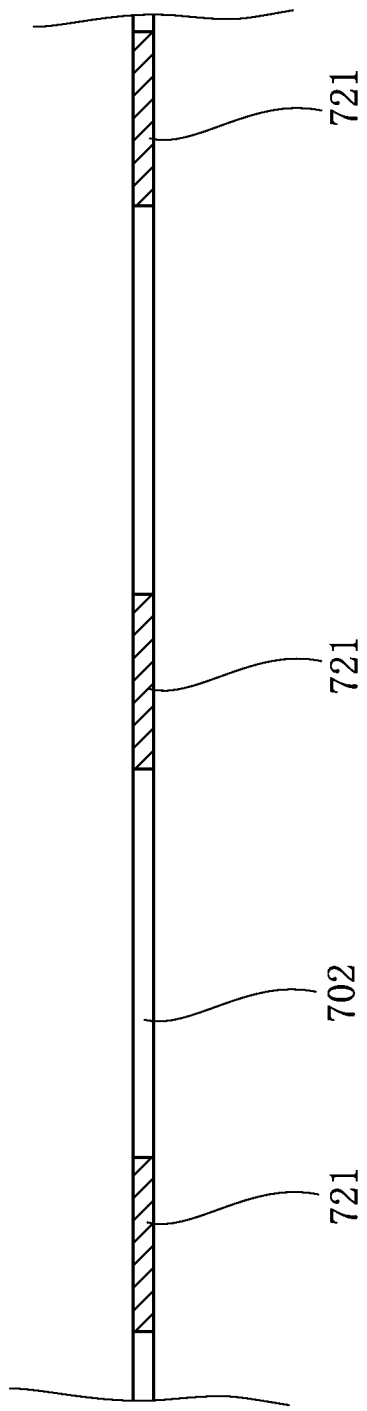
FIG. 11 is a partial sectional view taken along lines XI-XI in FIG. 10.

Similarly, as shown in FIGS. 10 and 11, a resistive member 702 is prepared. In this embodiment, the resistive member 702 is a resistive frame and includes a plurality of resistive elongated boards 721. In this embodiment, the resistive member 702 includes five resistive elongated boards 721. The resistive elongated boards 721 are elongated in one direction. In the resistive member 702, the resistive elongated boards 721 are spaced apart from each other in the width direction crossing the longitudinal direction of the resistive elongated boards 721. As shown in FIG. 11, each resistive elongated board 721 is in the form of an elongated rectangle in cross section. In FIG. 10, the resistive member 702 is hatched for easier understanding. This holds true for the subsequent plan views. Unlike this embodiment, the resistive member 702 may be a single flat plate large enough to cover collectively all the conductive elongated boards 711 as viewed in plan.

Figure 12:
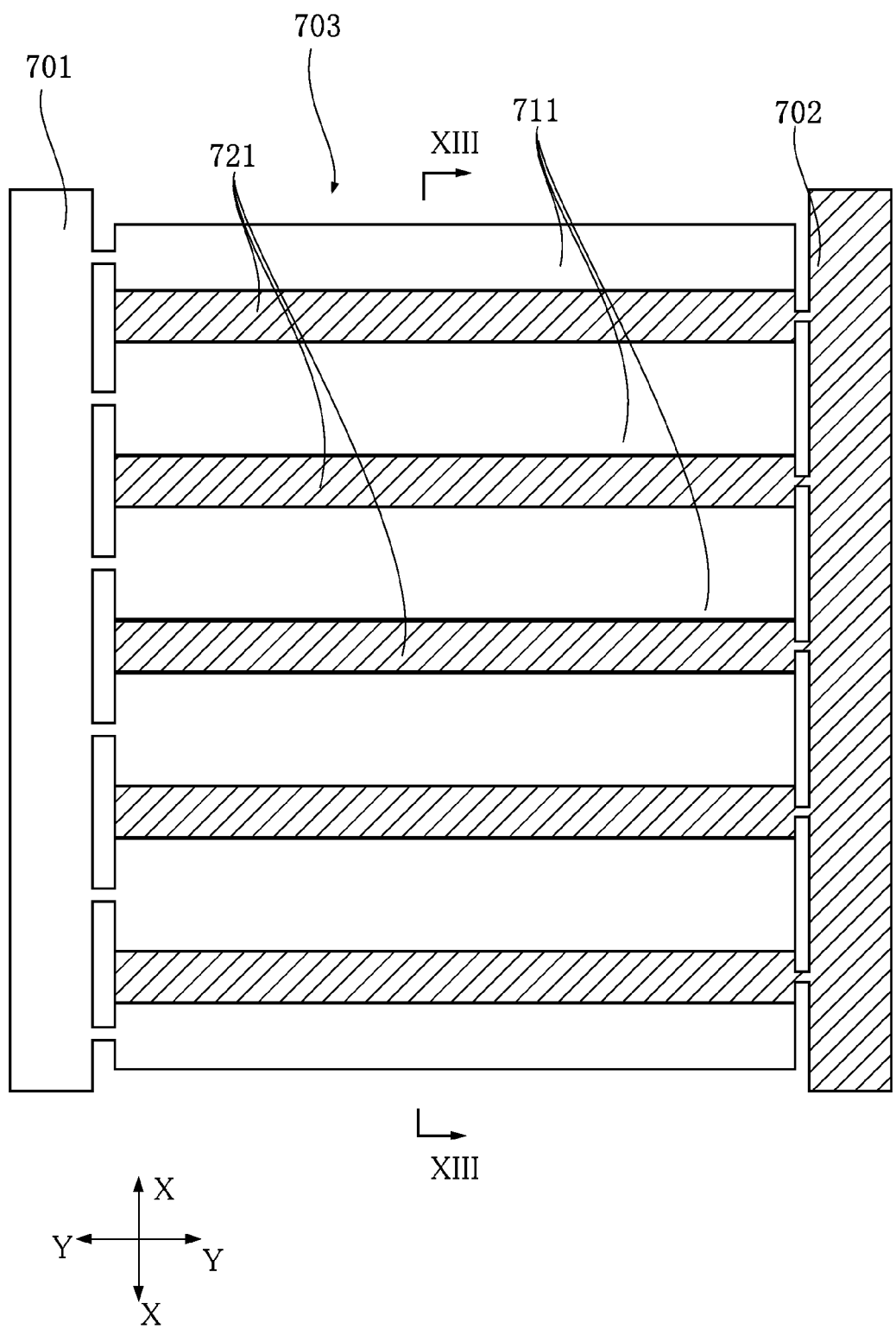
FIG. 12 is a plan view showing a step of a method for manufacturing the chip resistor according to the first embodiment of the present invention.
Figure 13:
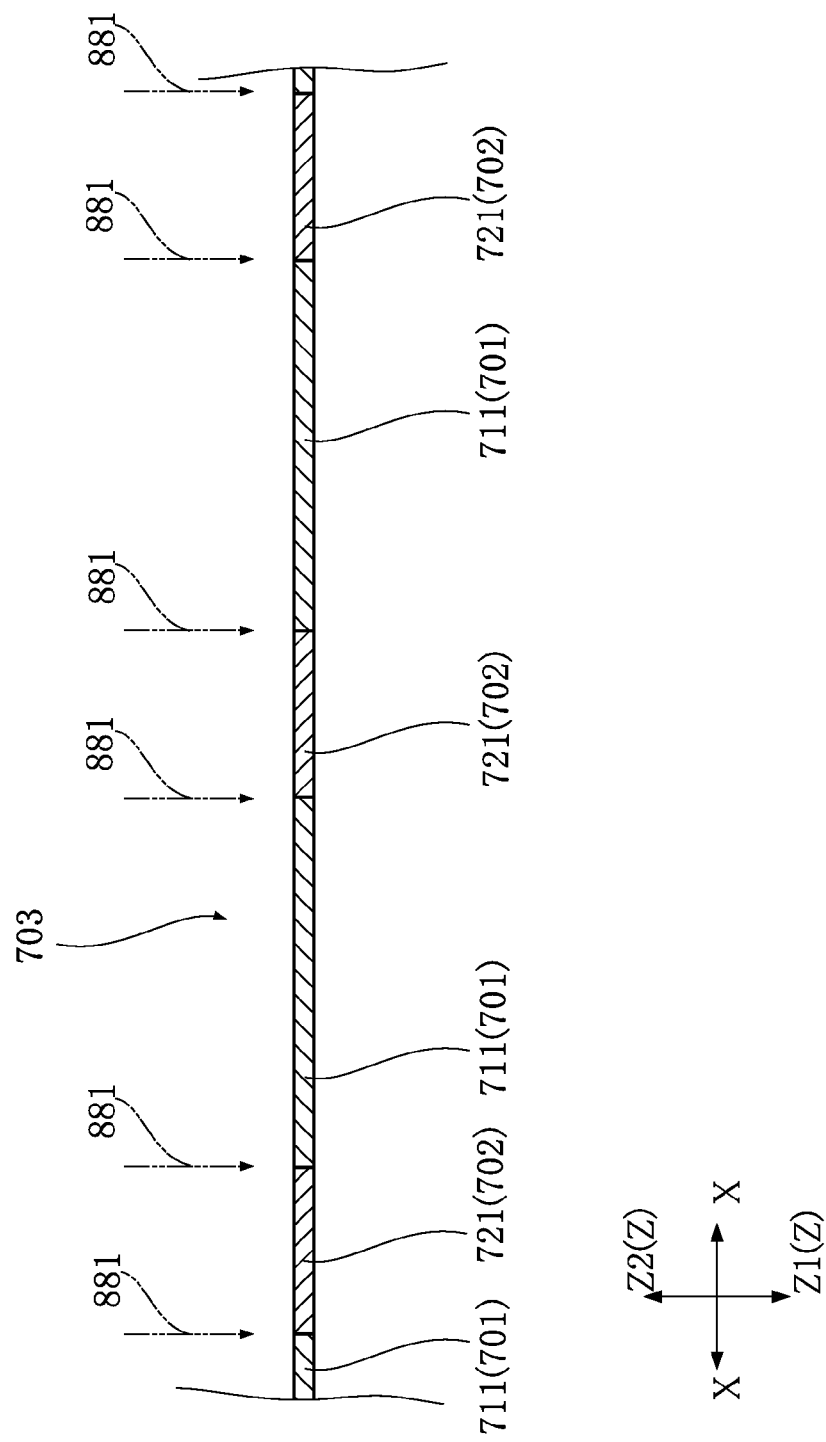
FIG. 13 is a partial sectional view taken along lines XIII-XIII in FIG. 12.

Then, as shown in FIGS. 12 and 13, a resistor aggregate 703 is formed. To form a resistor aggregate 703, the resistive member 702 is bonded to at least three conductive elongated boards 711 of the electrically conductive member 701. In this embodiment, each of the resistive elongated boards 721 is bonded to adjacent two of at least three conductive elongated boards 711. In this process, each of the resistive elongated boards 721 is arranged between adjacent two of at least three conductive elongated boards 711.

As a technique for bonding the resistive member 702 to the conductive elongated boards 711, welding may be employed. Preferably, as the welding technique, high energy beam welding may be employed. Examples of the high energy beam welding include electron beam welding and laser beam welding. In the case where high energy beam welding is employed, as shown in FIG. 13, high energy beam 881 (electron beam or laser beam) is directed to the conductive elongated boards 711 or the resistive elongated boards 721 along the direction Z1, for example. By receiving energy of the high energy beam 881, the conductive elongated boards 711 or the resistive elongated boards 721 melt, whereby the conductive elongated boards 711 and the resistive elongated boards 721 are bonded to each other. Unlike this embodiment, the conductive elongated boards 711 and the resistive member 702 may be bonded by brazing or soldering using solder or silver paste. Alternatively, the conductive elongated boards 711 and the resistive member 702 may be bonded by ultrasonic joining.

Figure 14:
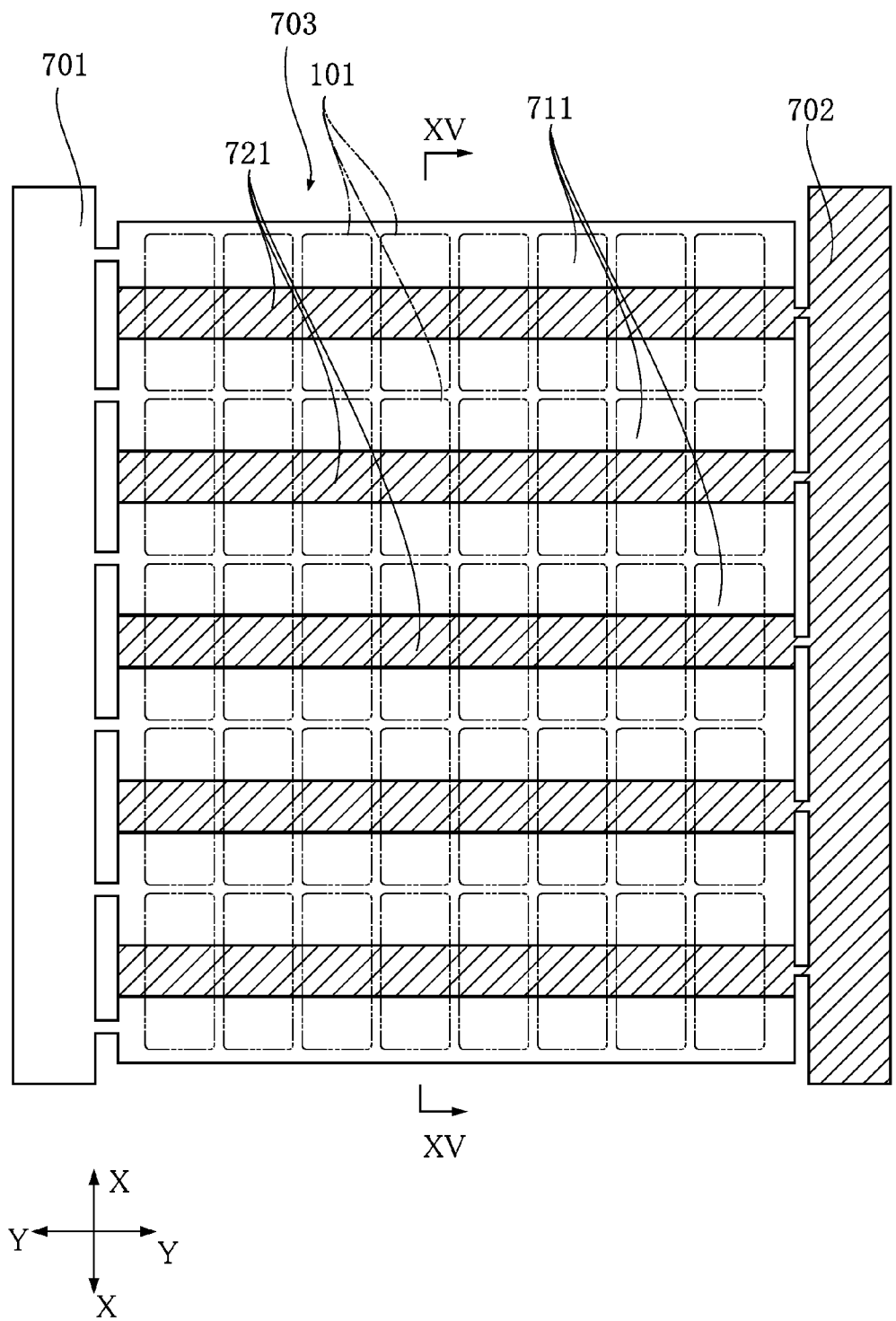
FIG. 14 is a plan view showing the step subsequent to the step of FIG. 12.
Figure 15:
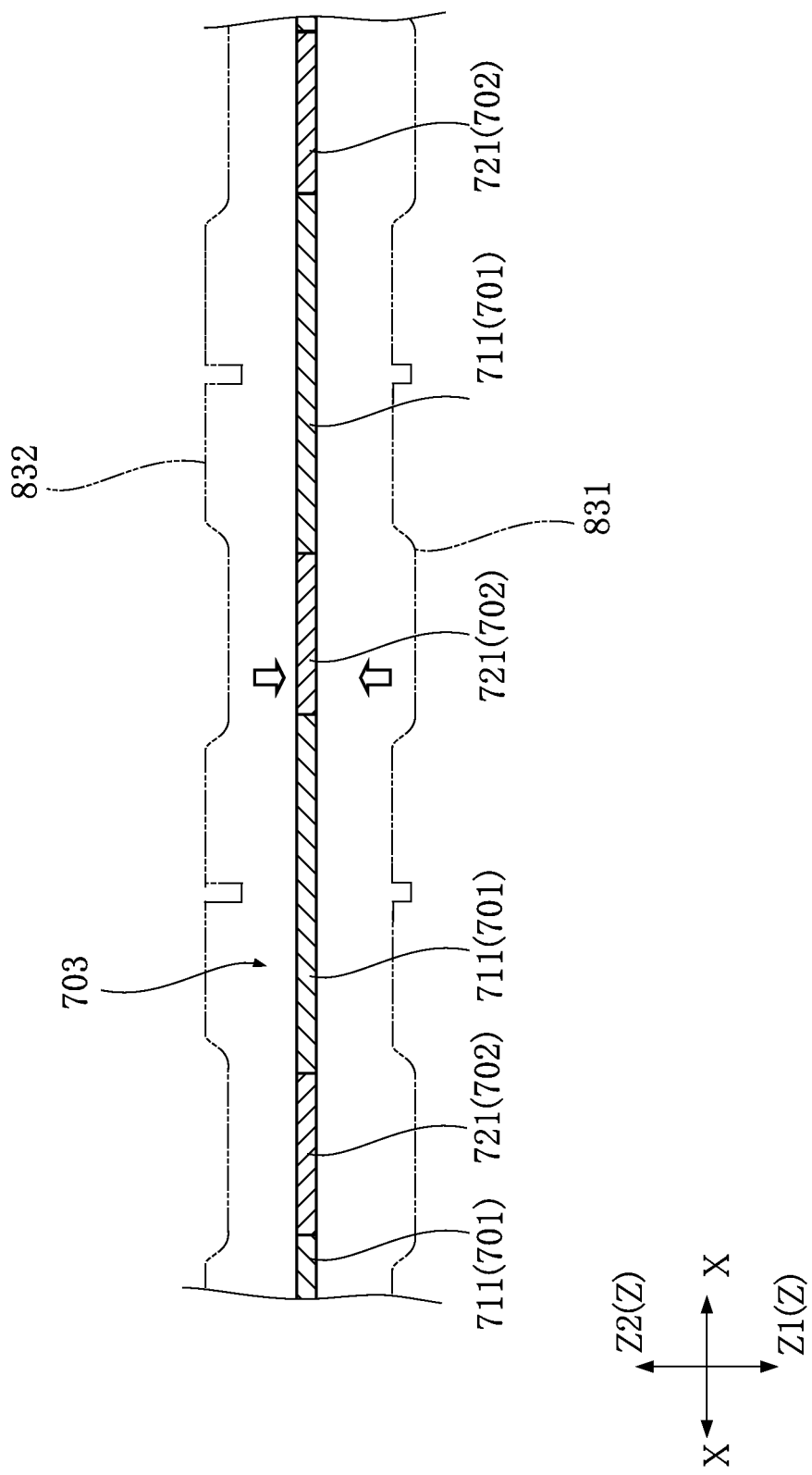
FIG. 15 is a partial sectional view taken along lines XV-XV in FIG. 14.
Figure 16:
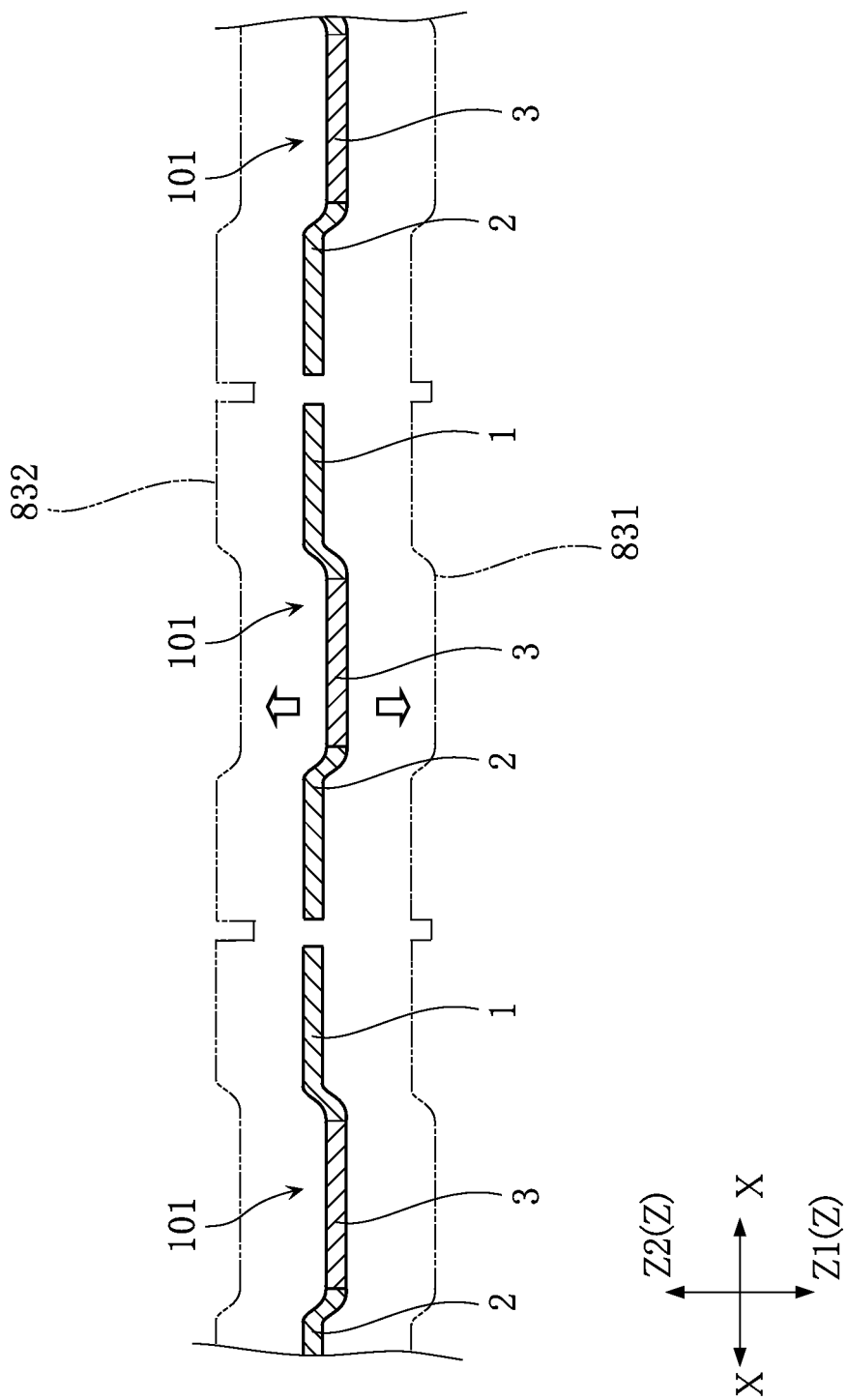
FIG. 16 is a partial sectional view showing the step subsequent to the step of FIG. 15.

Then, as shown in FIGS. 14-16, the resistor aggregate 703 is collectively divided into a plurality of chip resistors 101. In FIG. 14, each of the regions of the resistor aggregate 703 which are to become chip resistors 101 is indicated by a double-dashed line. For instance, about 40 chip resistors 101 are obtained from a single resistor aggregate 703. To divide the resistor aggregate 703 into a plurality of chip resistors 101, two punching dies 831, 832 (see FIG. 15) of a size corresponding to the plurality of chip resistors as viewed in plan are used. By pressing the resistor aggregate 703 between the punching die 831 and the punching die 832, the resistor aggregate 703 is punched. By punching the resistor aggregate 703, the curved surfaces 15 of the first electrode 1 or the curved surfaces 25 of the second electrode 2 may be formed.

As shown in FIG. 16, at the same time as the step of punching the resistor aggregate 703 is performed, the step of bending the conductive elongated boards 711 is performed. In this embodiment, each conductive elongated board 711 is bent so that portions of the first electrode 1 and the second electrode 2 which are relatively close to the resistor portion 3 are shifted toward the direction Z1, or the direction in which the high energy beam 881 travels, from a portion of the first electrode 1 or the second electrode 2 which is relatively far from the resistor portion 3. In this way, a plurality of chip resistors 101 are manufactured.

The advantages of the above-noted embodiment are described below.

According to the embodiment, the resistor aggregate 703 is formed by bonding the resistive member 702 to at least three conductive elongated boards 711. With this arrangement, the number of chip resistors 101 obtained per unit length in the direction Y shown in FIG. 14 increases. In this embodiment, the resistor aggregate 703 is collectively divided by punching into a plurality of chip resistor 101. Thus, it is not necessary to successively cut chip resistors 101. This enhances the manufacturing efficiency of the chip resistors 101. Thus, the method according to this embodiment is suitable for efficiently manufacturing the chip resistor 101.

Since the chip resistor 101 is manufactured by punching, the dimensional accuracy of the chip resistor 101 as viewed in plan is determined by the dimensional accuracy of the punching dies 831, 832. Accordingly, the dimensional accuracy of the resistor portion 3 of the chip resistor 101 in the direction Y is also determined by the dimensional accuracy of the punching dies 831, 832. Thus, according to the method of this embodiment, by selecting punching dies 831, 832 of a desired dimensional accuracy before punching the resistor aggregate 703, the dimensional error in the direction Y of the resistor portions is reduced as compared with the conventional method of successively cutting the strips. When the dimensional error in the direction Y of the resistor portions 3 is reduced, a larger number of resistor portions 3 having a desired resistance are obtained, whereby a larger number of chip resistors 101 having a desired resistance are obtained. When the chip resistor 101 has a desired resistance, the trimming process for adjusting the resistance of the chip resistor 101 does not need to be performed. In this way, the number of chip resistors 101 which require trimming process reduces. This leads to enhancement of the manufacturing efficiency of the chip resistor 101.

In this embodiment, a lead frame is used as the electrically conductive member 701, and a resistive frame is used as the resistive member 702. Thus, it is not necessary to individually hold a plurality of conductive elongated boards 711 or a plurality of resistive elongated boards 721, which facilitates handling.

Unlike the conventional method for manufacturing a chip resistor, this embodiment does not use a reel. Thus, the work of winding a strip of a resistive material or electrically conductive material around a reel is not necessary. Thus, the use of a large apparatus for winding a strip around a reel is also unnecessary. Since pulling the strip out of the reel is not necessary, the use of a large apparatus for pulling the strip out of the reel is also unnecessary.

When a reel is used to manufacture a chip resistor, the entire production line is stopped if a trouble happens at some point of a strip. Since this embodiment does not use a reel, such a problem does not occur.

When electron beam is used as high energy beam 881 to bond the conductive elongated boards 711 and the resistive elongated boards 721 to each other, the conductive elongated boards 711 and the resistive elongated boards 721 need to be placed in a vacuum chamber. In this embodiment, the dimension of each conductive elongated board 711 or resistive elongated board 721 in the direction Y is about 100 mm. Thus, such a work as cutting the conductive elongated boards 711 or resistive elongated boards 721 for housing in a vacuum chamber is not necessary. Thus, the method of this embodiment is suitable for efficiently manufacturing the chip resistors 101.

In this embodiment, the high energy beam 881 is directed along the direction Z1. According to this arrangement, the energy of the high energy beam is absorbed relatively easily by portions on the direction Z2 side of the conductive elongated board 711 and the resistive elongated board 721, so that these portions melt relatively easily. As a result, the wide portion 43 exposed to the direction Z2 is formed in the first intermediate layer 4 of the chip resistor 101. Burrs may be formed on the surface of the wide portion 43. In this embodiment, each of the conductive elongated board 711 is bent so that the portion of the first electrode 1 or the second electrode 2 which is close to the resistor portion 3 is deviated toward the direction Z1 side from the portion of the first electrode 1 or the second electrode 2 which is distant from the resistor portion 3. According to this arrangement, even when burrs are formed on the surface of the wide portion 43, the burrs are in the recessed portion of the chip resistor 101 and not on the direction z1 side of the chip resistor 101. Thus, when the chip resistor 101 is held by a holder (not shown) for movement, the holder does not come into contact with the burrs. This allows the chip resistor 101 to be moved stably.

Figure 17:
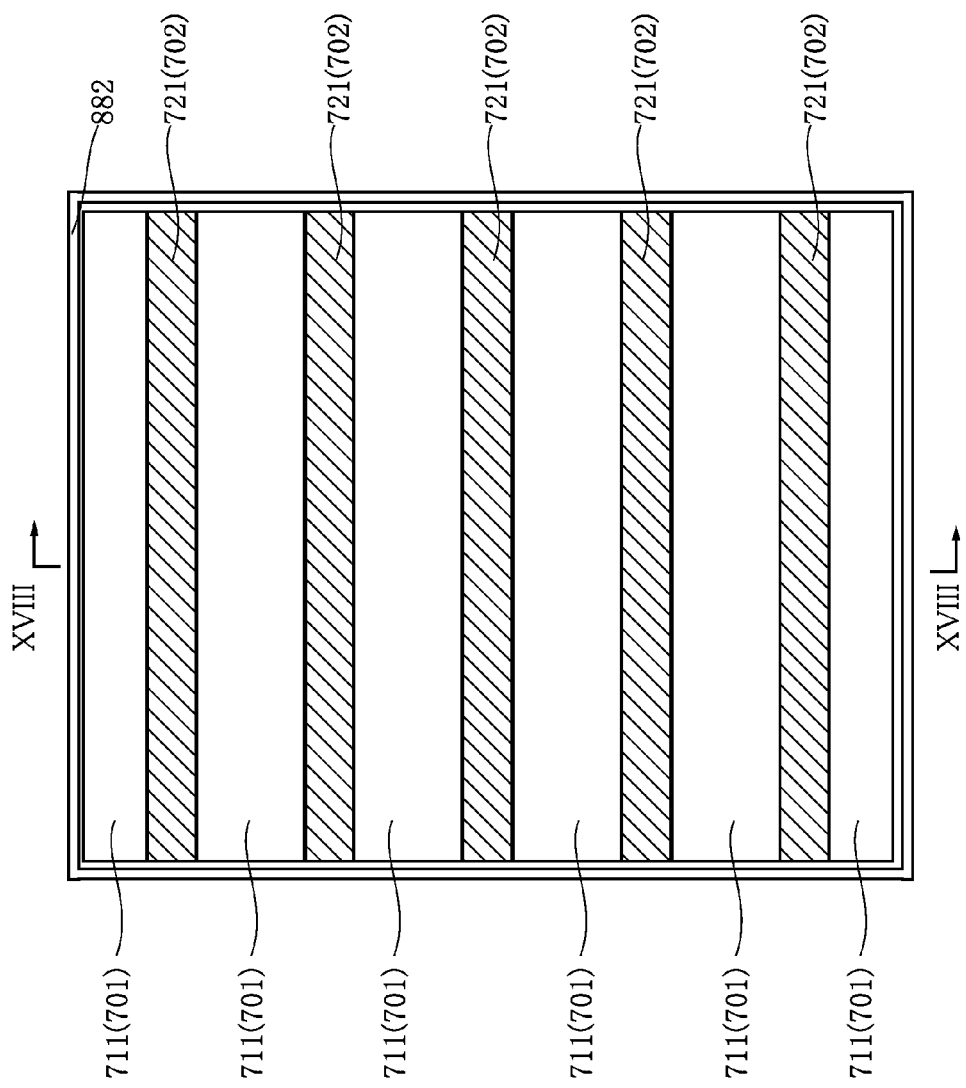
FIG. 17 is a plan view of a step of a variation of a method for manufacturing the chip resistor according to the first embodiment of the present invention.
Figure 18:
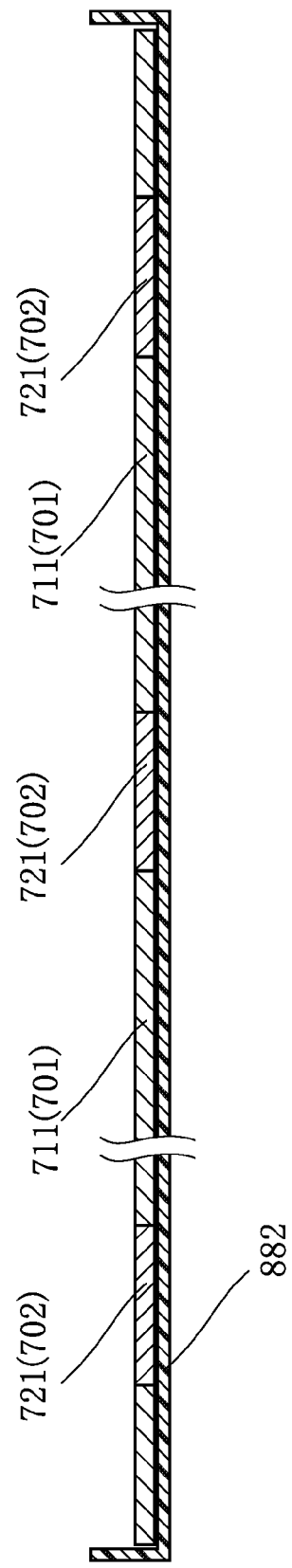
FIG. 18 is a sectional view taken along lines XVIII-XVIII in FIG. 17.

Unlike this embodiment, the lead frame may not be used. As shown in FIGS. 17 and 18, as the electrically conductive member 701, a plurality of conductive elongated boards 711 separate from each other may be placed on a pallet 882. Similarly, as the resistive member 702, the resistive frame may not be used. As shown in FIGS. 17 and 18, resistive elongated boards 721 may be placed between the conductive elongated boards 711 on the pallet 882. Then, after the conductive elongated boards 711 and the resistive elongated boards 721 are placed on the pallet 882, the conductive elongated boards 711 and the resistive elongated boards 721 are bonded to each other.

Other embodiments of the present invention are described below. In the figures referred to in these embodiments, the elements that are identical or similar to those of the foregoing embodiment are designated by the same reference signs as those used for the foregoing embodiment.

The second embodiment of the present invention is described below.

Figure 19:
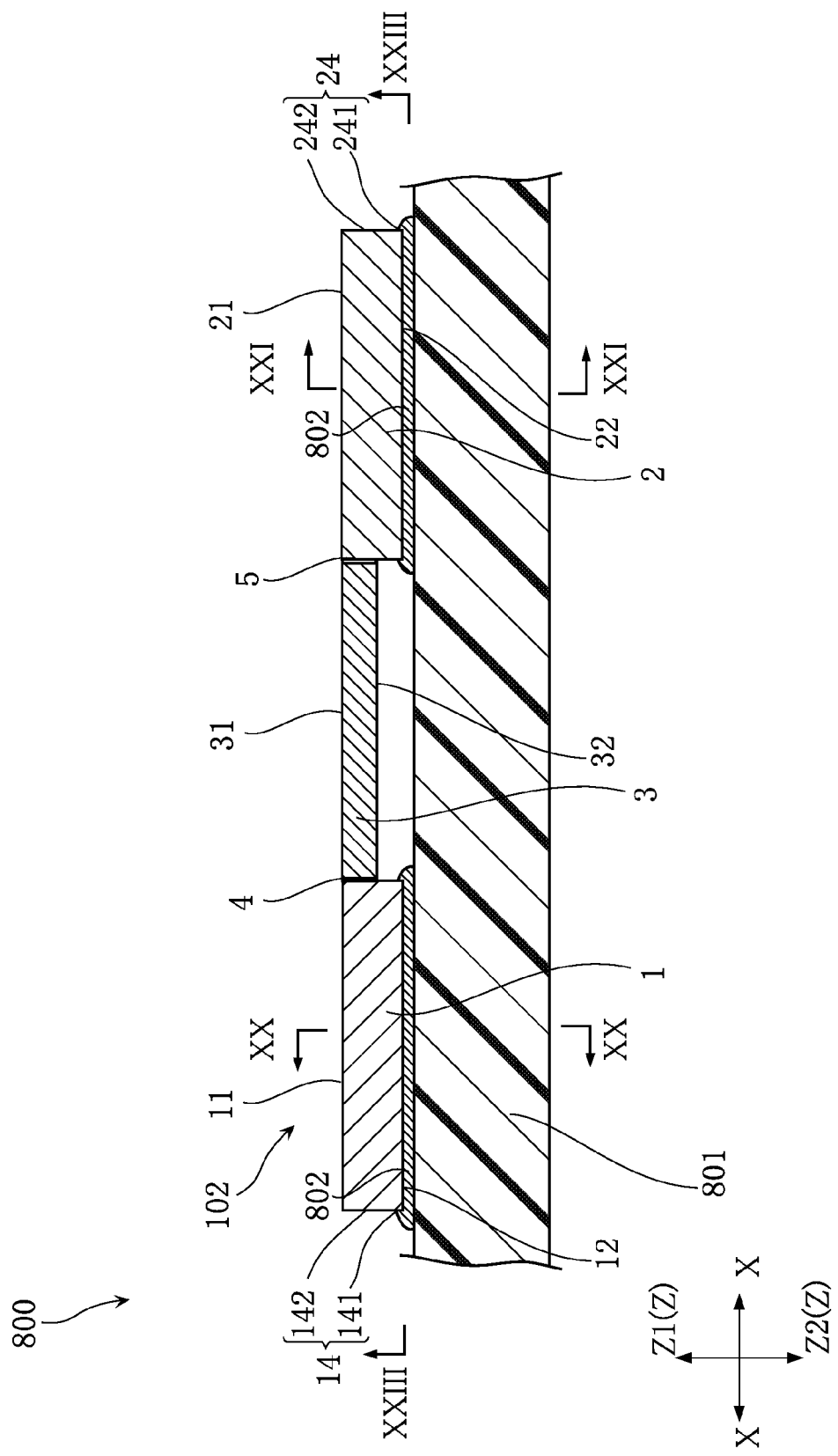
FIG. 19 is a sectional view of a mount structure of a chip resistor according to a second embodiment of the present invention.
Figure 20:
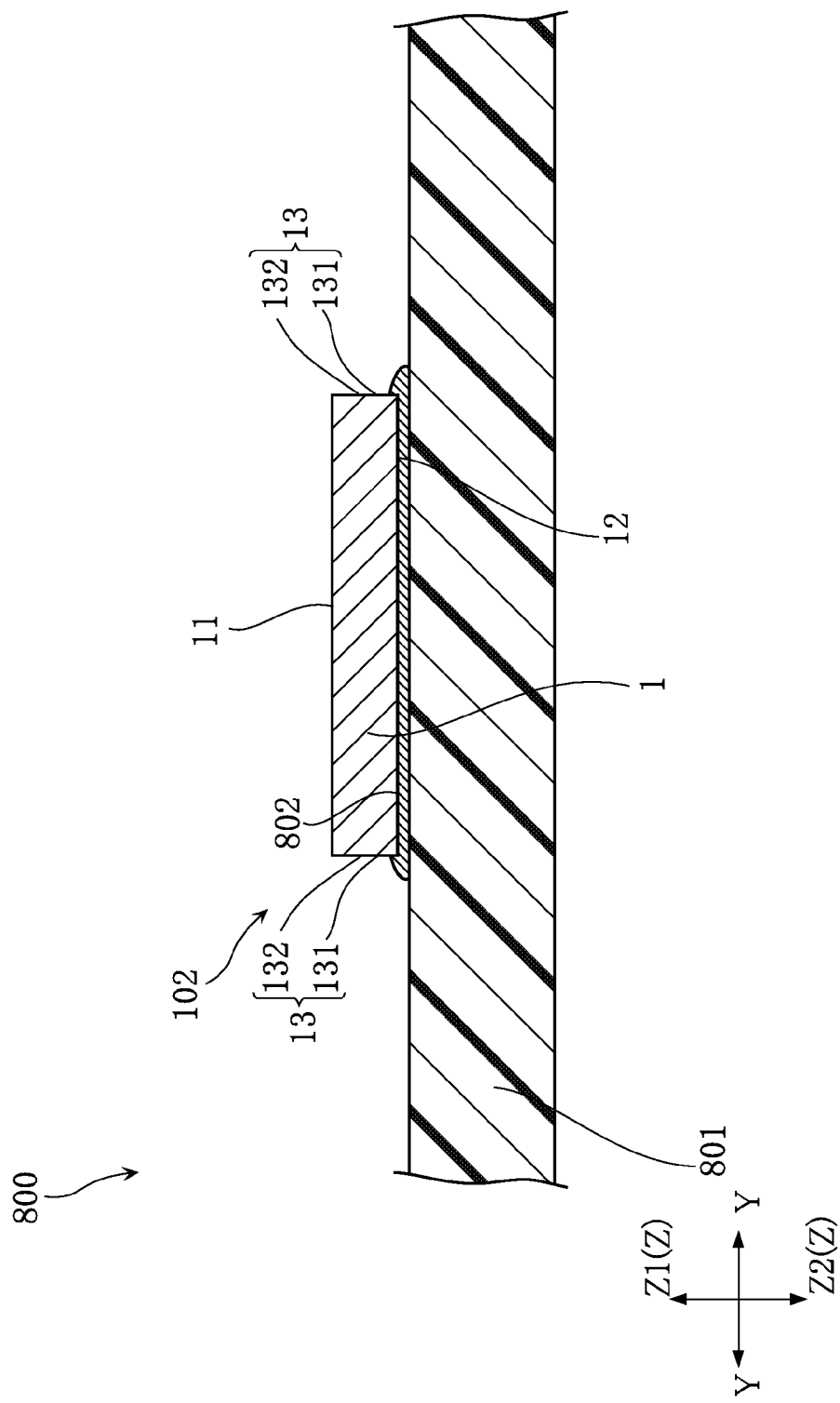
FIG. 20 is a sectional view taken along lines XX-XX in FIG. 19.
Figure 21:
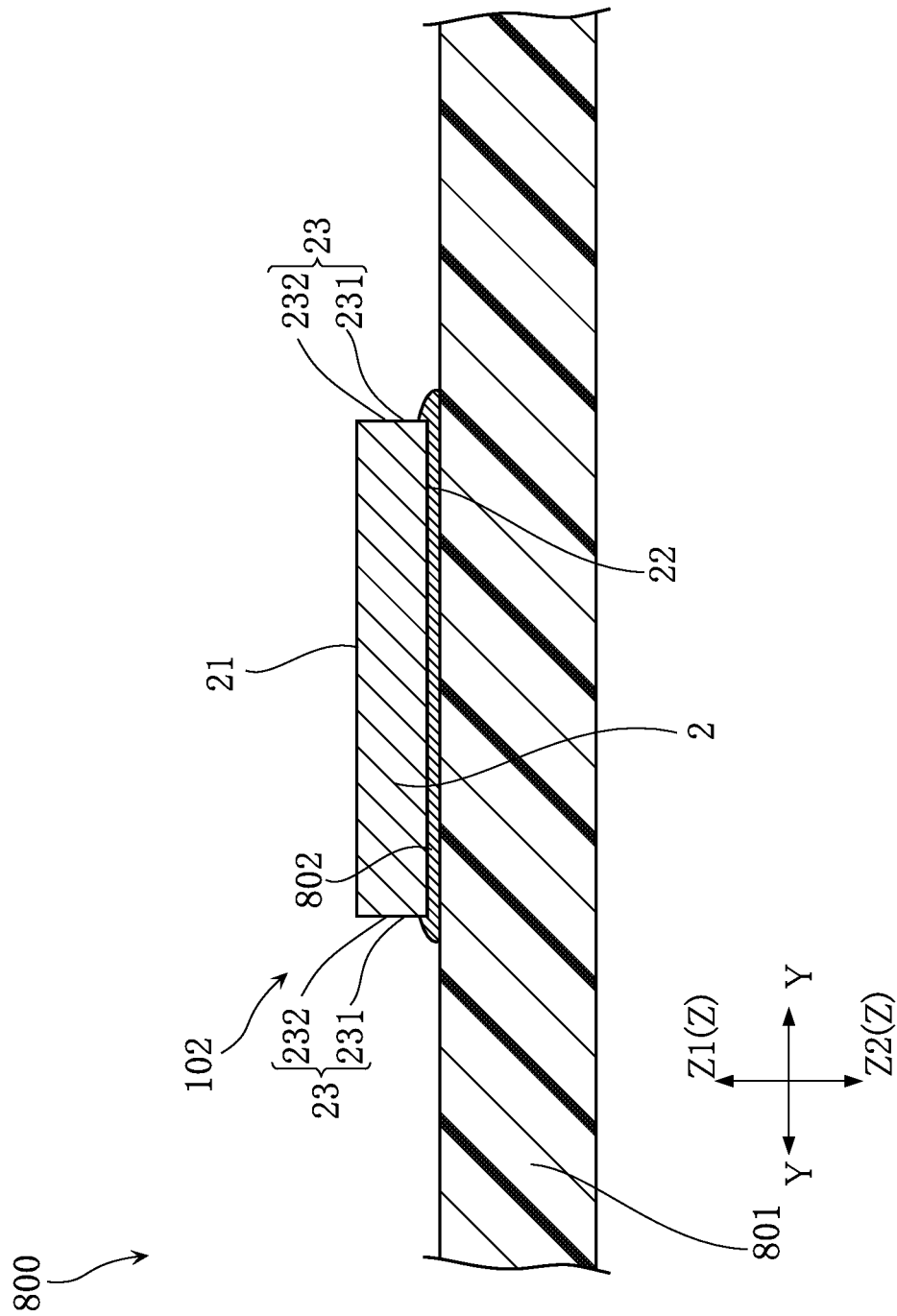
FIG. 21 is a sectional view taken along lines XXI-XXI in FIG. 19.
Figure 22:
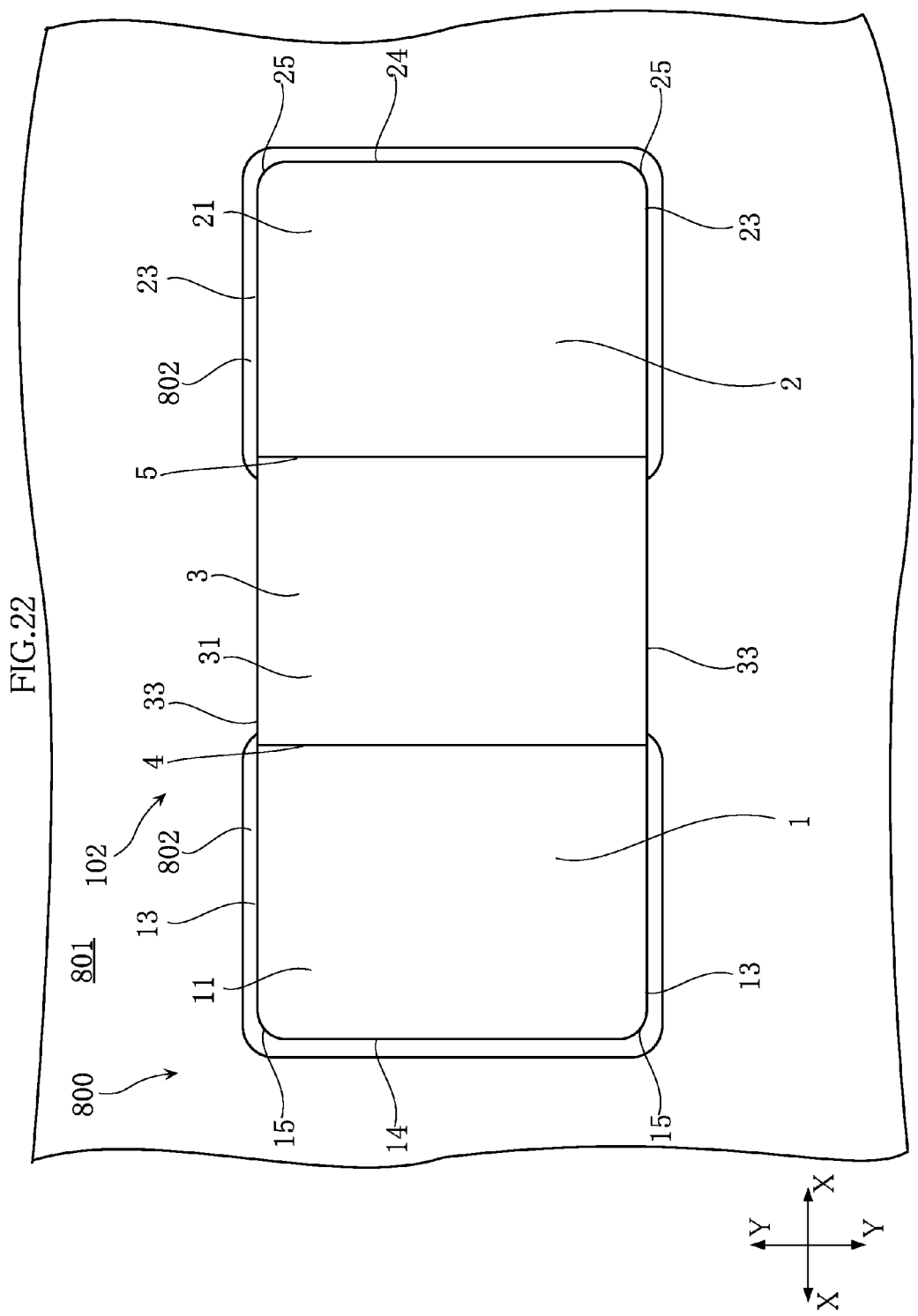
FIG. 22 is a plan view of the chip resistor mount structure shown in FIG. 19.
Figure 23:
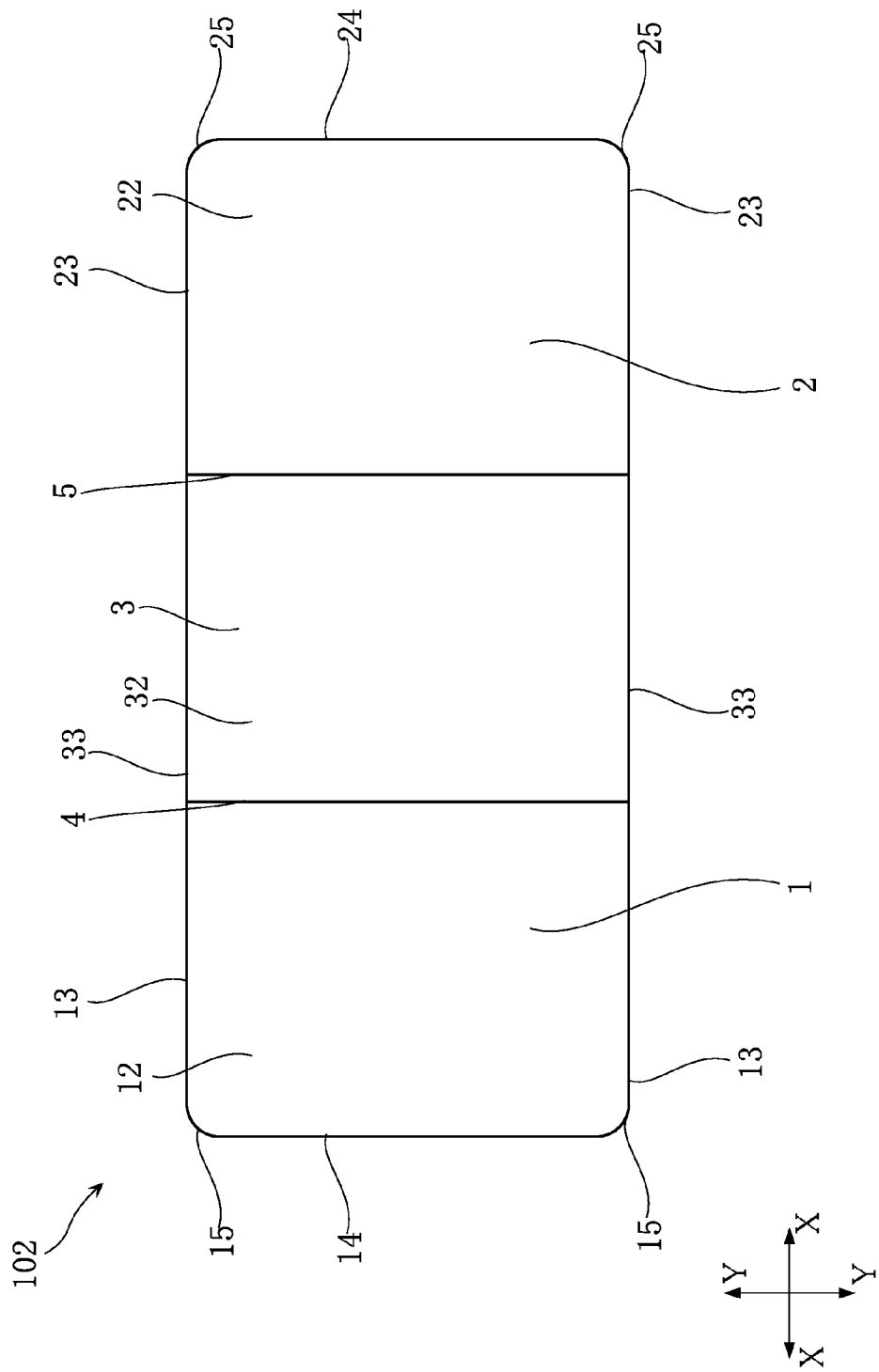
FIG. 23 is a view (partially omitted) along lines XXIII-XXIII in FIG. 19.

FIG. 19 is a sectional view of a chip resistor mount structure of this embodiment. FIG. 20 is a sectional view taken along lines XX-XX in FIG. 19. FIG. 21 is a sectional view taken along lines XXI-XXI in FIG. 19. FIG. 22 is a plan view of the chip resistor mount structure shown in FIG. 19. FIG. 23 is a view (partially omitted) along the XXIII-XXIII in FIG. 19.

The chip resistor 102 shown in these figures differs from the chip resistor 101 mainly in that the thicknesses (dimension in the direction Z) of the first electrode 1 and the second electrode 2 are larger than the thickness (dimension in the direction Z) of the resistor portion 3. The first electrode 1 and the second electrode 2 of the chip resistor 102 are in the form of a plane extending along X-Y plane. Neither the first electrode 1 nor the second electrode 2 includes an inclined portion.

The method for manufacturing the chip resistor 102 is the same as the method for manufacturing the chip resistor 101 except that the thickness of the conductive elongated boards 711 (see FIG. 9) of the electrically conductive member 701 is larger than the thickness of the resistive elongated boards 721 (see FIG. 11) of the resistive member 702. Thus, the explanation is omitted. In the method for manufacturing the chip resistor 102, the step of bending the conductive elongated boards 711 is not performed.

For the same reasons as those described in the first embodiment, the chip resistor 102 of this embodiment is also suitable for enhancing the manufacturing efficiency.

In manufacturing the chip resistor 102 of this embodiment, a lead frame is used as the electrically conductive member 701, and a resistive frame is used as the resistive member 702. Thus, it is not necessary to individually hold a plurality of conductive elongated boards 711 or a plurality of resistive elongated boards 721, which facilitates handling.

Unlike the conventional method for manufacturing a chip resistor, this embodiment does not use a reel. Thus, the work of winding a strip of a resistive material or electrically conductive material around a reel is not necessary. Thus, the use of a large apparatus for winding a strip around a reel is also unnecessary. Since pulling the strip out of the reel is not necessary, the use of a large apparatus for pulling the strip out of the reel is also unnecessary.

When a reel is used to manufacture a chip resistor, the entire production line is stopped if a trouble happens at some point of a strip. Since this embodiment does not use a reel, such a problem does not occur.

In manufacturing the chip resistor 102 of this embodiment, such a work as cutting the conductive elongated boards 711 or resistive elongated boards 721 for housing in a vacuum chamber is not necessary. Thus, the method of this embodiment is suitable for efficiently manufacturing the chip resistors 102.

The third embodiment of the present invention is described below.

Figure 24:
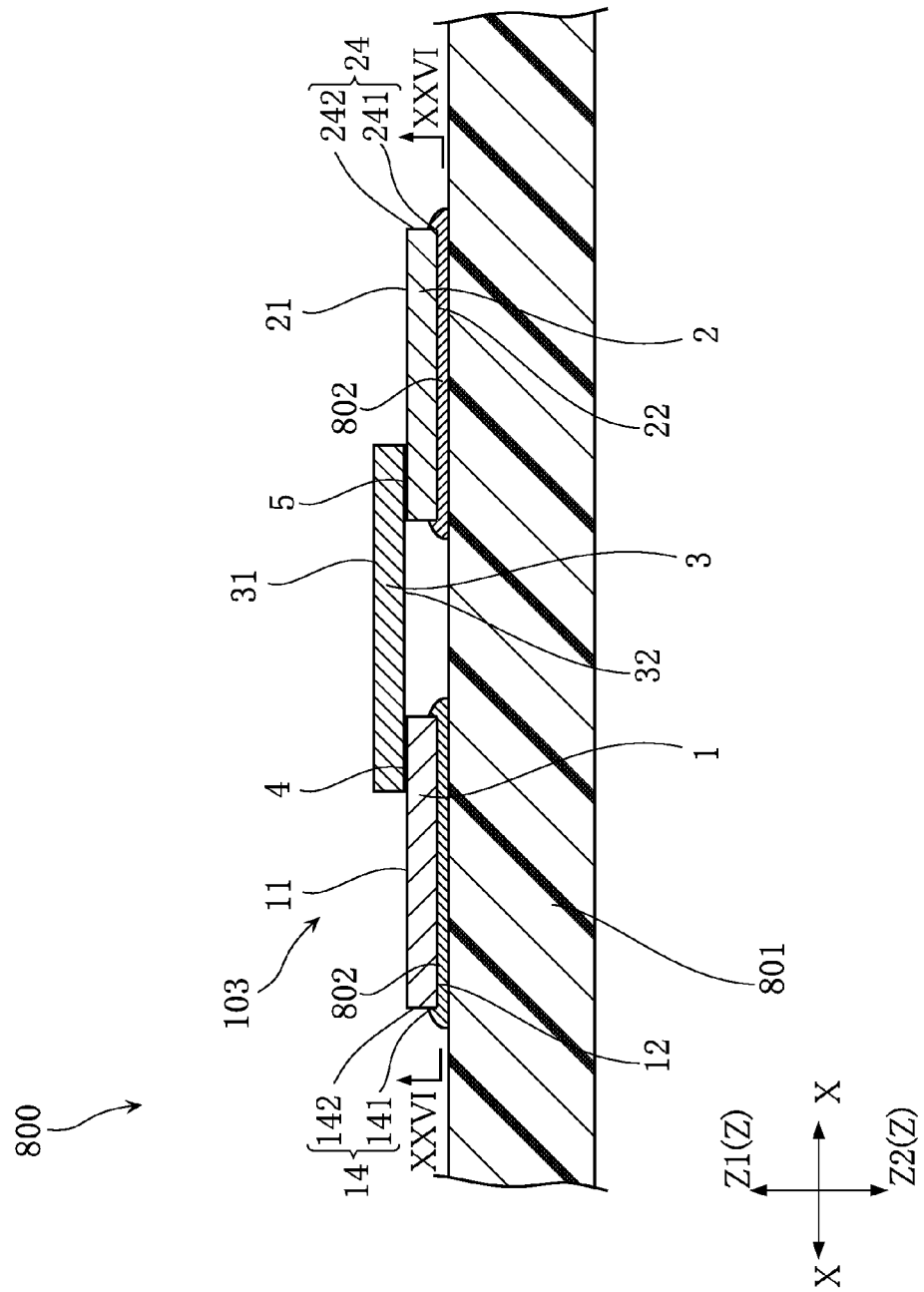
FIG. 24 is a sectional view of a mount structure of a chip resistor according to a third embodiment of the present invention.
Figure 25:
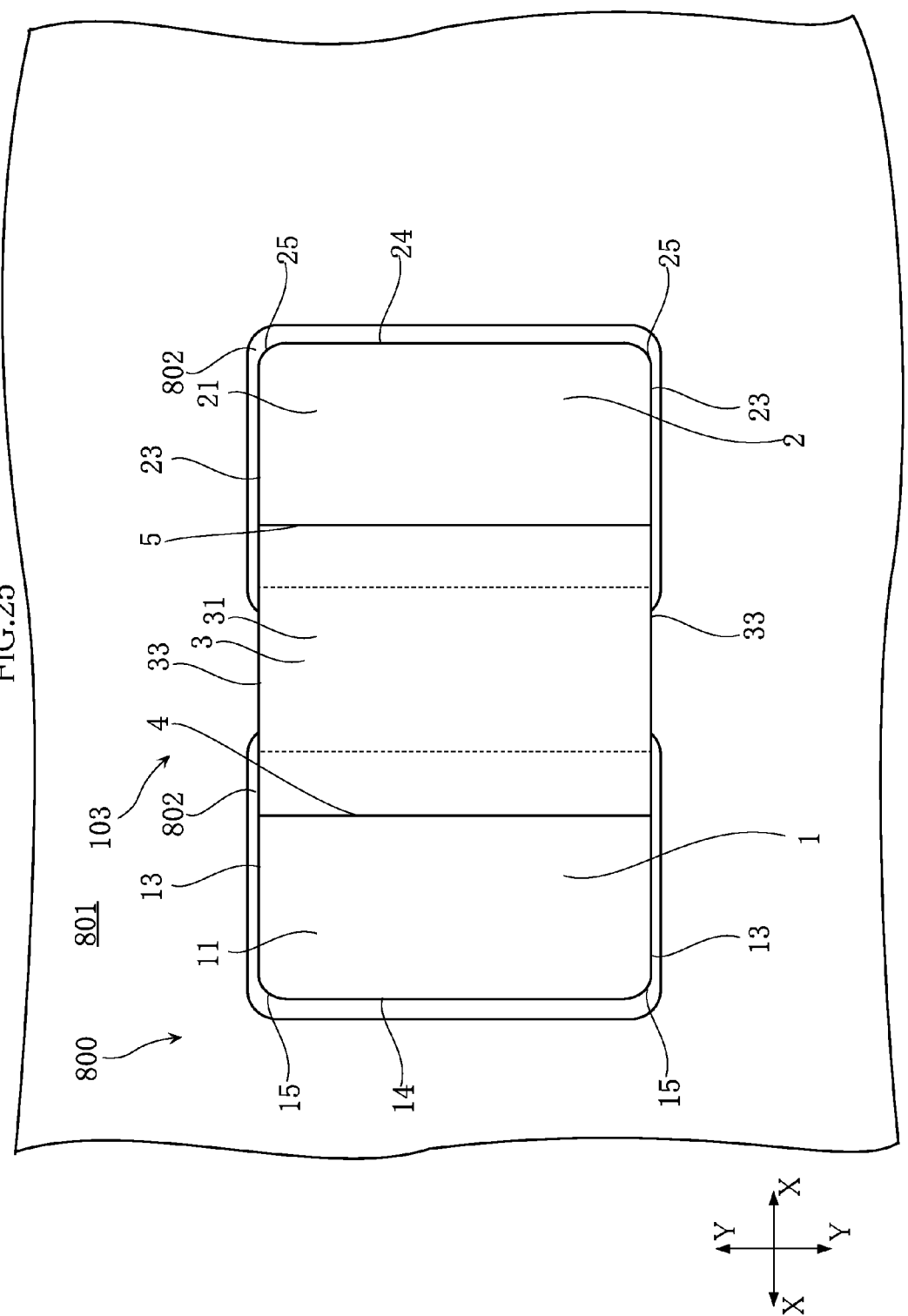
FIG. 25 is a plan view of the chip resistor mount structure shown in FIG. 24.
Figure 26:
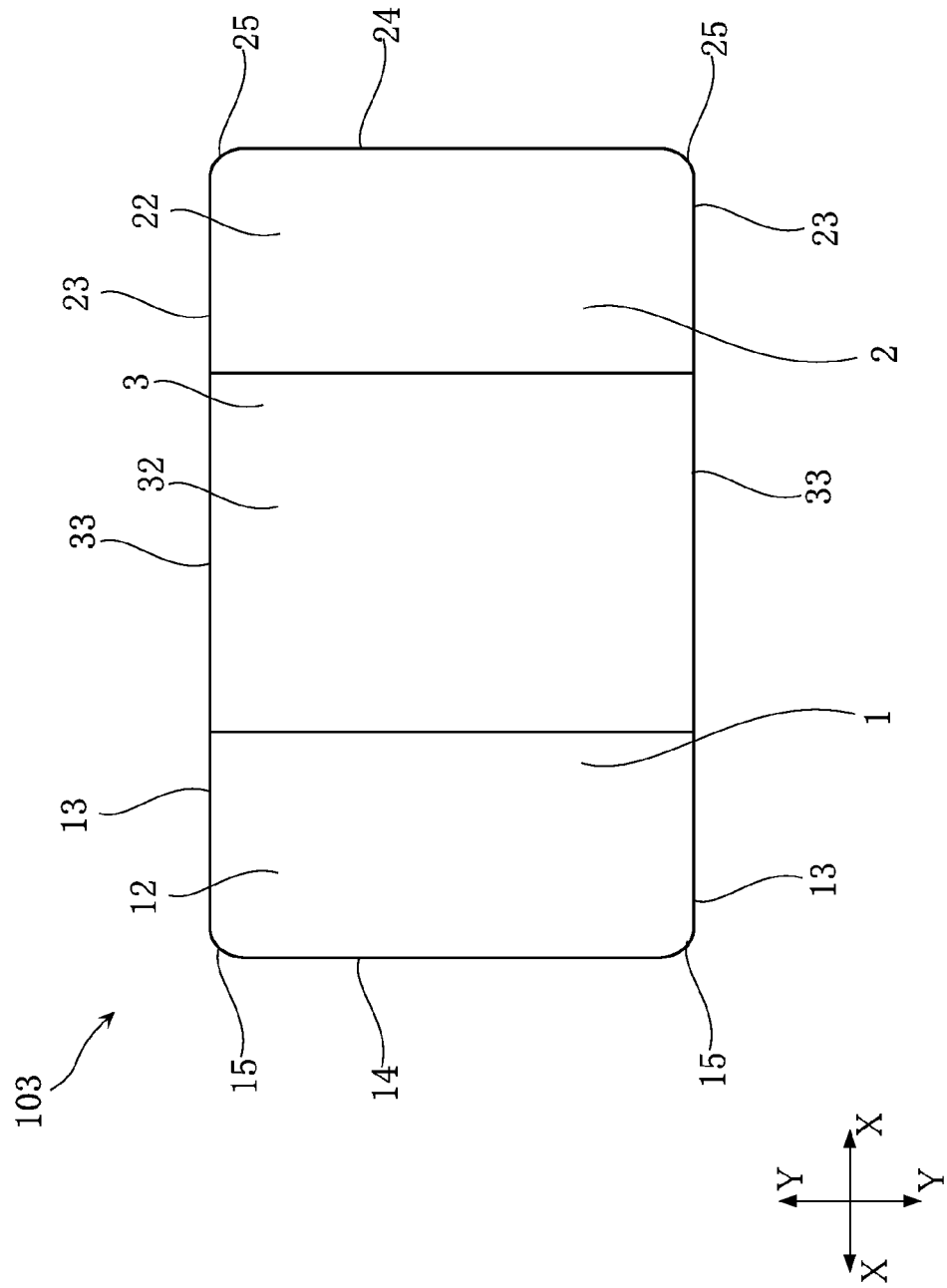
FIG. 26 is a view (partially omitted) along lines XXVI-XXVI in FIG. 24.

FIG. 24 is a sectional view of a mount structure of the chip resistor according to this embodiment. FIG. 25 is a plan view of the chip resistor mount structure shown in FIG. 24. FIG. 26 is a view (partially omitted) along lines XXVI-XXVI in FIG. 24.

The chip resistor 103 shown in these figures differs from the chip resistor 102 of the second embodiment in that the first electrode 1 and the second electrode 2 are on the same side of the resistor portion 3. Since other structures are the same, the description is omitted.

A method for manufacturing the chip resistor 103 is described below.

First, an electrically conductive member 701 and a resistive member 702 are prepared, in the same manner as that described with reference to FIGS. 8-11.

Figure 27:
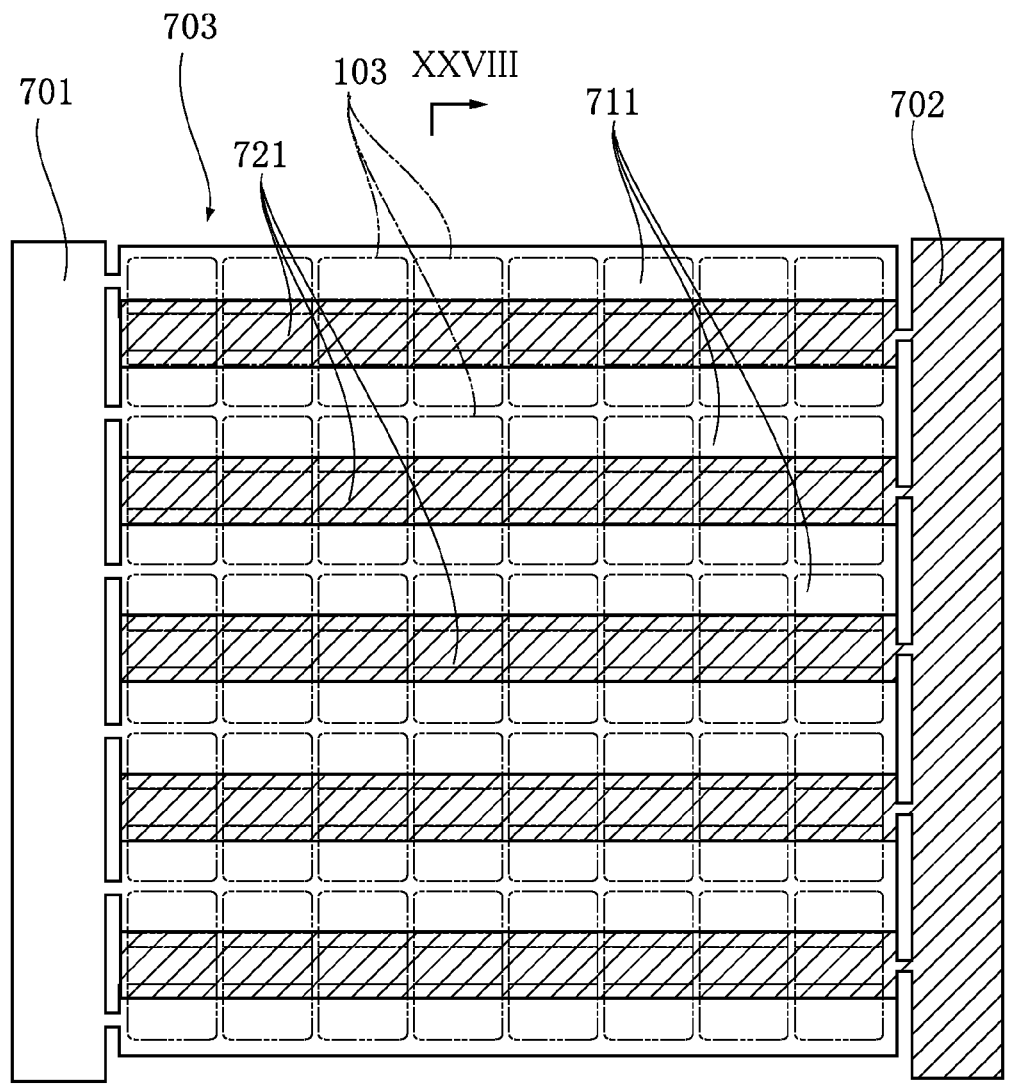
FIG. 27 is a plan view showing a step of a method for manufacturing the chip resistor according to the third embodiment of the present invention.
Figure 28:
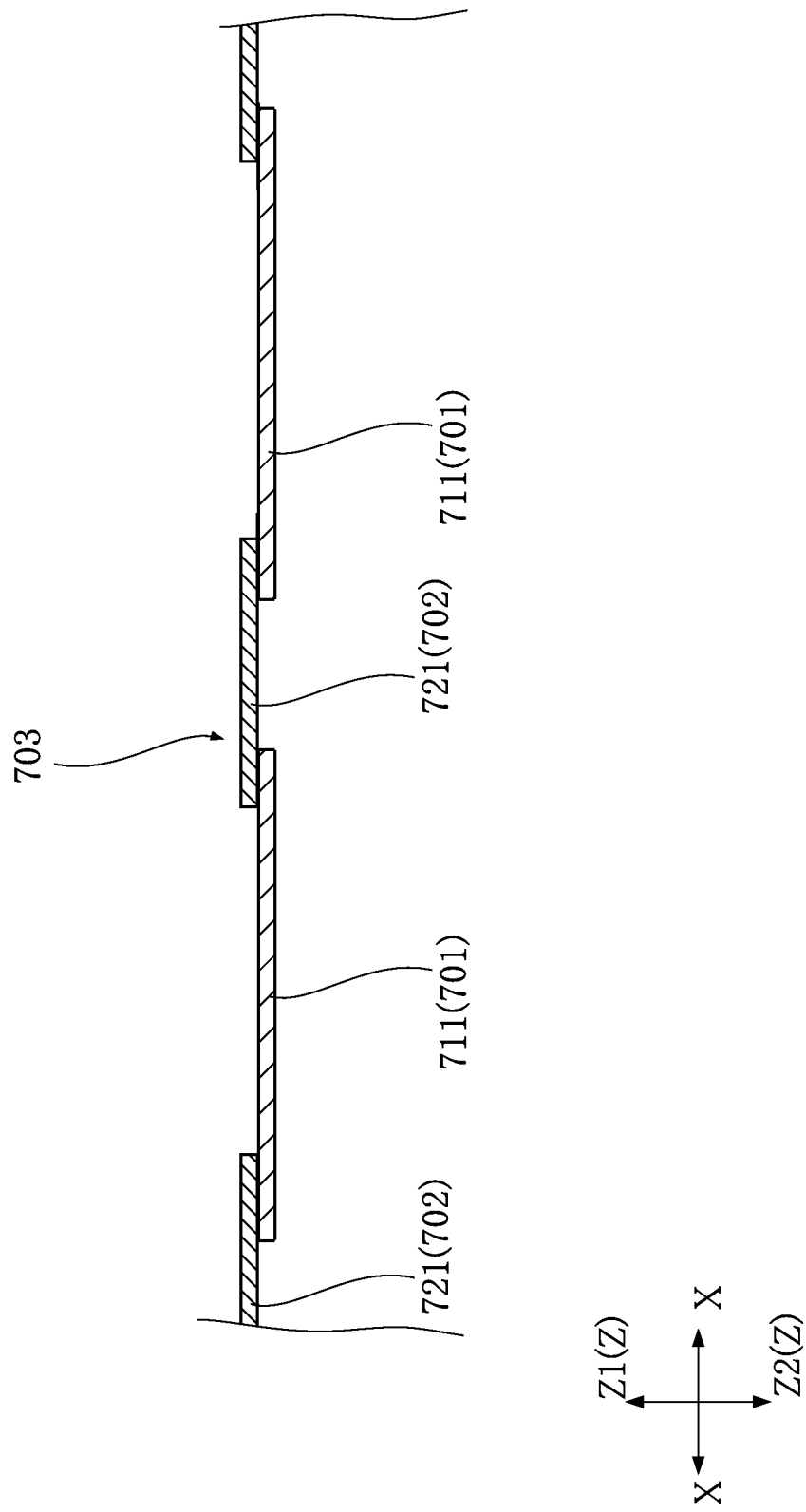
FIG. 28 is a partial sectional view taken along lines XXVIII-XXVIII in FIG. 27.

Then, as shown in FIGS. 27 and 28, a resistor aggregate 703 is formed. To form a resistor aggregate 703, the resistive member 702 is bonded to at least three conductive elongated boards 711 of the electrically conductive member 701. In this embodiment, each of a plurality of resistive elongated boards 721 is bonded to adjacent two of at least three conductive elongated boards 711. In this process, each of the resistive elongated boards 721 is arranged to overlap both of the adjacent two of the at least three conductive elongated boards 711 as viewed in the direction Z.

After the resistor aggregate 703 is formed, the above-described step of punching the resistor aggregate 703 is performed, whereby the chip resistor 103 is obtained. In the method for manufacturing the chip resistor 103 as well, the step of bending the conductive elongated boards 711 is not performed.

For the same reasons as those described in the first embodiment, the chip resistor 102 of this embodiment is also suitable for enhancing the manufacturing efficiency.

In manufacturing the chip resistor 103 of this embodiment, a lead frame is used as the electrically conductive member 701, and a resistive frame is used as the resistive member 702. Thus, it is not necessary to individually hold a plurality of conductive elongated boards 711 or a plurality of resistive elongated boards 721, which facilitates handling.

Unlike the conventional method for manufacturing a chip resistor, this embodiment does not use a reel. Thus, the work of winding a strip of a resistive material or electrically conductive material around a reel is not necessary. Thus, the use of a large apparatus for winding a strip around a reel is also unnecessary. Since pulling the strip out of the reel is not necessary, the use of a large apparatus for pulling the strip out of the reel is also unnecessary.

When a reel is used to manufacture a chip resistor, the entire production line is stopped if a trouble happens at some point of a strip. Since this embodiment does not use a reel, such a problem does not occur.

In manufacturing the chip resistor 103 of this embodiment, such a work as cutting the conductive elongated boards 711 or resistive elongated boards 721 for housing in a vacuum chamber is not necessary. Thus, the method of this embodiment is suitable for efficiently manufacturing the chip resistors 103.

When current flows through the chip resistor 103, the portion of the resistor portion 3 which overlaps the gap between the first electrode 1 and the second electrode 2 as viewed in plan (viewed in the direction Z) functions as a resistor. Thus, the resistance of the chip resistor 103 is determined by the distance between the first electrode 1 and the second electrode 2. Thus, by adjusting the distance between the first electrode 1 and the second electrode 2 in the state of the resistor aggregate 703, the resistance of the chip resistor 103 is finely adjusted to a desired value. Fine adjustment of the resistance of the chip resistor 103 leads to reduction of the number of chip resistors 101 that require the trimming process. This is suitable for enhancing the manufacturing efficiency of the chip resistor 103.

A fourth embodiment of the present invention is described below.

Figure 29:
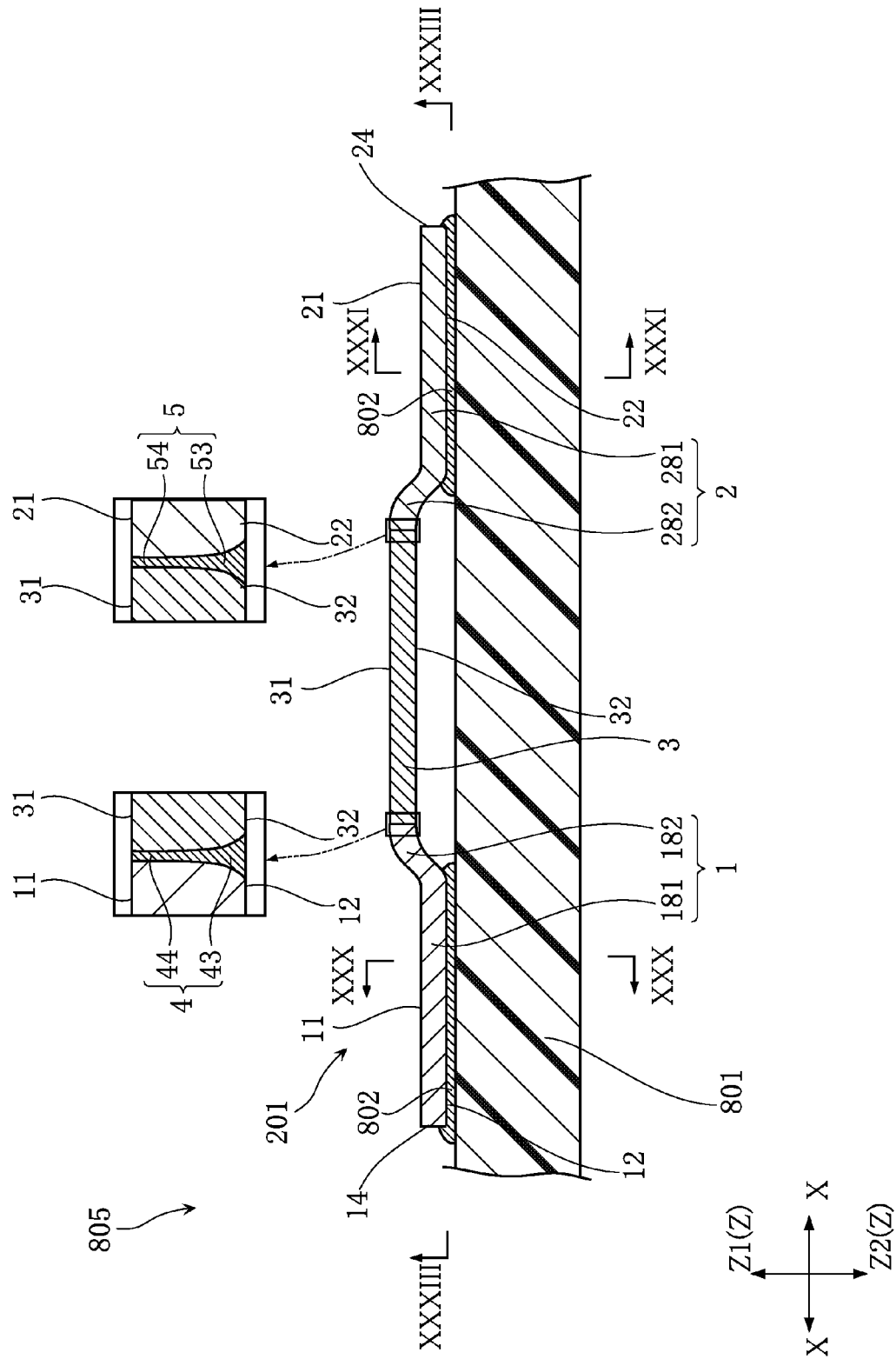
FIG. 29 is a sectional view of a mount structure of a chip resistor according to a fourth embodiment of the present invention.
Figure 30:
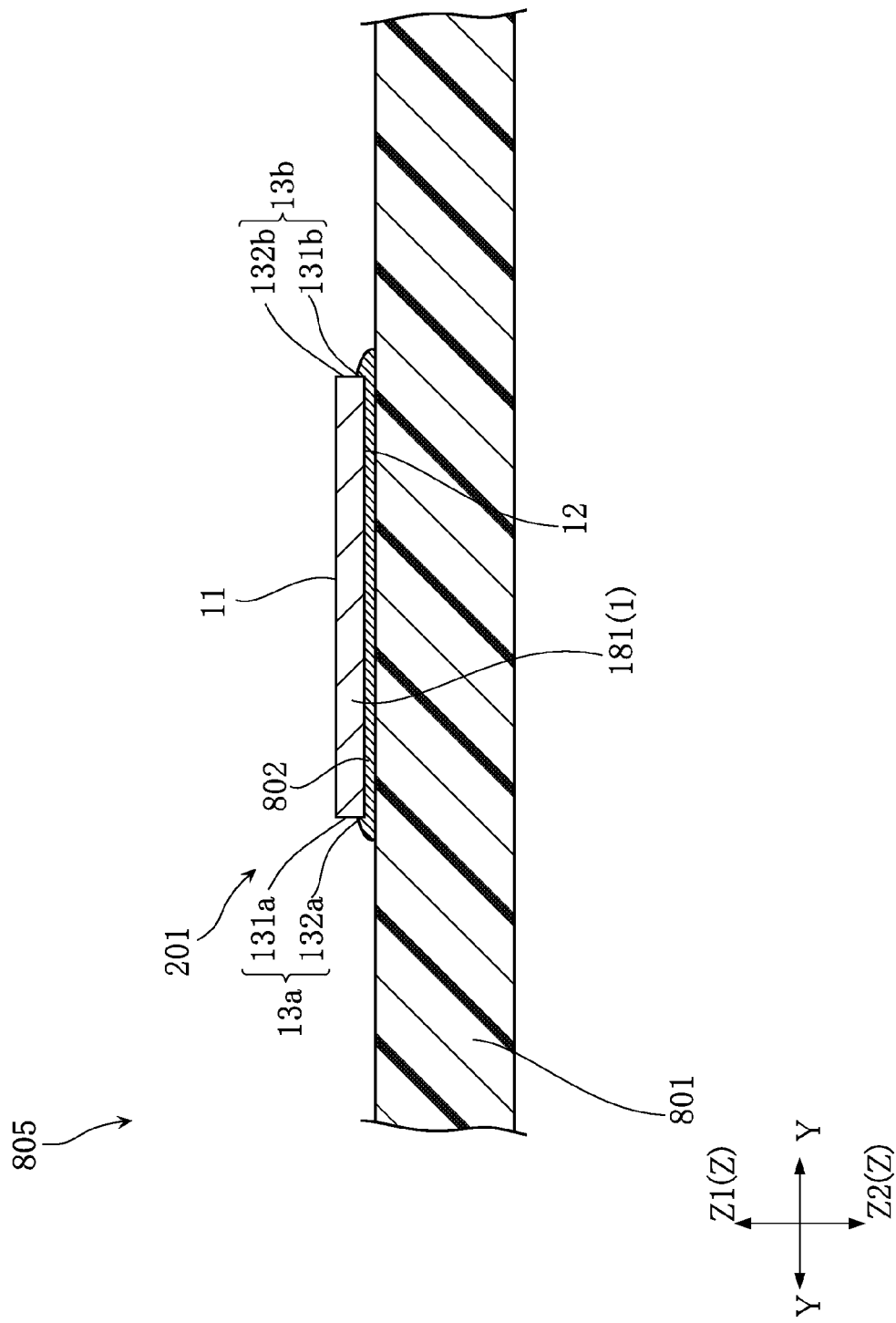
FIG. 30 is a sectional view taken along lines XXX-XXX in FIG. 29.
Figure 31:
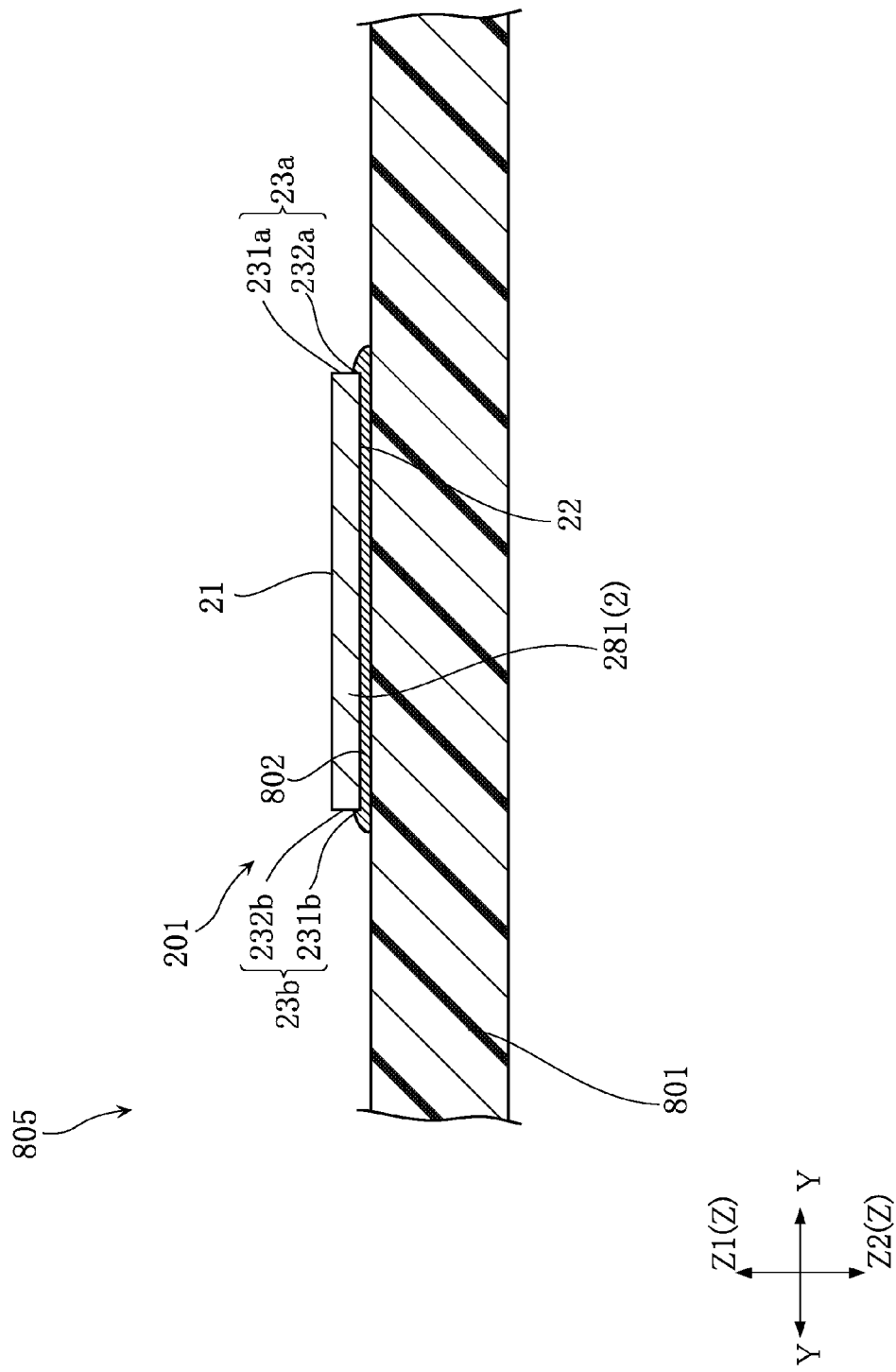
FIG. 31 is a sectional view taken along lines XXXI-XXXI in FIG. 29.
Figure 32:
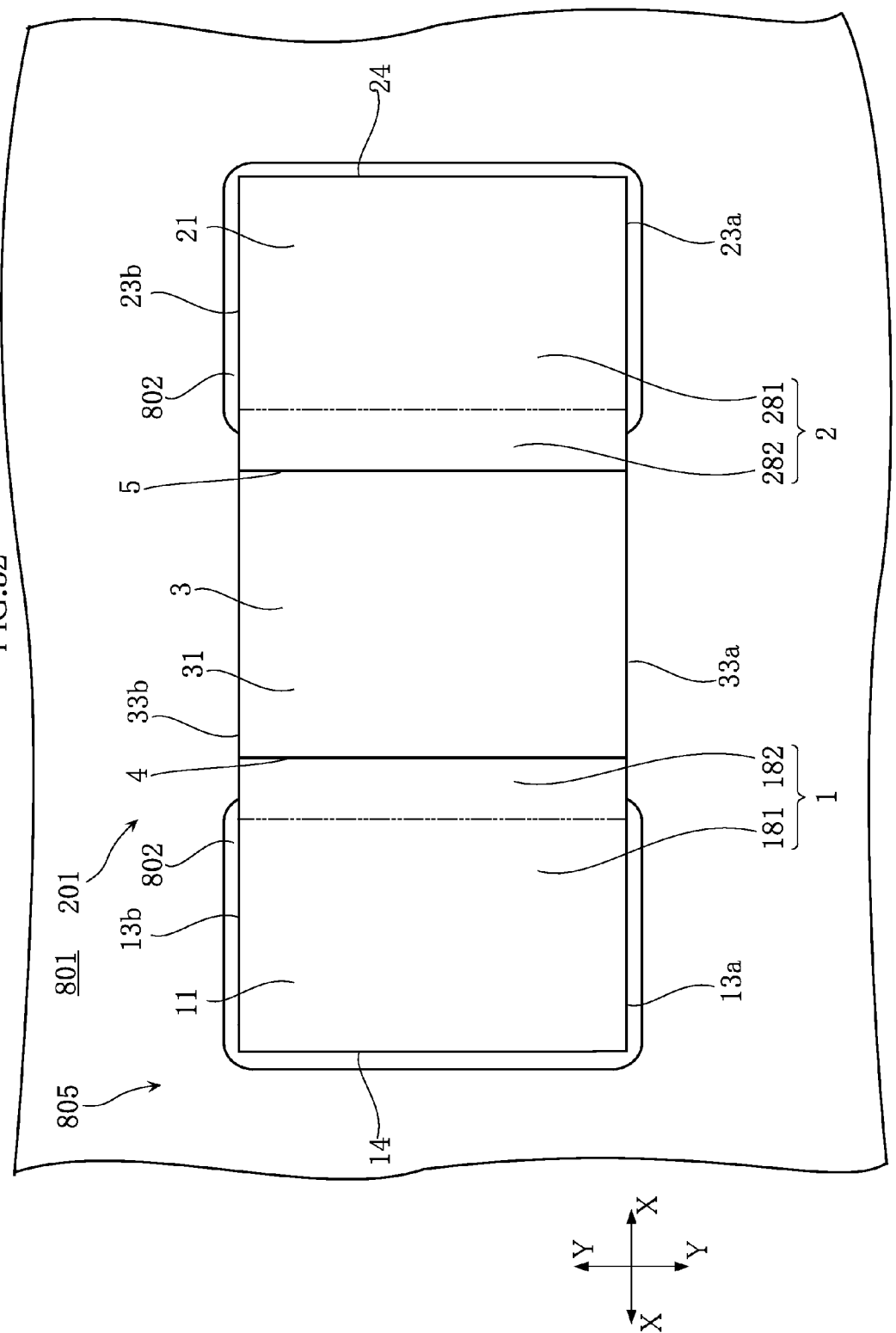
FIG. 32 is a plan view of the chip resistor mount structure shown in FIG. 29.
Figure 33:
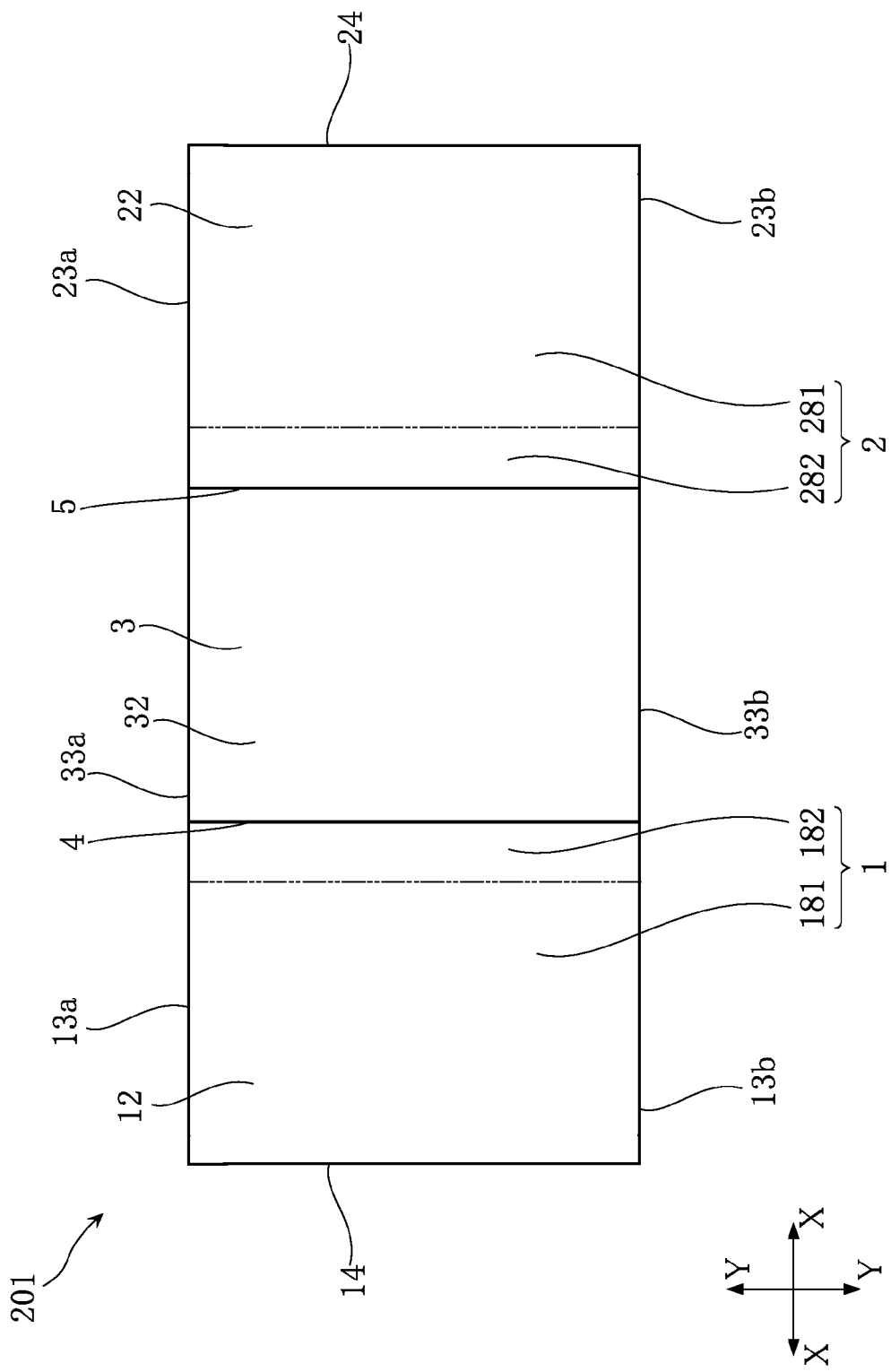
FIG. 33 is a view (partially omitted) along lines XXXIII-XXXIII in FIG. 29.

FIG. 29 is a sectional view of a mount structure of the chip resistor according to the fourth embodiment of the present invention. FIG. 30 is a sectional view taken along lines XXX-XXX in FIG. 29. FIG. 31 is a sectional view taken along lines XXXI-XXXI in FIG. 29. FIG. 32 is a plan view of the chip resistor mount structure shown in FIG. 29. FIG. 33 is a view (partially omitted) along lines XXXIII-XXXIII in FIG. 29.

The chip resistor mount structure 805 shown in these figures includes a chip resistor 201, a mount board 801 and a solder layer 802.

For instance, the mount board 801 is a printed circuit board. For instance, the mount board 801 includes an insulating substrate and a pattern electrode (not shown) formed on the insulating substrate. The chip resistor 301 is mounted on the mount board 801. The solder layer 802 is between the chip resistor 201 and the mount board 801. The solder layer 802 bonds the chip resistor 201 and the mount board 801 to each other.

The chip resistor 201 includes a first electrode 1, a second electrode 2, a resistor portion 3, a first intermediate layer 4 and a second intermediate layer 5.

As shown in FIGS. 32 and 33, the first electrode 1 includes a front surface 11, a reverse surface 12, a side surface 13a (first electrode side surface), a side surface 13b (second electrode side surface) and a side surfaces 14.

The front surface 11 and the reverse surface 12 face away from each other. Specifically, the front surface 11 faces to the direction Z1, whereas the reverse surface 12 faces to the direction Z2. The side surface 13a faces to one side in the direction Y, whereas the side surface 13b faces to the other side in the direction Y. The side surface 14 faces to the direction X. Unlike the chip resistor 101, the first electrode 1 of this embodiment does not have a curved surface 15. Thus, the side surface 14 is directly connected to the side surface 13a and the side surface 13b.

Figure 34:
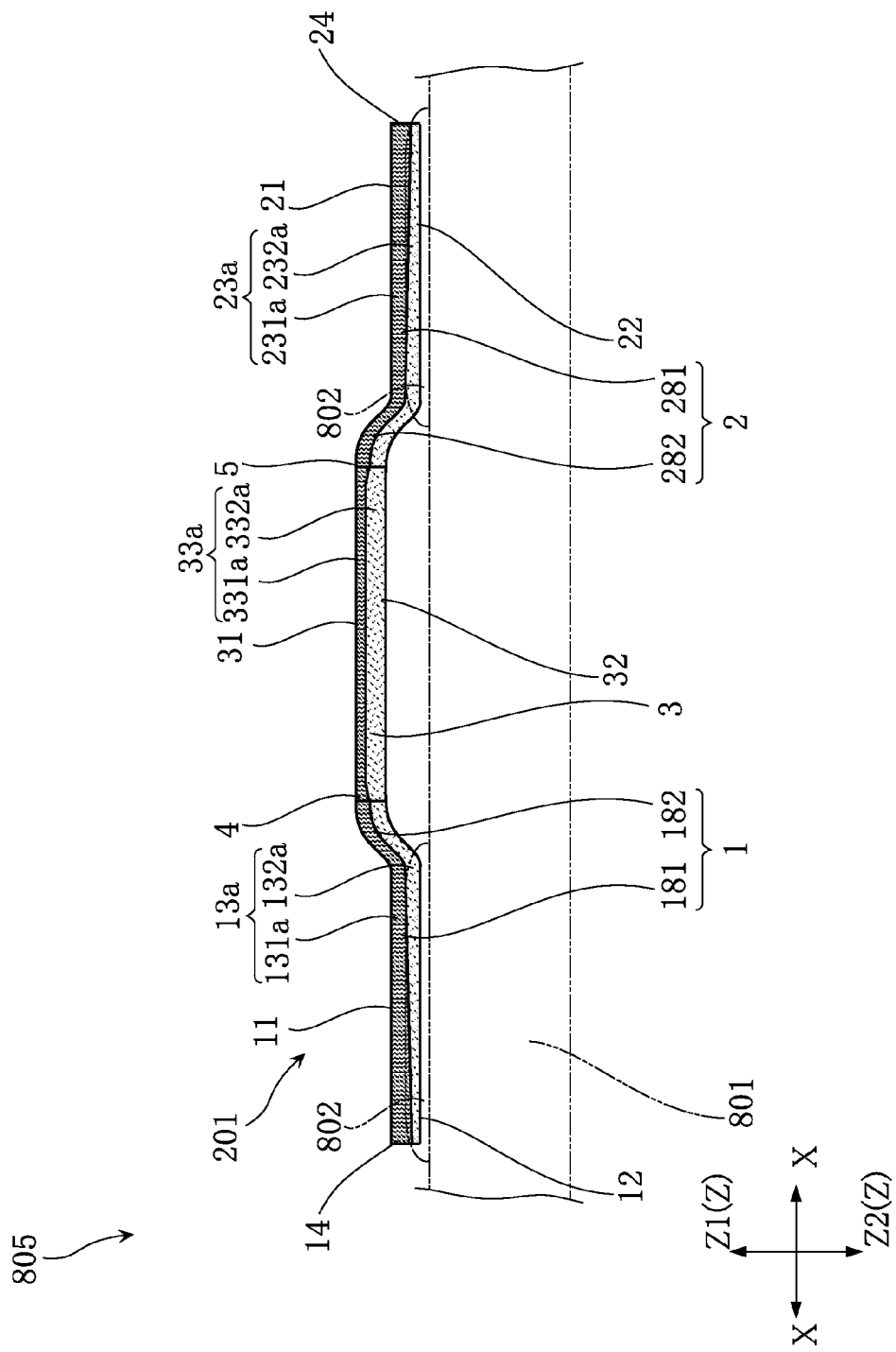
FIG. 34 is a front view of the chip resistor shown in FIG. 29.
Figure 35:
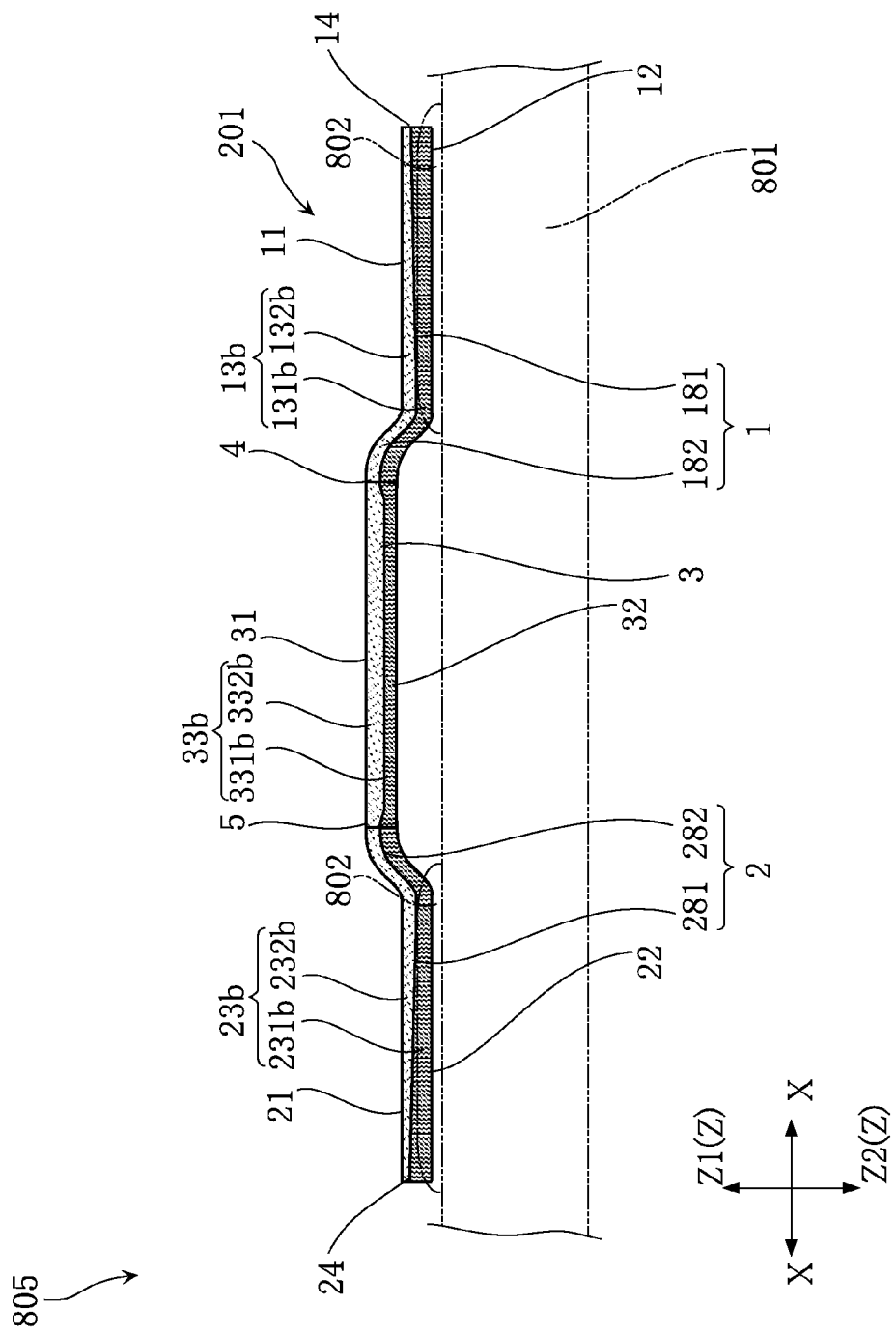
FIG. 35 is a rear view of the chip resistor shown in FIG. 29.

FIG. 34 is a front view of the chip resistor shown in FIG. 29. FIG. 35 is a rear view of the chip resistor shown in FIG. 29.

As shown in FIG. 34, the side surface 13a includes a linear trace formed surface 131a (first electrode linear trace formed surface) and a breakage trace formed surface 132a (first electrode breakage trace formed surface). The breakage trace formed surface 132a is connected to the linear trace formed surface 131a. Since the shapes of the linear trace formed surface 131a and the breakage trace formed surface 132a are the same as those of the linear trace formed surface 131 and the breakage trace formed surface 132 of the chip resistor 101, the description of these is omitted.

In this embodiment, the linear trace formed surface 131a is closer to the front surface 11 than the breakage trace formed surface 132a is. In this embodiment, the width (dimension in the direction Z) of the linear trace formed surface 131a increases as proceeding further away from the resistor portion 3. The linear trace formed surface 131a is connected to the front surface 11. The breakage trace formed surface 132a is connected to the reverse surface 12.

As shown in FIG. 35, the side surface 13b includes a linear trace formed surface 131b (second electrode linear trace formed surface) and a breakage trace formed surface 132b (second electrode breakage trace formed surface). The breakage trace formed surface 132b is connected to the linear trace formed surface 131b. Since the shapes of the linear trace formed surface 131b and the breakage trace formed surface 132b are the same as those of the linear trace formed surface 131 and the breakage trace formed surface 132 of the chip resistor 101, description of these is omitted.

In this embodiment, the linear trace formed surface 131b is closer to the reverse surface 12 than the breakage trace formed surface 132b is. That is, the vertical positional relationship between the breakage trace formed surface and the linear trace formed surface in the side surface 13a is opposite from that in the side surface 13b. The linear trace formed surface 131b is connected to the reverse surface 12. The breakage trace formed surface 132b is connected to the front surface 11. In this embodiment, the width (dimension in the direction Z) of the linear trace formed surface 131b increases as proceeding further away from the resistor portion 3.

The side surface 14 may include the linear trace formed surface 141 and the breakage trace formed surface 142 similarly to the chip resistor 101 or may be a flat surface. The shape or structure of the side surface 14 is determined by how the conductive elongated boards 711, which is described later, are made.

Except the points described above, the first electrode 1 has the same structure as that of the first electrode 1 of the chip resistor 101. Description of the same points is omitted.

As shown in FIGS. 32 and 33, the second electrode 2 includes a front surface 21, a reverse surface 22 and side surfaces 23a, 23b, 24b.

The front surface 21 and the reverse surface 22 face away from each other. Specifically, the front surface 21 faces to the direction Z1, whereas the reverse surface 22 faces to the direction Z2. The side surface 23a faces to one side in the direction Y, whereas the side surface 23b faces to the other side in the direction Y. The side surface 24 faces to the direction X. Unlike the chip resistor 101, the second electrode 2 of this embodiment does not have a curved surface 25. Thus, the side surface 24 is directly connected to the side surface 23a and the side surface 23b.

As shown in FIG. 34, the side surface 23a includes a linear trace formed surface 231a and a breakage trace formed surface 232a. The breakage trace formed surface 232a is connected to the linear trace formed surface 231a. Since the shapes of the linear trace formed surface 231a and the breakage trace formed surface 232a are the same as those of the linear trace formed surface 131 and the breakage trace formed surface 132 of the chip resistor 101, description of these is omitted.

In this embodiment, the linear trace formed surface 231a is closer to the front surface 21 than the breakage trace formed surface 232a is. In this embodiment, the width (dimension in the direction Z) of the linear trace formed surface 231a increases as proceeding further away from the resistor portion 3. The linear trace formed surface 231a is connected to the front surface 21. The breakage trace formed surface 232a is connected to the reverse surface 22.

As shown in FIG. 35, the side surface 23b includes a linear trace formed surface 231b and a breakage trace formed surface 232b. The breakage trace formed surface 232b is connected to the linear trace formed surface 231b. Since the shapes of the linear trace formed surface 231b and the breakage trace formed surface 232b are the same as those of the linear trace formed surface 131 and the breakage trace formed surface 132 of the chip resistor 101, description of these is omitted.

In this embodiment, the linear trace formed surface 231b is closer to the reverse surface 22 than the breakage trace formed surface 232b is. That is, the vertical positional relationship between the breakage trace formed surface and the linear trace formed surface in the side surface 23a is opposite from that in the side surface 23b. The linear trace formed surface 231b is connected to the reverse surface 22. The breakage trace formed surface 232b is connected to the front surface 21. In this embodiment, the width (dimension in the direction Z) of the linear trace formed surface 231b increases as proceeding further away from the resistor portion 3.

The side surface 24 may include the linear trace formed surface 241 and the breakage trace formed surface 242 similarly to the chip resistor 101 or may be a flat surface. The shape or structure of the side surface 24 is determined by how the conductive elongated boards 711 are made.

Except the points described above, the second electrode 2 has the same structure as that of the second electrode 2 of the chip resistor 101. Description of the same points is omitted.

As shown in FIGS. 32 and 33, the resistor portion 3 includes a resistor portion front surface 31, a resistor portion reverse surface 32, a resistor portion side surface 33a (first resistor portion side surface) and a resistor portion side surface 33b (second resistor portion side surface).

The resistor portion front surface 31 faces to the same direction as the front surface 11 or the front surface 21 (i.e., the direction Z1). The resistor portion reverse surface 32 faces to the opposite direction from the resistor portion front surface 31. The resistor portion reverse surface 32 faces to the same direction as the reverse surface 12 or the reverse surface 22 (i.e., the direction Z2). At least part of the reverse surface 12 and at least part of the reverse surface 22 are deviated from the resistor portion reverse surface 32 toward the side to which the resistor portion reverse surface 32 faces (i.e., the direction Z2).

The resistor portion side surface 33a shown in e.g. FIG. 32 faces to a first side in the direction Y. As shown in FIG.

34, the resistor portion side surface 33a includes a linear trace formed surface 331a (first resistor portion linear trace formed surface) and a breakage trace formed surface 332a (first resistor portion breakage trace formed surface). The breakage trace formed surface 332a is connected to the linear trace formed surface 331a. Since the shapes of the linear trace formed surface 331a and the breakage trace formed surface 332a are the same as those of the linear trace formed surface 131 and the breakage trace formed surface 132 of the chip resistor 101, description of these is omitted.

As shown in FIG. 34, in this embodiment again, the linear trace formed surface 331a is closer to the resistor portion front surface 31 than the breakage trace formed surface 332a is. The linear trace formed surface 331a is connected to the resistor portion front surface 31. The breakage trace formed surface 332a is connected to the resistor portion reverse surface 32. When the material forming the first electrode 1 or the second electrode 2 is harder than the material forming the resistor portion 3, the width of the breakage trace formed surface 332a may become larger than the width of the breakage trace formed surface 132a and the width of the breakage trace formed surface 232a, as shown in FIG. 34.

The resistor portion side surface 33b shown in e.g. FIG. 32 faces to a second side in the direction Y. The resistor portion side surface 33b is connected to the side surface 13b of the first electrode 1 and the side surface 23b of the second electrode 2. As shown in FIG. 35, the resistor portion side surface 33b includes a linear trace formed surface 331b (second resistor portion linear trace formed surface) and a breakage trace formed surface 332b (second resistor portion breakage trace formed surface). The breakage trace formed surface 332b is connected to the linear trace formed surface 331b. Since the shapes of the linear trace formed surface 331b and the breakage trace formed surface 332b are the same as those of the linear trace formed surface 131 and the breakage trace formed surface 132 of the chip resistor 101, description of these is omitted.

In this embodiment, the linear trace formed surface 331b is closer to the resistor portion reverse surface 32 than the breakage trace formed surface 332b is. That is, the vertical positional relationship of the breakage trace formed surface and the linear trace formed surface in the resistor portion side surface 33a is opposite from that in the resistor portion side surface 33b. The linear trace formed surface 331b is connected to the resistor portion reverse surface 32. The breakage trace formed surface 332b is connected to the resistor portion front surface 31.

Except the points described above, the resistor portion 3 has the same structure as that of the resistor portion 3 of the chip resistor 101. Description of the same points is omitted.

A method for manufacturing the chip resistor 201 is described below.

Figure 36:
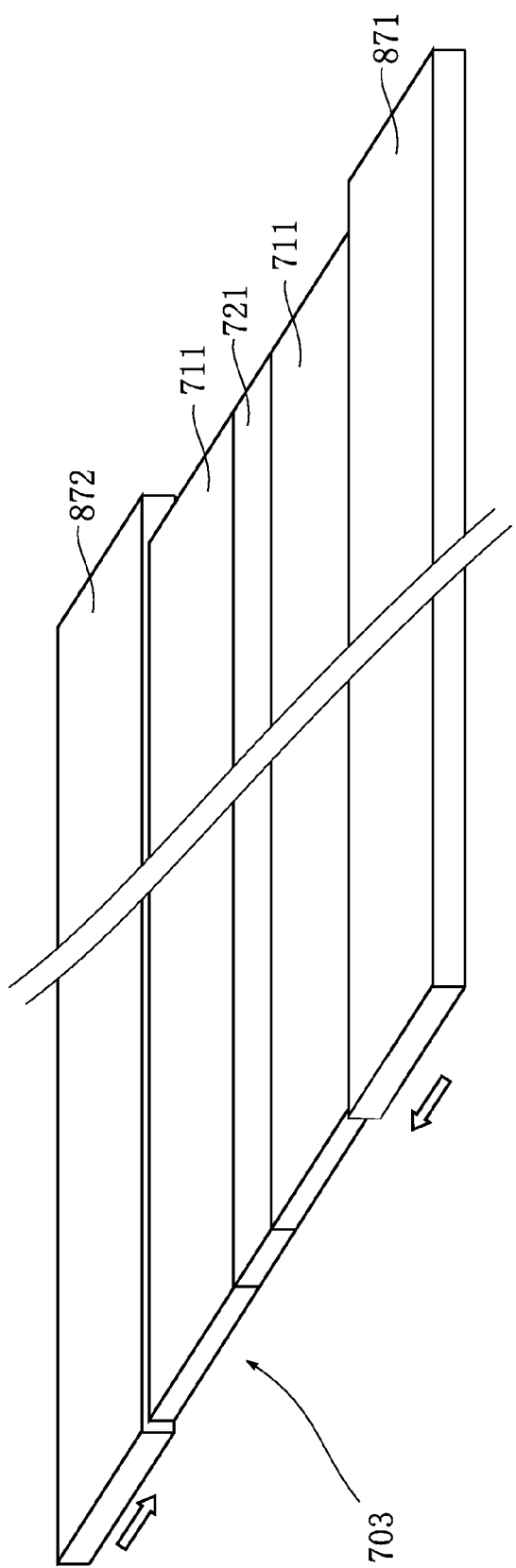
FIG. 36 is a perspective view showing a step of a method for manufacturing the chip resistor according to the fourth embodiment of the present invention.
Figure 37:
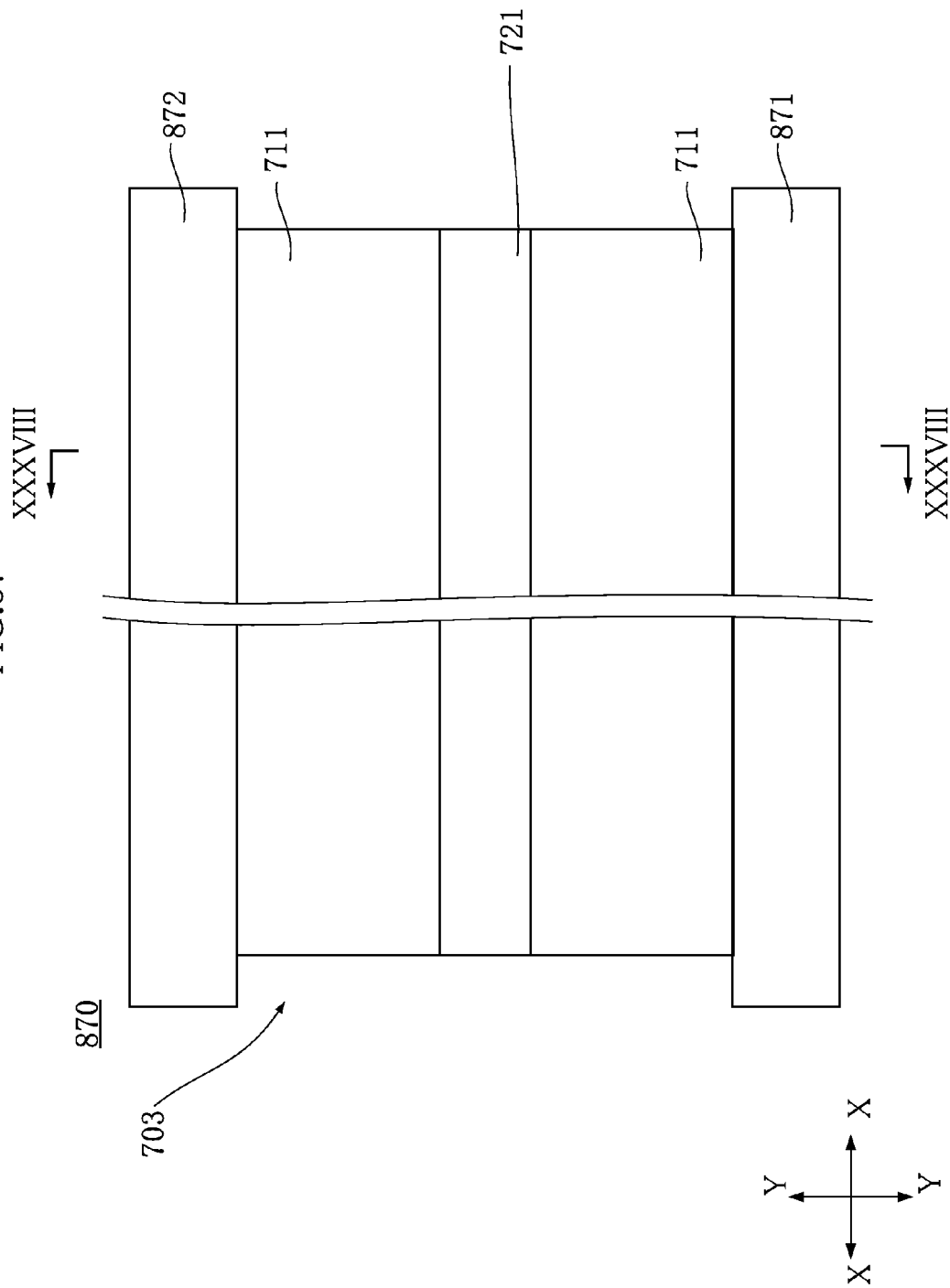
FIG. 37 is a plan view of FIG. 36.
Figure 38:
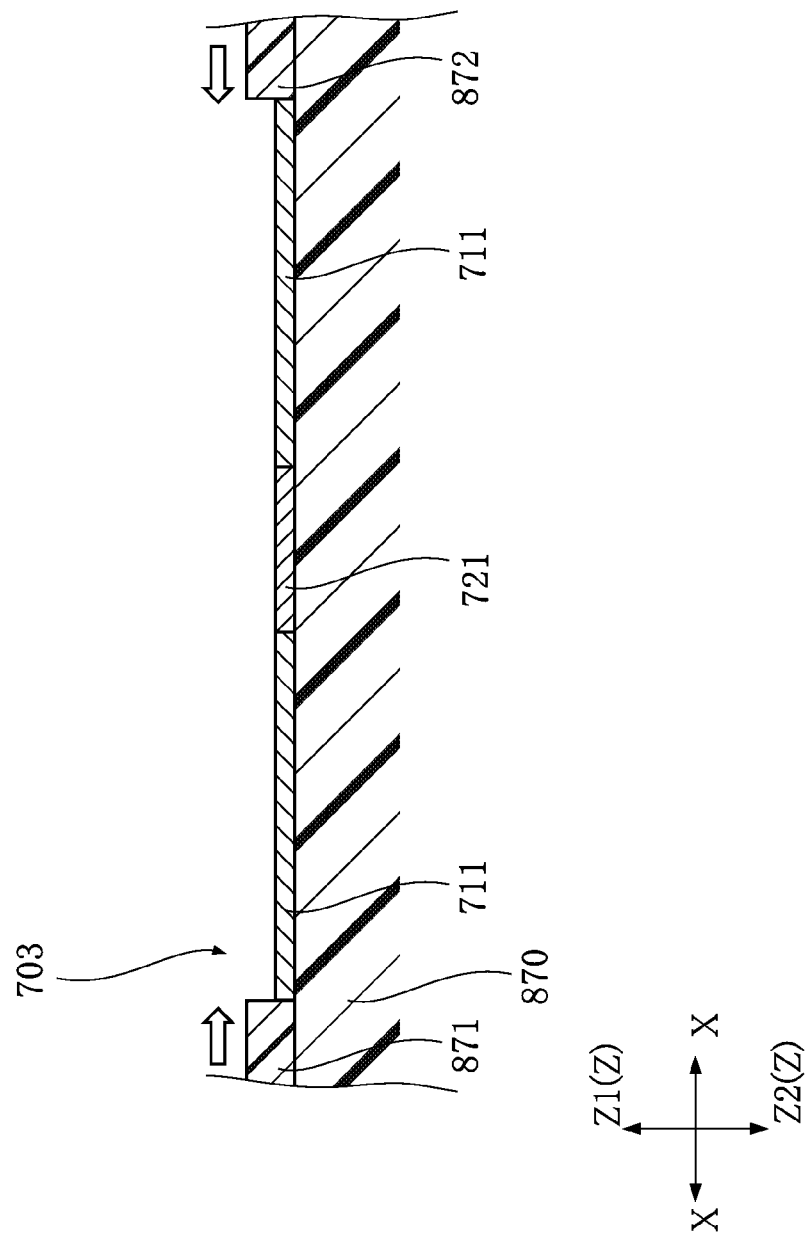
FIG. 38 is a sectional view taken along lines XXXVIII-XXXVIII in FIG. 37.

First, as shown in FIGS. 36 and 38, two conductive elongated boards 711 and a resistive elongated board 721 are prepared. The conductive elongated boards 711 are made of an electrically conductive material. The resistive elongated board 721 is made of a resistive material. In this embodiment, the two conductive elongated boards 711 have the same width (dimension in the width direction).

Then, the resistive elongated board 721 is to be placed between the two conductive elongated boards 711. In this embodiment, the resistive elongated board 721 is arranged between the two conductive elongated boards 711 as these boards are placed on a base 870 (see FIG. 38).

Then, the two conductive elongated boards 711 are fixed to the resistive elongated board 721. In this embodiment, a first clamping tool 871 and a second clamping tool 872 are used to fix the two conductive elongated boards 711 to the resistive elongated board 721. Specifically, the two conductive elongated boards 711 and the resistive elongated board 721 are sandwiched by the first clamping tool 871 and the second clamping tool 872. One of the two conductive elongated boards 711 is pressed against the resistive elongated board 721 by the first clamping tool 871, and the other one of the two conductive elongated boards 711 is pressed against the resistive elongated board 721 by the second clamping tool 872.

Figure 39:
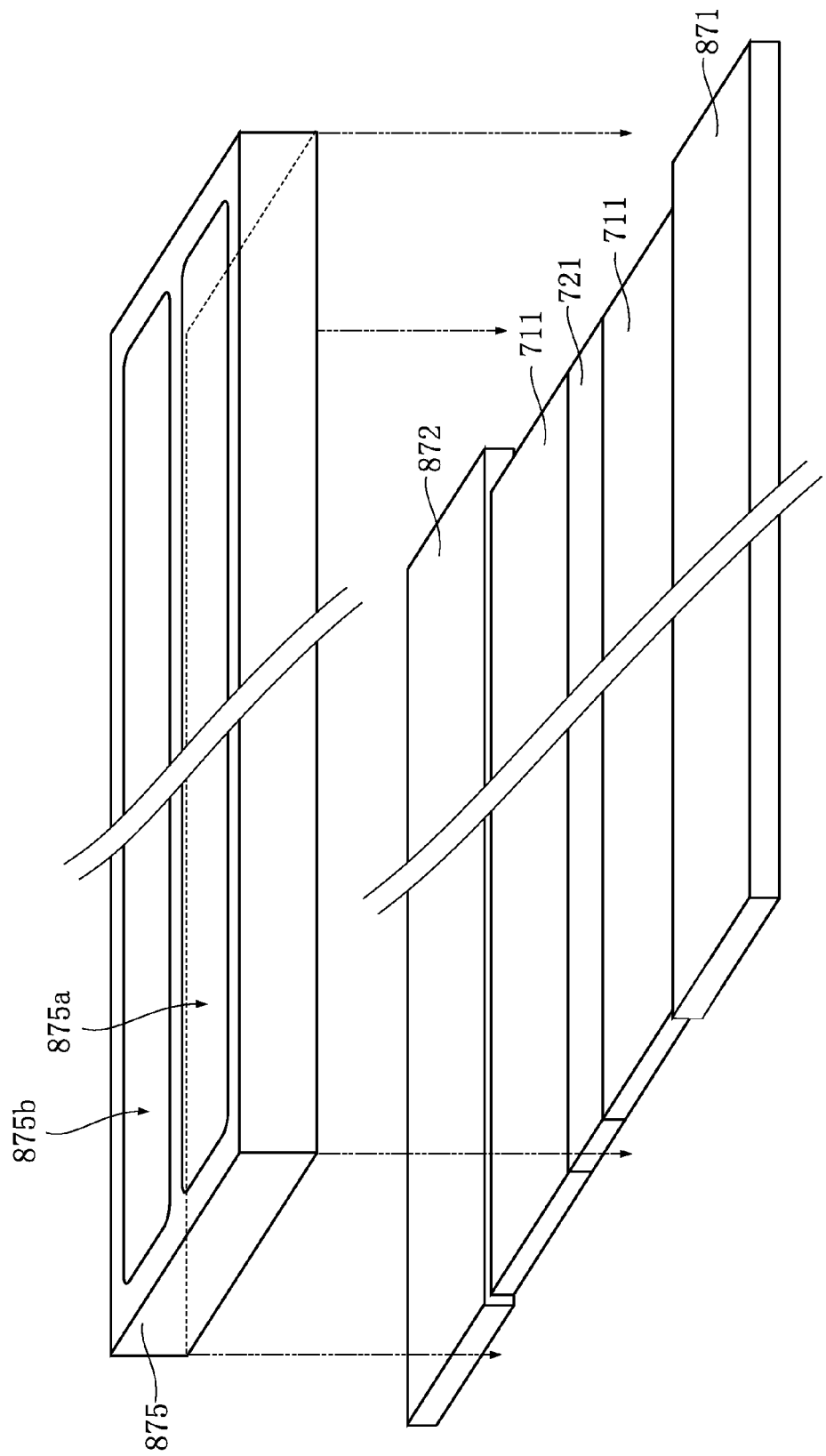
FIG. 39 is a perspective view showing the step subsequent to the step of FIG. 36.
Figure 40:
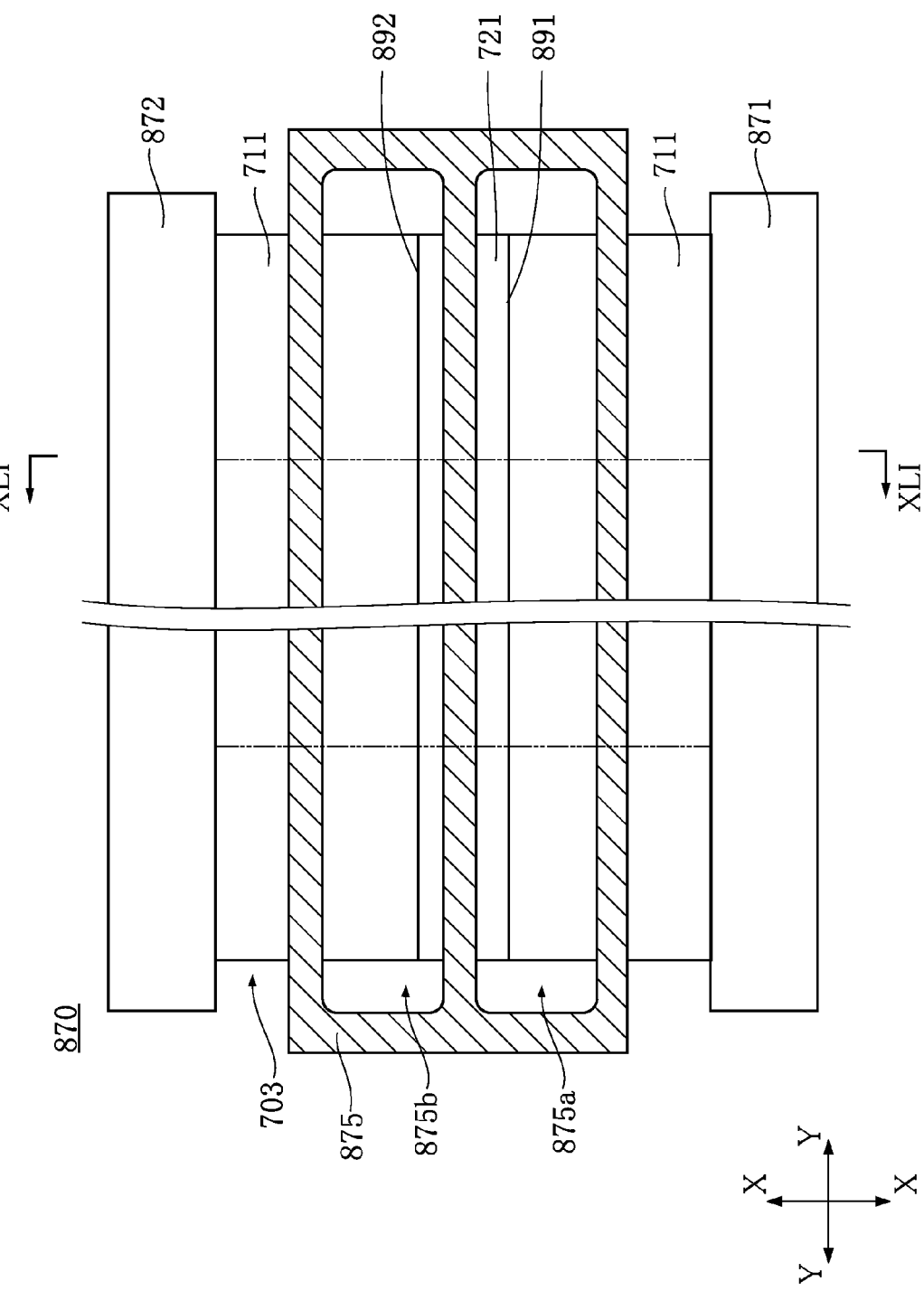
FIG. 40 is a plan view showing the step subsequent to the step of FIG. 39.
Figure 41:
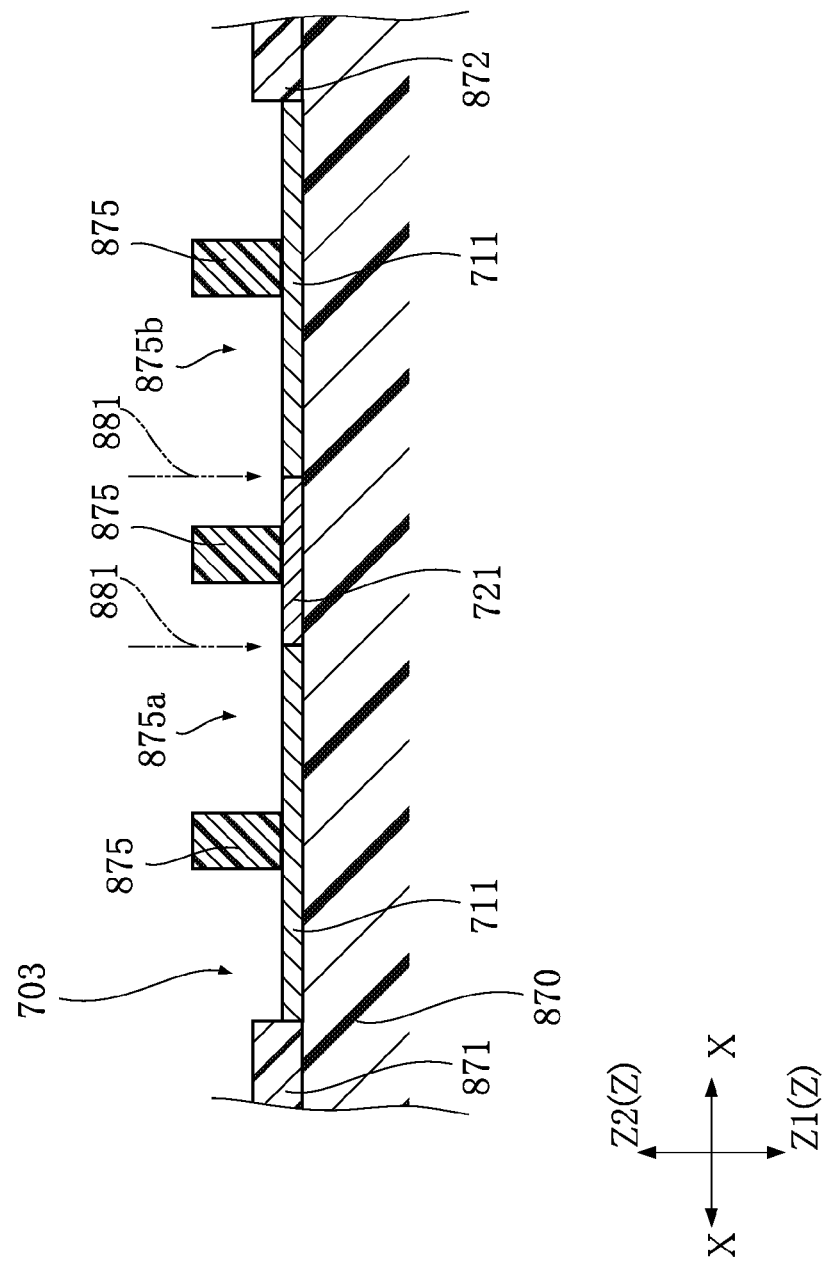
FIG. 41 is a sectional view taken along lines XLI-XLI in FIG. 40.

As shown in FIGS. 39-41, in this embodiment, the two conductive elongated boards 711 and the resistive elongated board 721 placed on the base 870 are pressed against the base 870 by a pressing tool 875. This prevents the two conductive elongated boards 711 and the resistive elongated board 721 from rising from the base 870. In FIG. 40, the pressing tool 875 is hatched for easier understanding. The pressing tool 875 has two elongated holes 875a and 875b. Each of the elongated holes 875a and 875b is elongated in one direction. In this embodiment, the elongated holes 875a and 875b are rectangular as viewed in plan. As shown in FIG. 40, in pressing the two conductive elongated boards 711 and the resistive elongated board 721 against the base 870 by the pressing tool 875, the elongated hole 875a is arranged to overlap the portion 891 where one of the two conductive elongated boards 711 and the resistive elongated board 721 are in contact with each other. Similarly, in pressing the two conductive elongated boards 711 and the resistive elongated board 721 against the base 870 by the pressing tool 875, the elongated hole 875b is arranged to overlap the portion 892 where the other one of the two conductive elongated boards 711 and the resistive elongated board 721 are in contact with each other.

Then, as shown in FIGS. 40 and 41, a resistor aggregate 703 is formed. To form the resistor aggregate 703, the two conductive elongated boards 711 are bonded to the resistive elongated board 721. As a technique for bonding the conductive elongated boards 711 to the resistive member 721, welding may be employed. Preferably, as the welding technique, high energy beam welding may be employed. Examples of the high energy beam welding include electron beam welding and laser beam welding. In the case where high energy beam welding is employed, as shown in FIG. 41, high energy beam 881 (electron beam or laser beam) is directed to the conductive elongated boards 711 or the resistive elongated boards 721 along the direction Z1, for example. In this embodiment, the high energy beam 881 is directed in such a manner as to pass through the elongated holes 875a, 875b. By receiving energy of the high energy beam 881, the conductive elongated boards 711 or the resistive elongated board 721 melt, whereby the conductive elongated boards 711 and the resistive elongated boards 721 are bonded together.

Unlike this embodiment, the conductive elongated boards 711 and the resistive members 721 may be bonded together by brazing or soldering using solder or silver paste. Alternatively, the conductive elongated boards 711 and the resistive member 721 may be bonded together by ultrasonic joining.

Figure 42:
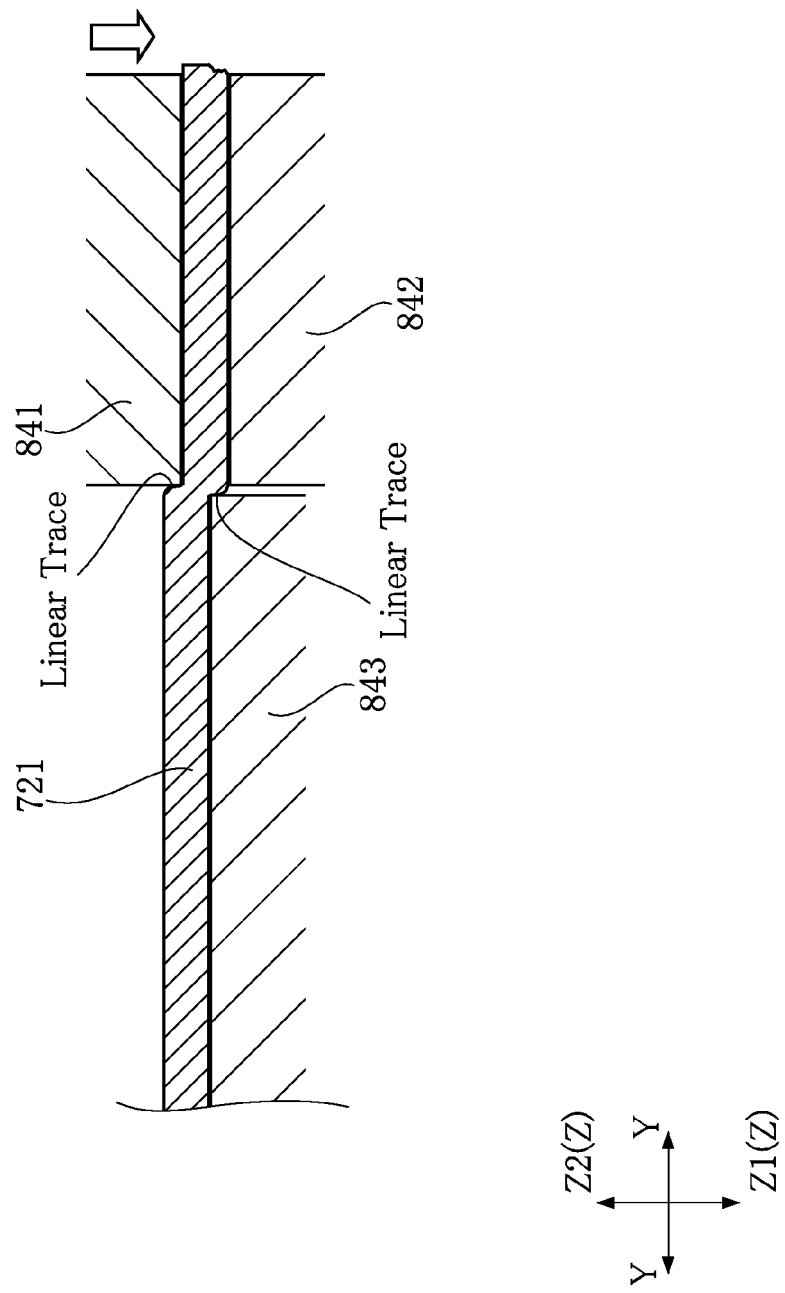
FIG. 42 is a sectional view showing the step subsequent to the step of FIGS. 40 and 41.
Figure 43:
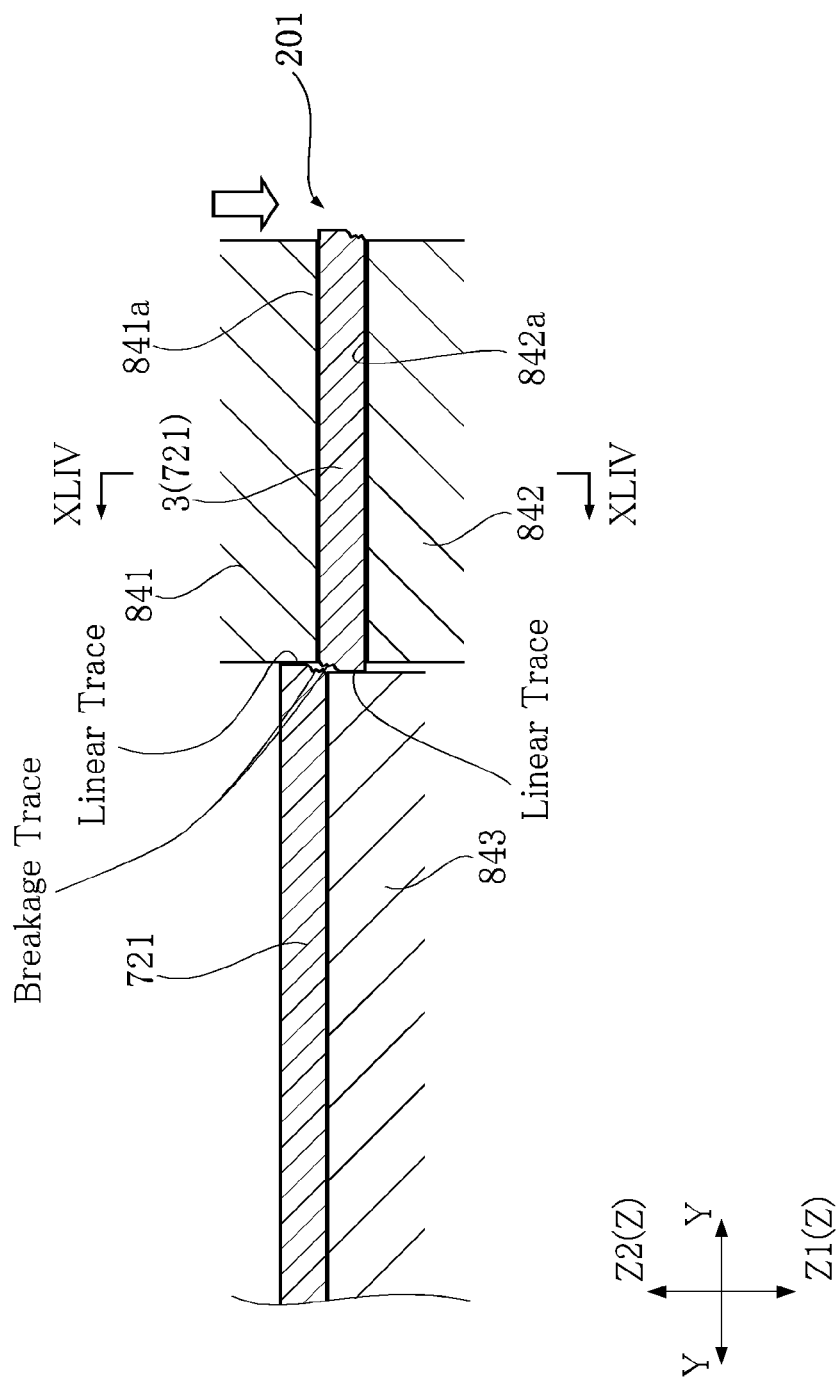
FIG. 43 is a sectional view showing the step subsequent to the step of FIG. 42.

Then, as shown in FIGS. 42 and 43, the resistor aggregate 703 is cut by shearing. The resistor aggregate 703 is cut along the double-dashed lines shown in FIG. 40. That is, the two conductive elongated boards 711 and the resistive elongated board 721 are cut by shearing along the width direction crossing the longitudinal direction of one of the two conductive elongated boards 711. In this embodiment, the resistor aggregate 703 is successively cut from an end.

To cut the resistor aggregate 703, a die member 841 and a die member 843 are used. As shown in FIG. 42, when the die member 841 is moved down, the die member 841 and the die member 843 cut into the conductive elongated boards 711 and the resistive elongated board 721. (Although only the resistive elongated board 721 is shown in FIG. 42, the same happens to the conductive elongated board 711 as well). In this process, the die member 841 and the die member 843 form linear traces in the conductive elongated boards 711 and the resistive elongated board 721. The formation of linear traces in the conductive elongated board 711 by the die member 843 provides the above-described linear trace formed surfaces 131a, 231a. The formation of linear traces in the resistive elongated board 721 by the die member 843 provides the above-described linear trace formed surface 331a. The formation of linear traces in the conductive elongated board 711 by the die member 841 provides the above-described linear trace formed surfaces 131b, 231b. The formation of linear traces in the resistive elongated board 721 by the die member 841 provides the above-described linear trace formed surface 331b.

When the die member 841 is further moved down as shown in FIG. 43, the shear load exerted on the conductive elongated board 711 and the resistive elongated board 721 increases. Thus, breakage occurs in the conductive elongated board 711 and the resistive elongated board 721, whereby the conductive elongated board 711 and the resistive elongated board 721 are cut off. In this process, breakage traces are formed in the conductive elongated board 711 and the resistive elongated board 721. The formation of breakage traces in the conductive elongated board 711 or the resistive elongated board 721 provides the above-described breakage trace formed surfaces.

Figure 44:
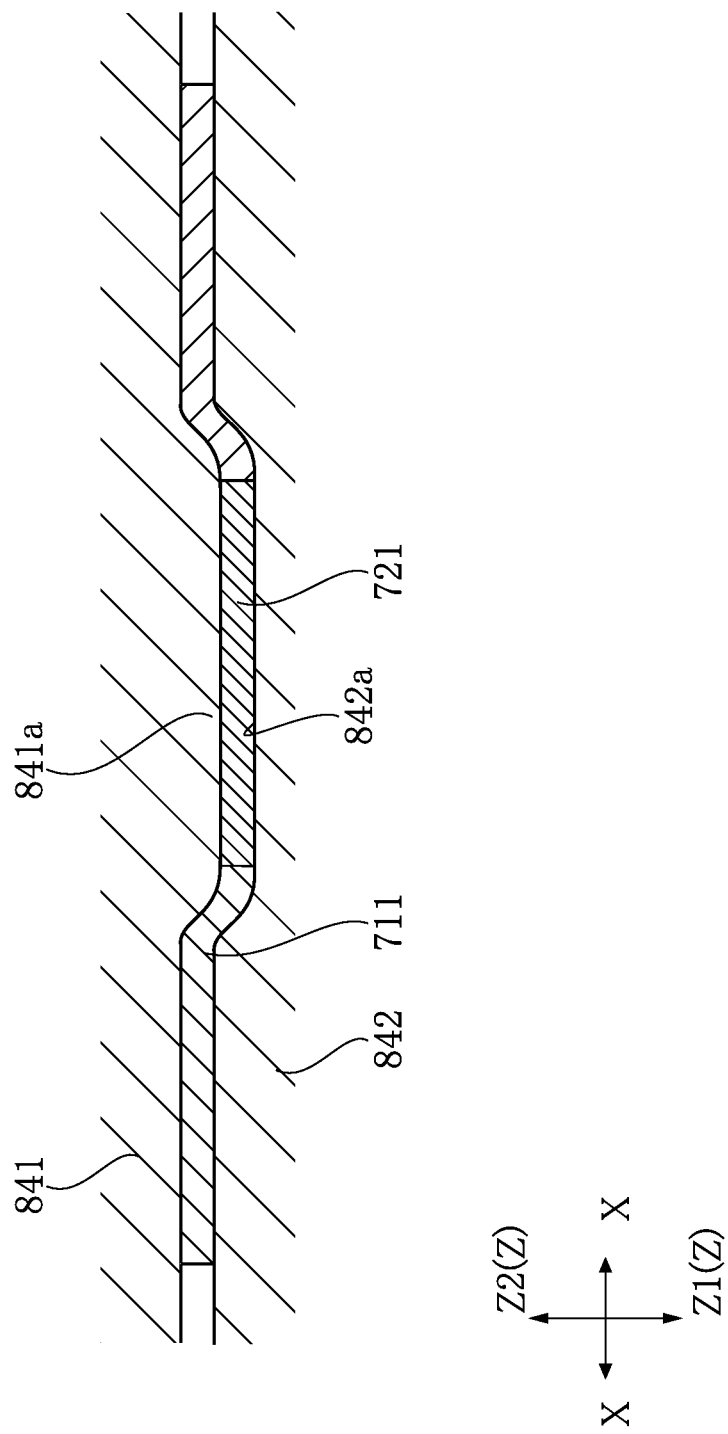
FIG. 44 is a sectional view taken along lines XLIV-XLIV in FIG. 43.
Figure 45:
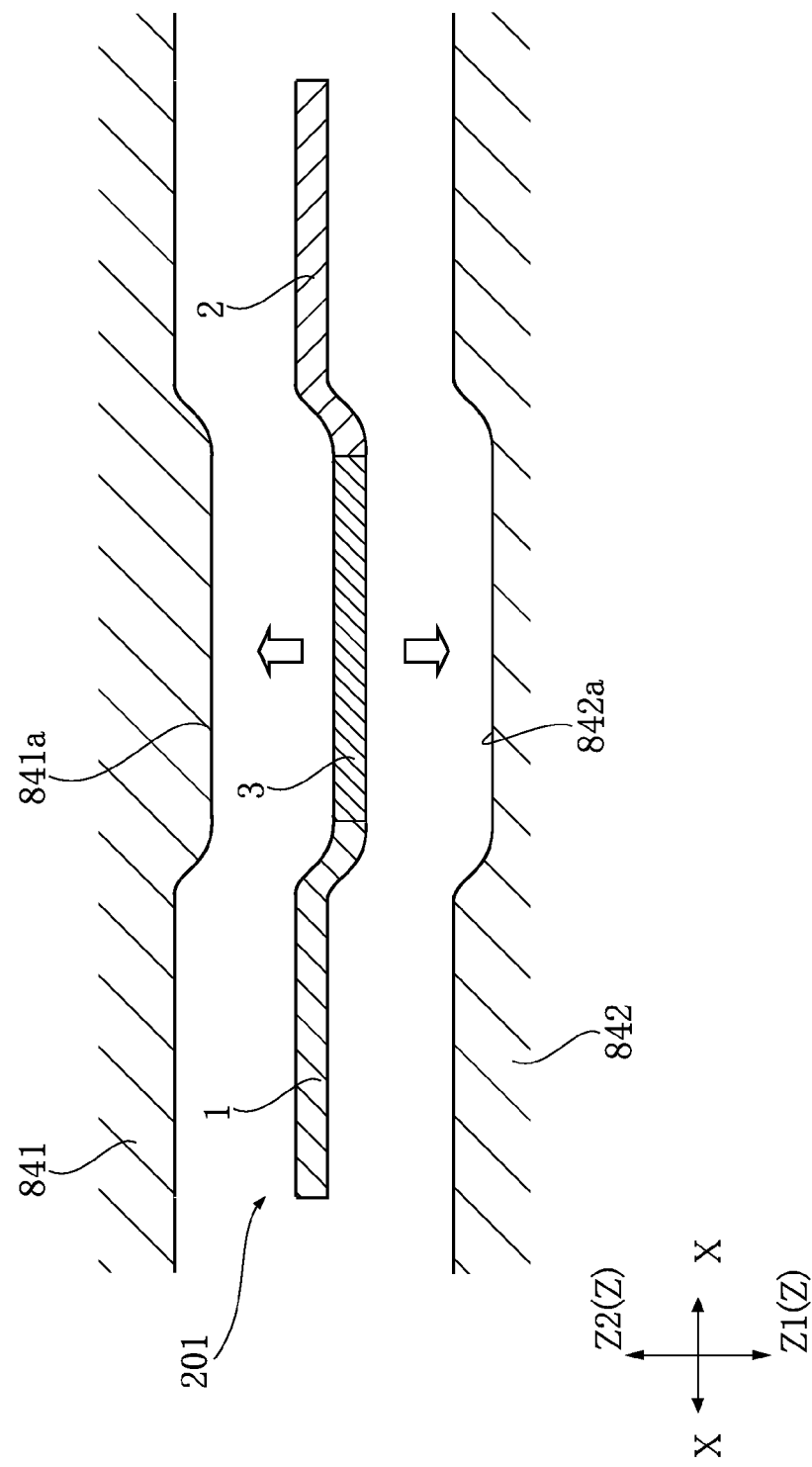
FIG. 45 is a sectional view showing the step subsequent to the step of FIG. 44.

In this embodiment, at the same time as the step of cutting the resistor aggregate 703 (the step of cutting the conductive elongated board 711 and the resistive elongated board 721 by shearing), the step of bending each conductive elongated board 711 is performed. That is, as shown in FIGS. 42-45, in performing shearing by the die member 841 and the die member 843, the conductive elongated board 711 and the resistive elongated board 721 are sandwiched by the die member 841 and the die member 842. As shown in FIG. 44, the die member 841 is formed with a projection 841a, whereas the die member 842 is formed with a recess 842a. Thus, when the conductive elongated boards 711 and the resistive elongated board 721 are sandwiched by the die member 841 and the die member 842, the conductive elongated boards 711 are bent so that a part of the chip resistor 201 projects downward in FIG. 44. Since the projection 841a is pressed against the resistive elongated board 721, the resistive elongated board 721 may be sheared prior to the conductive elongated boards 711. In this way, a single chip resistor 201 shown in FIG. 29 is obtained.

By repeating the process steps similar to those described with reference to FIGS. 42-45, a plurality of chip resistors 201 are obtained from the resistor aggregate 703.

Unlike this embodiment, the step of cutting the resistor aggregate 703 (the step of cutting the conductive elongated boards 711 and the resistive elongated board 721 by shearing) and the step of bending the conductive elongated boards 711 may not be performed at the same time. For instance, the conductive elongated boards 711 may be bent before the step of cutting the resistor aggregate 703 (the step of cutting the conductive elongated boards 711 and the resistive elongated board 721 by shearing).

The advantages of this embodiment are described below.

In this embodiment, two conductive elongated boards 711 and the resistive elongated board 721 are cut by shearing. Unlike the case where the conductive elongated board 711 and the resistive elongated board 721 are cut by dicing, the method of this embodiment does not leave shavings. Thus, relatively large portions of the conductive elongated board 711 and resistive elongated board 721 are used for the chip resistor 201. In other words, the portions of the conductive elongated board 711 and resistive elongated board 721 which are wasted, i.e., not used for the chip resistor 201, are reduced. The conductive elongated board 711 and the resistive elongated board 721 are efficiently used for making chip resistors 201.

In this embodiment, the step of bending the conductive elongated boards 711 is performed at the same time as the step of cutting the conductive elongated boards 711 and the resistive elongated board 721. This shortens the time required for manufacturing the chip resistor 201.

In this embodiment, the two conductive elongated boards 711 are fixed to the resistive elongated board 721 before the two conductive elongated boards 711 and the resistive elongated board 721 are bonded to each other. In the step of bonding the two conductive elongated boards 711 and the resistive elongated board 721, welding is performed, with the conductive elongated boards 711 fixed to the resistive elongated board 721. With this arrangement, in bonding the conductive elongated boards 711 and the resistive elongated board 721, the conductive elongated boards 711 and the resistive elongated board 721 are prevented from moving. Thus, the conductive elongated boards 711 and the resistive elongated board 721 are reliably bonded to each other.

According to this embodiment, the elongated hole 875a is arranged to overlap the portion 891 where one of the two conductive elongated boards 711 and the resistive elongated board 721 are in contact with each other, and the elongated hole 875b is arranged to overlap the portion 892 where the other one of the two conductive elongated boards 711 and the resistive elongated board 721 are in contact with each other. The high energy beam 881 is directed so as to pass through the elongated holes 875a and 875b. With this arrangement, the high energy beam 881 is reliably directed to the portion 891 and the portion 892, with the conductive elongated boards 711 and the resistive elongated board 721 prevented from rising from the base 870. Thus, the high energy beam 881 is reliably directed to desired portions.

A fifth embodiment of the present invention is described below.

Figure 46:
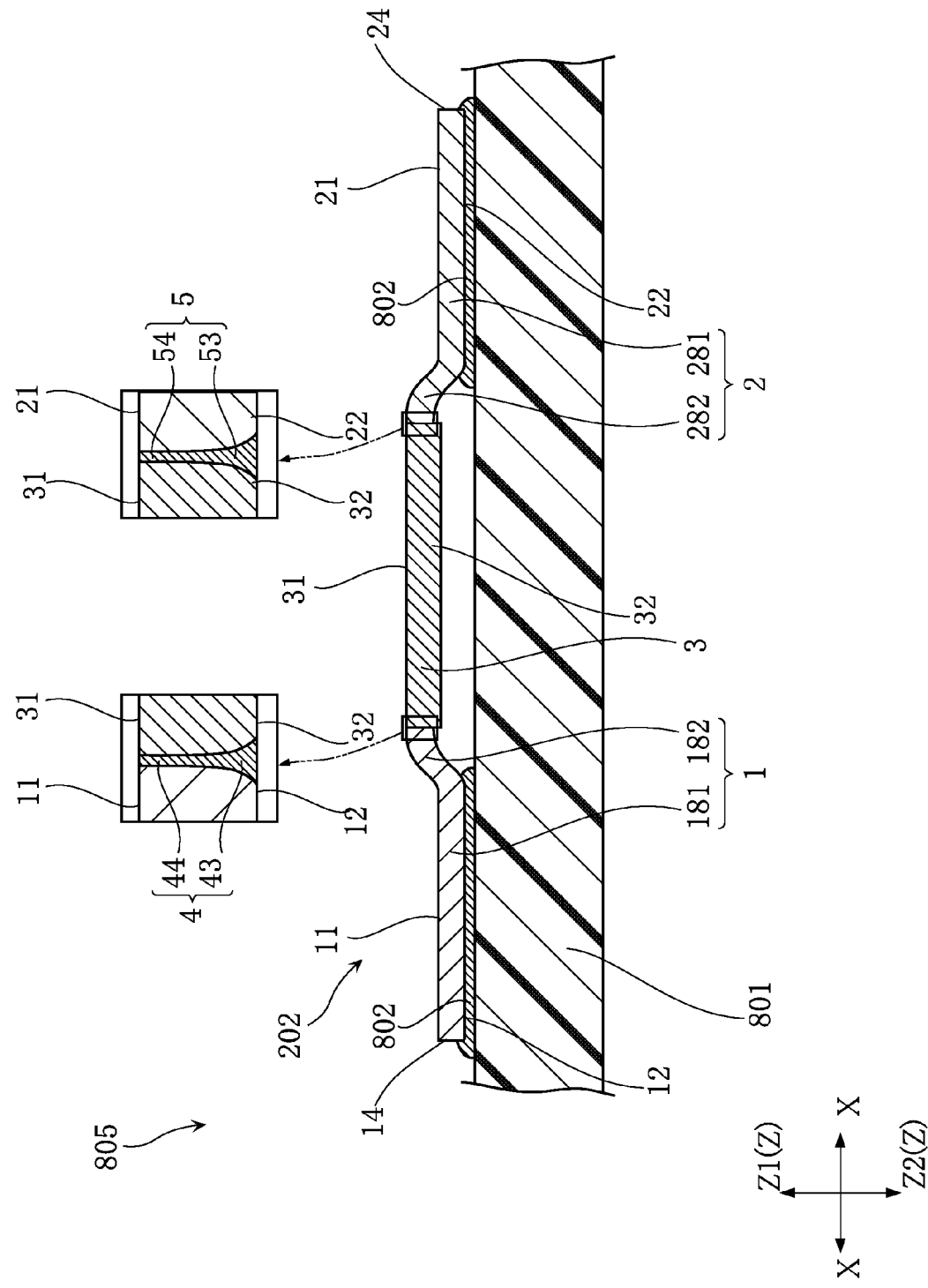
FIG. 46 is a sectional view of a mount structure of a chip resistor according to a fifth embodiment of the present invention.

FIG. 46 a sectional view of a mount structure of a chip resistor according to the fifth embodiment of the present invention.

The chip resistor 202 shown in this figure differs from the chip resistor 201 in that the thickness of the resistor portion 3 is different from the thickness of the first electrode 1 or the second electrode 2. In this embodiment, the thickness of the resistor portion 3 is larger than that of the first electrode 1 or the second electrode 2. The thickness of the resistor portion 3 may be smaller than that of the first electrode 1 or the second electrode 2.

To manufacture the chip resistor 202, a pressing tool having a structure different from that of the pressing tool 875 is used to press the two conductive elongated boards 711 and the resistive elongated board 721 against the base 870. Except this point, the chip resistor 202 is manufactured in the same way as the chip resistor 201. However, the thickness of the resistive elongated board 721 is larger than that of the conductive elongated boards 711.

Figure 47:
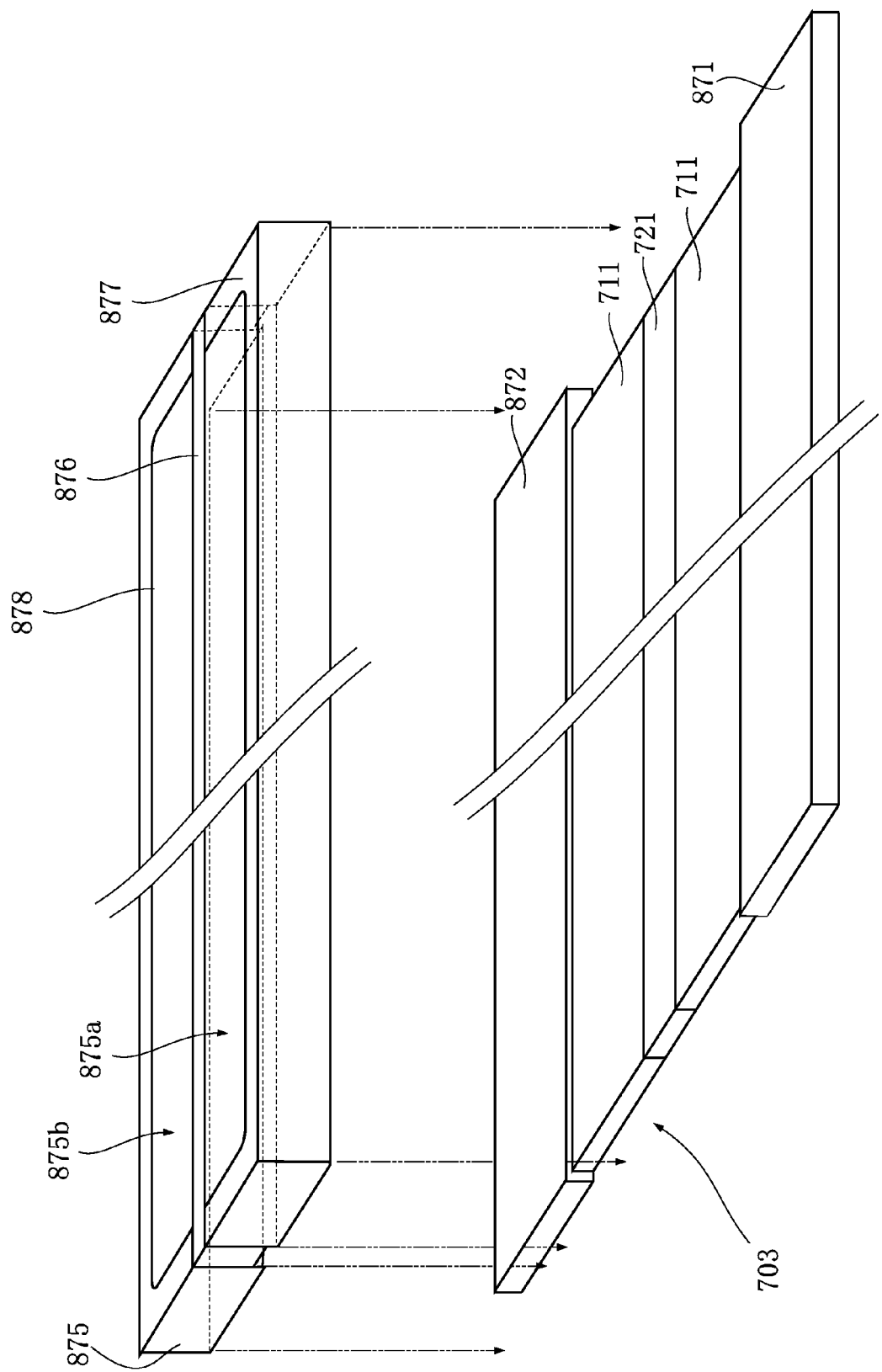
FIG. 47 is a perspective view showing a step of a method for manufacturing the chip resistor according to the fifth embodiment of the present invention.
Figure 48:
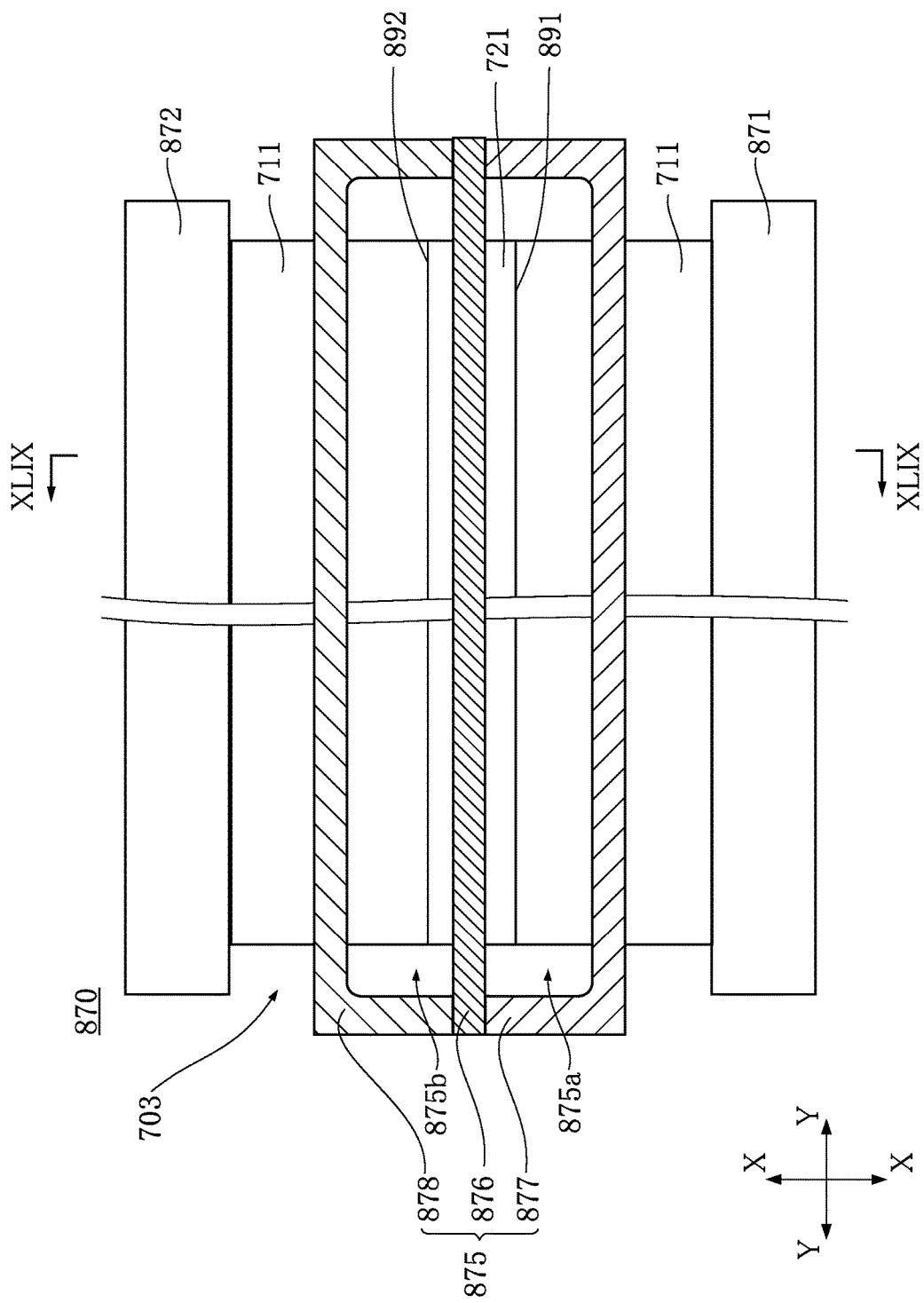
FIG. 48 is a plan view showing the step subsequent to the step of FIG. 47.
Figure 49:
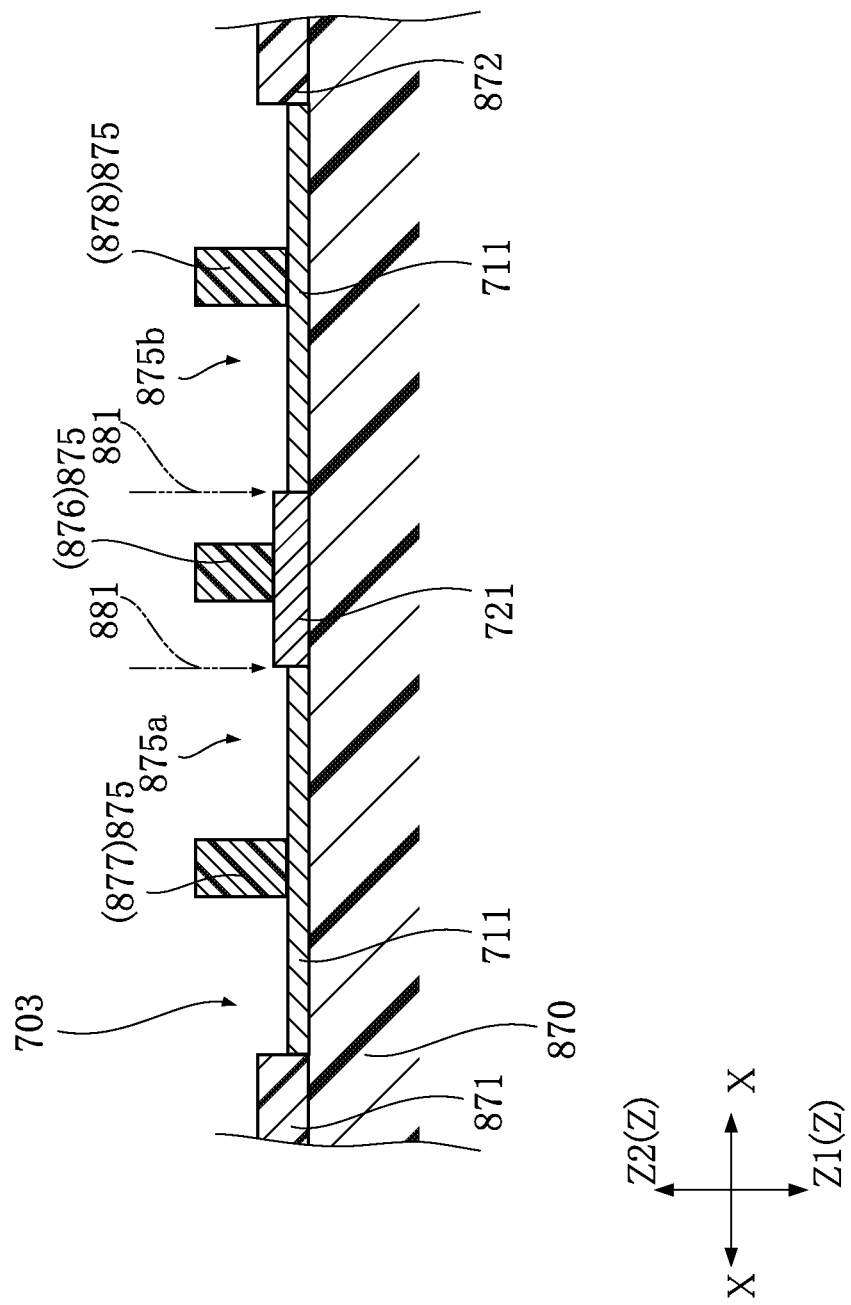
FIG. 49 is a sectional view taken along lines XLIX-XLIX in FIG. 48.

As shown in FIGS. 47-49, the pressing tool 875 includes a resistor pressing member 876 and conductor pressing members 877 and 878. In FIG. 48, the pressing tool 875 is hatched for easier understanding. The resistor pressing member 876 and the conductor pressing members 877 and 878 are separately prepared. The resistor pressing member 876 presses the resistive elongated board 721 against the base 870. The conductor pressing member 877 presses one of the two conductive elongated boards 711 against the base 870. The conductor pressing member 878 presses the other one of the two conductive elongated boards 711 against the base 870. In this embodiment, an elongated hole 875a is defined between the conductor pressing member 877 and the resistor pressing member 876, and an elongated hole 875b is defined between the conductor pressing member 878 and the resistor pressing member 876. In this embodiment again, high energy beam 881 is directed to pass through the elongated holes 875a and 875b.

By using the resistor pressing member 876 and the conductor pressing members 877, 878 which are separately prepared, both of the resistive elongated board 721 and the two conductive elongated boards 711 are reliably pressed against the base 870 by the resistor pressing member 876 and the conductor pressing members 877, 878 even when the resistive elongated board 721 and the conductive elongated boards 711 have different thicknesses. Thus, high energy beam 881 is directed to the portion 891 and the portion 892, with the conductive elongated boards 711 and the resistive elongated board 721 prevented from rising from the base 870. This assures that high energy beam 881 is directed to desired portions.

According to this embodiment, the same advantages as those of the fourth embodiment are obtained.

The present invention is not limited to the foregoing embodiments. The specific structure of each part of the present invention may be varied in design in many ways.

The invention claimed is:

1. A chip resistor comprising:
a first electrode;
a second electrode spaced apart from the first electrode in a first direction; and
a resistor portion bonded to the first electrode and the second electrode;
wherein the first electrode includes a front surface and a reverse surface which face away from each other,
the resistor portion extends along a plane spreading in the first direction and a second direction crossing the first direction,
the first electrode includes a first electrode side surface facing to a first side in the second direction and a second electrode side surface facing to a second side in the second direction,
the first electrode side surface includes a first electrode linear trace formed surface formed with a linear trace, and a first electrode breakage trace formed surface connected to the first electrode linear trace formed surface and formed with a breakage trace, and
the first electrode linear trace formed surface is closer to the front surface than the first electrode breakage trace formed surface is.

2. The chip resistor according to claim 1, wherein the second electrode side surface includes a second electrode linear trace formed surface formed with a linear trace, and a second electrode breakage trace formed surface connected to the second electrode linear trace formed surface and formed with a breakage trace, and
the second electrode linear trace formed surface is closer to the reverse surface than the second electrode breakage trace formed surface is.

3. The chip resistor according to claim 2, wherein the resistor portion includes a resistor portion front surface and a resistor portion reverse surface which face away from each other, a first resistor portion side surface facing to a first side in the second direction, and a second resistor portion side surface facing to a second side in the second direction,
the resistor portion front surface faces to a same direction as the front surface,
the first resistor portion side surface includes a first resistor portion linear trace formed surface formed with a linear trace and a first resistor portion breakage trace formed surface connected to the first resistor portion linear trace formed surface and formed with a breakage trace, and
the first resistor portion linear trace formed surface is closer to the resistor portion front surface than the first resistor portion breakage trace formed surface is.

4. The chip resistor according to claim 3, wherein the second resistor portion side surface includes a second resistor portion linear trace formed surface formed with a linear trace, and a second resistor portion breakage trace formed surface connected to the second resistor portion linear trace formed surface and formed with a breakage trace, and
the second resistor portion linear trace formed surface is closer to the resistor portion reverse surface than the second resistor portion breakage trace formed surface is.

5. The chip resistor according to claim 3, wherein the first resistor portion breakage trace formed surface has a width larger than a width of the first electrode breakage trace formed surface.

6. The chip resistor according to claim 1, wherein the first electrode linear trace formed surface has a width that increases as proceeding further away from the resistor portion.

7. The chip resistor according to claim 1, further comprising a first intermediate layer connected to the first electrode and the resistor portion, and a second intermediate layer connected to the second electrode and the resistor portion,
wherein the first intermediate layer and the second intermediate layer are made of a same material.

8. The chip resistor according to claim 7, wherein the resistor portion is sandwiched between the first electrode and the second electrode.

9. The chip resistor according to claim 8, wherein the first intermediate layer includes a wide portion and a narrow portion, and
the wide portion is exposed to a third direction crossing both of the first direction and the second direction, a dimension of the narrow portion in the first direction being smaller than a dimension of the wide portion in the first direction.

10. The chip resistor according to claim 1, wherein the first electrode includes a plate-like portion extending along the first direction and the second direction and an inclined portion inclined with respect to the plate-like portion and closer to the resistor portion than the plate-like portion is.

11. A chip resistor mount structure comprising:
at least one of (a) a chip resistor; comprising:
a first electrode;
a second electrode spaced apart from the first electrode in a first direction; and a resistor portion bonded to the first electrode and the second electrode, wherein the resistor portion extends along a plane spreading in the first direction and a second direction crossing the first direction, and the first electrode includes a first side surface facing in the first direction, a second side surface facing in the second direction, and a curved surface connected to both the first side surface and the second side surface, and (b) a chip resistor as set forth in claim 1;

a mount board; and a solder layer between the mount board and the chip resistor.

12. A chip resistor comprising:

a first electrode that includes a first surface, a second surface, a third surface and a fourth surface, wherein the second surface faces oppositely to the first surface, each of the third surface and the fourth surface is connected to the first surface and the second surface, and the third surface and the fourth surface face oppositely to each other in a first direction;

a second electrode spaced apart from the first electrode in a second direction crossing the first direction; and a resistor portion bonded to the first electrode and the second electrode, wherein the third surface of the first electrode includes a first part formed with linear traces and a second part formed with breakage traces.

13. The chip resistor according to claim 12, wherein the resistor portion comprises a first surface and a second surface that face oppositely to each other, and the first surface of the resistor portion includes a first part formed with linear traces and a second part formed with breakage traces.

14. The chip resistor according to claim 13, wherein the second part of the resistor portion is greater in size measured in a third direction that crosses the first direction and the second direction than the second part of the first electrode.

15. The chip resistor according to claim 12, wherein the first part of the first electrode has a width measured in a third direction crossing the first direction and the second direction, and the width becomes greater with increasing distance from the resistor portion.

16. The chip resistor according to claim 12, further comprising: a first intermediate layer connected to the first electrode and the resistor portion; and a second intermediate layer connected to the second electrode and the resistor portion, wherein the first intermediate layer and the second intermediate layer are made of a same material.

17. The chip resistor according to claim 16, wherein the resistor portion is sandwiched between the first electrode and the second electrode.

18. The chip resistor according to claim 17, wherein the first intermediate layer includes a wide portion and a narrow portion, the wide portion is exposed to a third direction crossing the first direction and the second direction, and the narrow portion is smaller in size measured in the second direction than the wide portion.

19. The chip resistor according to claim 12, wherein the first electrode includes a plate-like portion and an inclined portion, the plate-like portion extending along the first direction and the second direction, the inclined portion being inclined with respect to the plate-like portion and disposed closer to the resistor portion than is the plate-like portion.

20. A chip resistor mount structure comprising:

a chip resistor according to claim 12;

a mount board; and a solder layer disposed between the mount board and the chip resistor.

\* \* \* \* \*